US012690324B2

(12) United States Patent
Ohsawa et al.

(10) Patent No.: US 12,690,324 B2
(45) Date of Patent: Jul. 21, 2026

(54) LIGHT-EMITTING DEVICE, LIGHT-EMITTING APPARATUS, ELECTRONIC APPLIANCE, AND LIGHTING DEVICE

(71) Applicant: Semiconductor Energy Laboratory Co., Ltd., Kanagawa-ken (JP)

(72) Inventors: Nobuharu Ohsawa, Zama (JP); Toshiki Sasaki, Isehara (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 781 days.

(21) Appl. No.: 17/722,604

(22) Filed: Apr. 18, 2022

(65) Prior Publication Data

US 2022/0367831 A1 Nov. 17, 2022

(30) Foreign Application Priority Data

Apr. 23, 2021 (JP) ................................ 2021-073232

(51) Int. Cl.
*H10K 50/16* (2023.01)
*H10K 50/17* (2023.01)

(52) U.S. Cl.
CPC ........... *H10K 50/16* (2023.02); *H10K 50/171* (2023.02)

(58) Field of Classification Search
None
See application file for complete search history.

(56) References Cited

U.S. PATENT DOCUMENTS

| | | | |
|---|---|---|---|
| 5,953,985 | A | 9/1999 | Kobayashi |
| 6,120,338 | A | 9/2000 | Hirano et al. |
| 8,358,057 | B2 | 1/2013 | Oota |
| 8,604,501 | B2 | 12/2013 | Yun et al. |
| 8,877,532 | B2 | 11/2014 | Hiroki et al. |

(Continued)

FOREIGN PATENT DOCUMENTS

| | | | |
|---|---|---|---|
| CN | 106505084 | A | 3/2017 |
| CN | 110707241 | A | 1/2020 |

(Continued)

OTHER PUBLICATIONS

Ahn, H. et al., "Highly Efficient Electron Injection Layer of LiF/Yb Bilayer for Top-emitting Organic Light Emitting Diodes," SID Digest '12: SID International Symposium Digest of Technical Papers, Jun. 5, 2012, vol. 43, No. 1, pp. 1481-1483.

(Continued)

*Primary Examiner* — Xiaoming Liu
(74) *Attorney, Agent, or Firm* — Husch Blackwell LLP

(57) ABSTRACT

A novel light-emitting device with high emission efficiency is provided. The light-emitting device includes a first electrode, a second electrode, an EL layer, and an insulating layer. The EL layer is positioned between the first electrode and the second electrode. The EL layer includes at least a light-emitting layer, an electron-transport layer, and an electron-injection layer. The electron-transport layer is positioned over the light-emitting layer. The insulating layer is in contact with an end portion of the light-emitting layer and an end portion of the electron-transport layer. The electron-injection layer is positioned over the electron-transport layer. The electron-injection layer includes an alkali metal compound and a reducing agent.

22 Claims, 26 Drawing Sheets

(56) References Cited

U.S. PATENT DOCUMENTS

| | | | | |
|---|---|---|---|---|
| 9,768,384 | B2 | 9/2017 | Kwon | |
| 10,050,199 | B2 | 8/2018 | Kwon | |
| 10,468,598 | B2 | 11/2019 | Kwon | |
| 10,483,479 | B2 | 11/2019 | Tanaka | |
| 10,862,034 | B2 | 12/2020 | Kwon | |
| 11,094,886 | B2 | 8/2021 | Tasaki et al. | |
| 11,227,998 | B2 | 1/2022 | Kwon | |
| 11,552,259 | B1 | 1/2023 | Tasaki et al. | |
| 11,678,550 | B2 | 6/2023 | Kato | |
| 11,839,148 | B2 | 12/2023 | Tasaki et al. | |
| 12,096,671 | B2 | 9/2024 | Kato | |
| 12,528,984 | B2 | 1/2026 | Tasaki et al. | |
| 12,581,849 | B2 | 3/2026 | Tasaki et al. | |
| 12,615,961 | B2 | 4/2026 | Tasaki et al. | |
| 2002/0072139 | A1 | 6/2002 | Kashiwabara | |
| 2008/0238297 | A1 | 10/2008 | Oota | |
| 2011/0148290 | A1 | 6/2011 | Oota | |
| 2012/0252149 | A1 | 10/2012 | Hiroki et al. | |
| 2012/0256204 | A1 | 10/2012 | Yoshizumi et al. | |
| 2012/0273804 | A1 | 11/2012 | Hatano | |
| 2012/0276484 | A1 | 11/2012 | Izumi et al. | |
| 2013/0049024 | A1* | 2/2013 | Choi | H10K 50/171 257/E51.018 |
| 2013/0084531 | A1 | 4/2013 | Hamaguchi et al. | |
| 2013/0084664 | A1 | 4/2013 | Yoshitoku et al. | |
| 2013/0084666 | A1 | 4/2013 | Oshige | |
| 2013/0248867 | A1* | 9/2013 | Kim | H10K 59/122 438/34 |
| 2013/0280839 | A1 | 10/2013 | Sonoda et al. | |
| 2013/0295705 | A1 | 11/2013 | Sonoda et al. | |
| 2014/0004640 | A1 | 1/2014 | Hamaguchi et al. | |
| 2014/0004642 | A1 | 1/2014 | Otsuka et al. | |
| 2014/0183461 | A1* | 7/2014 | Kim | H10K 59/35 438/47 |
| 2015/0060826 | A1 | 3/2015 | Matsumoto et al. | |
| 2015/0069360 | A1 | 3/2015 | Sato | |
| 2015/0076476 | A1 | 3/2015 | Odaka et al. | |
| 2015/0171327 | A1* | 6/2015 | Matsushima | H10K 71/00 438/35 |
| 2015/0236266 | A1* | 8/2015 | Kho | H10K 85/6572 257/40 |
| 2016/0172595 | A1 | 6/2016 | Malinowski et al. | |
| 2016/0315133 | A1 | 10/2016 | Sato | |
| 2017/0069695 | A1 | 3/2017 | Choung et al. | |
| 2017/0141167 | A1 | 5/2017 | Naganuma | |
| 2017/0256754 | A1 | 9/2017 | Defranco et al. | |
| 2018/0190908 | A1 | 7/2018 | Ke et al. | |
| 2019/0165304 | A1* | 5/2019 | Kim | H10K 50/828 |
| 2019/0206973 | A1* | 7/2019 | Kim | H10K 59/121 |
| 2019/0347994 | A1* | 11/2019 | Lin | G09G 3/32 |
| 2020/0052236 | A1 | 2/2020 | Tanaka | |
| 2020/0203662 | A1 | 6/2020 | Mollard et al. | |
| 2021/0265432 | A1 | 8/2021 | Kato | |
| 2022/0085317 | A1 | 3/2022 | Pang et al. | |
| 2022/0348523 | A1 | 11/2022 | Nishimura et al. | |
| 2022/0348534 | A1 | 11/2022 | Kubota et al. | |
| 2022/0356133 | A1 | 11/2022 | Nishimura et al. | |
| 2022/0371974 | A1 | 11/2022 | Nishimura et al. | |
| 2022/0380278 | A1 | 12/2022 | Tasaki et al. | |
| 2022/0393113 | A1 | 12/2022 | Tasaki et al. | |
| 2023/0088213 | A1 | 3/2023 | Tasaki et al. | |
| 2023/0089512 | A1 | 3/2023 | Nishimura et al. | |
| 2023/0345816 | A1 | 10/2023 | Nakano et al. | |
| 2023/0389392 | A1* | 11/2023 | Zhang | H10K 59/771 |
| 2024/0023436 | A1 | 1/2024 | Tasaki et al. | |
| 2024/0155871 | A1 | 5/2024 | Yanagisawa et al. | |
| 2025/0008802 | A1 | 1/2025 | Kato | |

FOREIGN PATENT DOCUMENTS

| | | | |
|---|---|---|---|
| CN | 112314056 | A | 2/2021 |
| CN | 114375509 | A | 4/2022 |
| JP | 2000-036385 | A | 2/2000 |
| JP | 2003-059663 | A | 2/2003 |
| JP | 2008-098106 | A | 4/2008 |
| JP | 2008-147072 | A | 6/2008 |
| JP | 2008-251270 | A | 10/2008 |
| JP | 2009-272108 | A | 11/2009 |
| JP | 2012-160473 | A | 8/2012 |
| JP | 2012-216493 | A | 11/2012 |
| JP | 2012-216501 | A | 11/2012 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-197494 | A | 11/2016 |
| JP | 2019-179696 | A | 10/2019 |
| JP | 2020-160305 | A | 10/2020 |
| KR | 2017-0028497 | A | 3/2017 |
| KR | 2022-0066099 | A | 5/2022 |
| TW | 201240078 | | 10/2012 |
| TW | 201715768 | | 5/2017 |
| WO | WO-2017/149636 | | 9/2017 |
| WO | WO-2020/004086 | | 1/2020 |
| WO | WO-2021/049651 | | 3/2021 |
| WO | WO-2021/073154 | | 4/2021 |

OTHER PUBLICATIONS

Zakhidov, A. et al., "Orthogonal Processing: A new Strategy for Organic Electronics," Chemical Science, Apr. 7, 2011, vol. 2, No. 6, pp. 1178-1182.

Malinowski, P. et al., "High Resolution Photolithography for Direct View Active Matrix Organic Light-Emitting Diode Augmented Reality Displays," Journal of the Society for Information Display, Apr. 2, 2018, vol. 26, No. 3, pp. 128-136.

Malinowski, P. et al., "Photolithographic Patterning of Organic Photodetectors with a Non-Fluorinated Photoresist System," Organic Electronics, Jul. 12, 2014, vol. 15, No. 10, pp. 2355 2359.

Malinowski, P. et al., "Multicolor 1250 ppi OLED Arrays Patterened by Photolithography," SID Digest '16: SID International Symposium Digest of Technical Papers, May 22, 2016, vol. 47, No. 1, pp. 1009-1012.

Papadopoulos, N. et al., "AMOLED Displays with In-Pixel Photodetector," Liquid Crystals and Display Technology, Jul. 9, 2020, pp. 1-19.

Ke, T. et al., "Technology Developments in High-Resolution FMM-free OLED and BEOL IGZO TFTs for Power-Efficient Microdisplays," SID Digest '21: SID International Symposium Digest of Technical Papers, May 1, 2021, vol. 52, No. 1, pp. 127-130.

Malinowski, P. et al., "Integration of Additional Functionalities into the Frontplane of AMOLED Displays," SID Digest '20: SID International Symposium Digest of Technical Papers, Aug. 1, 2020, vol. 51, No. 1, pp. 646-649.

Malinowski, P. et al., "Organic Photolithography for Displays with Integrated Fingerprint Scanner," SID Digest '19: SID International Symposium Digest of Technical Papers, May 29, 2019, vol. 50, No. 1, pp. 1007-1010.

Ke, T. et al., "Island and Hole Fabrication on OLED Stack for High-Resolution Sensor in Display Application," IDW '20: Proceedings of the 27th International Display Workshops, Dec. 9, 2020, vol. 27, pp. 902-905.

Gather, M. et al., "Solution-Processed Full-Color Polymer-OLED Displays Fabricated by Direct Photolithography," SID Digest '06: SID International Symposium Digest of Technical Papers, Jun. 1, 2006, vol. 37, No. 1, pp. 909-911.

Malinowski, P. et al., "Photolithography as Enabler of AMOLED Displays Beyond 1000 ppi," SID Digest '17: SID International Symposium Digest of Technical Papers, May 1, 2017, vol. 48, No. 1, pp. 623-626.

Taiwanese Office Action (Application No. 111114982), dated Jan. 20, 2026.

* cited by examiner

100A 128  107

102
109
108    } 103
113
104

101

100B

107

102
109
108    } 103
113
104

101

100C 102
109
108    } 103
113
104

101

520
510
Y1 —————————————————— Y2

551B⌐     551G⌐     551R⌐

⌐110B 520
510
Y1 —————————————————— Y2

108B⌐

103B⌐
104B⌐
551B⌐     551G⌐     551R⌐

550B

⌐REG

⌐110B 520
510
Y1 —————————————————— Y2

108B⌐

103B⌐
104B⌐
551B⌐     551G⌐     551R⌐

550B 110B    110G 520
510
Y1                                                    Y2

108B        108G
103B        103G
104B        104G
551B        551G        551R 550B        550G 110B    110G 520
510
Y1                                                    Y2

108B        108G        108R
103B        103G        103R
104B        104G        104R
551B        551G        551R 550B        550G        550R 110B    110G    REG
                                110R 520
510
Y1                                                    Y2

108B        108G        108R
103B        103G        103R
104B        104G        104R
551B        551G        551R 550B        550G        550R 520
510
Y1 ——————————————————— Y2

108B
103B
104B
551B 108G
103G
104G
551G 108R
103R
104R
551R 550B   550G   550R 520
510
Y1 ——————————————————— Y2

107B
108B
103B
104B
551B 107G
108G
103G
104G
551G 107R
108R
103R
104R
551R 550B   550G   550R 520
510
Y1 ——————————————————— Y2

108B
103B
104B
551B 108G
103G
104G
551G 108R
103R
104R
551R 550B   550G   550R

LIGHT-EMITTING DEVICE, LIGHT-EMITTING APPARATUS, ELECTRONIC APPLIANCE, AND LIGHTING DEVICE

BACKGROUND OF THE INVENTION

1. Field of the Invention

One embodiment of the present invention relates to a light-emitting device, a display module, a lighting module, a light-emitting apparatus, a display apparatus, a light-emitting and light-receiving apparatus, an electronic appliance, a lighting device, and an electronic device. Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display apparatus, a liquid crystal display apparatus, a light-emitting apparatus, a lighting device, a power storage device, a memory device, an imaging device, a driving method thereof, and a manufacturing method thereof.

2. Description of the Related Art

Light-emitting devices (organic EL devices) including organic compounds and utilizing electroluminescence (EL) have been put to more practical use. In the basic structure of such light-emitting devices, an organic compound layer containing a light-emitting material (an EL layer) is sandwiched between a pair of electrodes. Carriers are injected by the application of a voltage to the device, and recombination energy of the carriers is used, whereby light emission can be obtained from the light-emitting material.

Such light-emitting devices are of self-luminous type and thus have advantages over liquid crystal devices, such as high visibility and no need for backlight when used in pixels of a display, and are suitable as flat panel display devices. Displays including such light-emitting devices are also highly advantageous in that they can be thin and lightweight. Moreover, such light-emitting devices also have a feature that response speed is extremely fast.

Since light-emitting layers of such light-emitting devices can be successively formed two-dimensionally, planar light emission can be achieved. This feature is difficult to realize with point light sources typified by incandescent lamps and LEDs or linear light sources typified by fluorescent lamps; thus, the light-emitting devices also have great potential as planar light sources which can be used for lighting devices and the like.

Displays or lighting devices including light-emitting devices can be used in a variety of electronic appliances as described above, and research and development of light-emitting devices have progressed for more favorable characteristics.

A variety of methods for manufacturing light-emitting devices are known. As a method for manufacturing a high-resolution light-emitting device, a method of forming a light-emitting layer without using a fine metal mask is known. An example of the method is a method for manufacturing an organic EL display described in Patent Document 1. The method includes a step of forming a first light-emitting layer as a continuous film crossing a display region including an electrode array by deposition of a first luminescent organic material containing a mixture of a host material and a dopant material over the electrode array that is formed over an insulating substrate and includes a first pixel electrode and a second pixel electrode; a step of irradiating part of the first light-emitting layer positioned over the second pixel electrode with ultraviolet light while part of the first light-emitting layer positioned over the first pixel electrode is not irradiated with ultraviolet light; a step of forming a second light-emitting layer as a continuous film crossing the display region by deposition of a second luminescent organic material, which contains a mixture of a host material and a dopant material but differs from the first luminescent organic material, over the first light-emitting layer; and a step of forming a counter electrode over the second light-emitting layer.

REFERENCE

[Patent Document 1] Japanese Published Patent Application No. 2012-160473

SUMMARY OF THE INVENTION

An object of one embodiment of the present invention is to provide a novel light-emitting device with high emission efficiency. Another object of one embodiment of the present invention is to provide a novel light-emitting apparatus with high emission efficiency. Another object of one embodiment of the present invention is to provide a novel light-emitting and light-receiving apparatus with high emission efficiency. Another object of one embodiment of the present invention is to provide a novel electronic appliance with low power consumption. Another object of one embodiment of the present invention is to provide a novel lighting device with low power consumption.

Note that the description of these objects does not preclude the existence of other objects. One embodiment of the present invention does not necessarily achieve all the objects listed above. Other objects will be apparent from and can be derived from the description of the specification, the drawings, the claims, and the like.

One embodiment of the present invention is a light-emitting device including a first electrode, a second electrode, an EL layer, and an insulating layer, in which the EL layer is positioned between the first electrode and the second electrode; the EL layer includes at least a light-emitting layer, an electron-transport layer, and an electron-injection layer; the electron-transport layer is positioned over the light-emitting layer; the insulating layer is in contact with an end portion of the light-emitting layer and an end portion of the electron-transport layer; the electron-injection layer is positioned over the electron-transport layer; and the electron-injection layer includes an alkali metal compound and a reducing agent.

One embodiment of the present invention is a light-emitting device including a first electrode, a second electrode, an EL layer, and an insulating layer, in which the EL layer is positioned between the first electrode and the second electrode; the EL layer includes at least a light-emitting layer, an electron-transport layer, and an electron-injection layer; the electron-transport layer is positioned over the light-emitting layer; the insulating layer is in contact with an end portion of the light-emitting layer and an end portion of the electron-transport layer; the electron-injection layer includes a portion positioned over the electron-transport layer and a portion in contact with the insulating layer; the insulating layer is positioned between the end portion of the light-emitting layer and the electron-injection layer; and the electron-injection layer includes an alkali metal compound and a reducing agent.

One embodiment of the present invention is a light-emitting device including a first electrode, a second electrode, and an EL layer, in which the EL layer is positioned between the first electrode and the second electrode, the EL layer includes at least a light-emitting layer, an electron-transport layer, and an electron-injection layer; the electron-transport layer is positioned over the light-emitting layer; the electron-injection layer includes a portion positioned over the electron-transport layer and a portion in contact with an end portion of the light-emitting layer; and the electron-injection layer includes an alkali metal compound and a reducing agent.

In each of the above-described light-emitting devices, the electron-injection layer is preferably a mixed film of the alkali metal compound and the reducing agent.

In the above-described light-emitting device, a percentage of the reducing agent in the mixed film is preferably more than or equal to 20 vol % and less than or equal to 80 vol %.

In each of the above-described light-emitting devices, the electron-injection layer is preferably a stacked-layer film of a first layer including the alkali metal compound and a second layer including the reducing agent.

In the above-described light-emitting device, the second layer is preferably positioned between the first layer and the second electrode.

In the above-described light-emitting devices, the electron-injection layer preferably has a thickness of more than or equal to 0.5 nm and less than or equal to 5 nm.

In the above-described light-emitting devices, the reducing agent is preferably a material having a work function of higher than or equal to 2.5 eV and lower than 4.0 eV.

One embodiment of the present invention is a light-emitting apparatus including any of the above-described light-emitting devices, and a transistor or a substrate.

One embodiment of the present invention is a light-emitting and light-receiving apparatus which includes at least any of the above-described light-emitting devices and a light-receiving device, and includes a transistor or a substrate.

One embodiment of the present invention is a light-emitting apparatus including a first light-emitting device and a second light-emitting device, in which the first light-emitting device includes a first electrode, a second electrode, a first EL layer, and a first insulating layer; the first EL layer is positioned between the first electrode and the second electrode; the first EL layer includes at least a first light-emitting layer, a first electron-transport layer, and an electron-injection layer; the first electron-transport layer is positioned over the first light-emitting layer; the first insulating layer is in contact with an end portion of the first light-emitting layer and an end portion of the first electron-transport layer; the electron-injection layer is positioned over the first electron-transport layer; the second light-emitting device includes a third electrode, the second electrode, a second EL layer, and a second insulating layer; the second EL layer is positioned between the third electrode and the second electrode; the second EL layer includes at least a second light-emitting layer, a second electron-transport layer, and the electron-injection layer; the second electron-transport layer is positioned over the second light-emitting layer; the second insulating layer is in contact with an end portion of the second light-emitting layer and an end portion of the second electron-transport layer; the electron-injection layer is positioned over the second electron-transport layer; and the electron-injection layer includes an alkali metal compound and a reducing agent.

One embodiment of the present invention is a light-emitting apparatus including a first light-emitting device and a second light-emitting device, in which the first light-emitting device includes a first electrode, a second electrode, a first EL layer, and a first insulating layer; the first EL layer is positioned between the first electrode and the second electrode; the first EL layer includes at least a first light-emitting layer, a first electron-transport layer, and an electron-injection layer; the first electron-transport layer is positioned over the first light-emitting layer; the first insulating layer is in contact with an end portion of the first light-emitting layer and an end portion of the first electron-transport layer; the electron-injection layer includes a portion positioned over the first electron-transport layer and a portion in contact with the first insulating layer; the first insulating layer is positioned between the end portion of the first light-emitting layer and the electron-injection layer; the second light-emitting device includes a third electrode, the second electrode, a second EL layer, and a second insulating layer; the second EL layer is positioned between the third electrode and the second electrode; the second EL layer includes at least a second light-emitting layer, a second electron-transport layer, and the electron-injection layer; the second electron-transport layer is positioned over the second light-emitting layer; the second insulating layer is in contact with an end portion of the second light-transmitting layer and an end portion of the second electron-transport layer; the electron-injection layer includes a portion positioned over the second electron-transport layer and a portion in contact with the second insulating layer; the second insulating layer is positioned between the end portion of the second light-emitting layer and the electron-injection layer; and the electron-injection layer includes an alkali metal compound and a reducing agent.

One embodiment of the present invention is a light-emitting apparatus including a first light-emitting device and a second light-emitting device, in which the first light-emitting device includes a first electrode, a second electrode, and a first EL layer; the first EL layer is positioned between the first electrode and the second electrode; the first EL layer includes at least a first light-emitting layer, a first electron-transport layer, and an electron-injection layer; the first electron-transport layer is positioned over the first light-emitting layer; the electron-injection layer includes a portion positioned over the first electron-transport layer and a portion in contact with an end portion of the first light-emitting layer; the second light-emitting device includes a third electrode, the second electrode, and a second EL layer; the second EL layer is positioned between the third electrode and the second electrode; the second EL layer includes at least a second light-emitting layer, a second electron-transport layer, and the electron-injection layer; the second electron-transport layer is positioned over the second light-emitting layer; the electron-injection layer includes a portion positioned over the second electron-transport layer and a portion in contact with an end portion of the second light-emitting layer; and the electron-injection layer includes an alkali metal compound and a reducing agent.

One embodiment of the present invention is an electronic appliance including any of the above-described light-emitting apparatuses; and a sensor unit, an input unit, or a communication unit.

5

One embodiment of the present invention is a lighting device including any of the above-described light-emitting apparatuses and a housing.

In addition to the aforementioned light-emitting devices, the present invention also includes a light-emitting device including a layer (e.g., a cap layer) that is in contact with an electrode and contains an organic compound. Furthermore, a light-emitting apparatus including a transistor, a substrate, or the like in addition to any of the light-emitting devices is also included in the scope of the invention. Furthermore, an electronic appliance and a lighting device each including any of these light-emitting devices and any of a sensor unit, an input unit, a communication unit, and the like are also included in the scope of the invention. A light-emitting and light-receiving apparatus including a light-receiving device in addition to any of the above light-emitting devices is also included in the present invention. Furthermore, a light-emitting and light-receiving apparatus including a transistor, a substrate, or the like in addition to the light-emitting device and the light-receiving device is also included in the invention. Furthermore, an electronic appliance and a lighting device each including the light-emitting device, the light-receiving device, and any of a sensor unit, an input unit, a communication unit, and the like are also included in the scope of the invention.

Moreover, a light-emitting apparatus including a light-emitting device, a light-emitting and light-receiving apparatus including a light-emitting device and a light-receiving device, or a lighting device including the light-emitting apparatus or the light-emitting and light-receiving apparatus is also included in the scope of one embodiment of the present invention. Accordingly, the light-emitting apparatus in this specification refers to an image display device or a light source (including a lighting device). In addition, the light-emitting apparatus includes the following in its category: a module in which a connector such as a flexible printed circuit (FPC) or a tape carrier package (TCP) is attached to the light-emitting apparatus; a module in which a printed wiring board is provided at the end of a TCP; and a module in which an integrated circuit (IC) is directly mounted on a light-emitting device by a chip on glass (COG) method.

In this specification, the terms "source" and "drain" of a transistor interchange with each other depending on the polarity of the transistor or the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, the connection relation of a transistor is sometimes described assuming for convenience that the source and the drain are fixed; in reality, the source and the drain interchange with each other depending on the relation of the potentials.

In this specification, a source of a transistor means a source region that is part of a semiconductor film functioning as an active layer or a source electrode connected to the semiconductor film. Similarly, a drain of a transistor means a drain region that is part of the semiconductor film or a drain electrode connected to the semiconductor film. A "gate" means a gate electrode.

In this specification, a state in which transistors are connected to each other in series means, for example, a state in which only one of a source and a drain of a first transistor is connected to only one of a source and a drain of a second

6 transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, connection means electrical connection and corresponds to a state where a current, a voltage, or a potential can be supplied or transmitted. Accordingly, a state of being connected means not only a state of being directly connected but also a state of being indirectly connected through a circuit element such as a wiring, a resistor, a diode, or a transistor that allows a current, a voltage, or a potential to be supplied or transmitted.

In this specification, even when different components are connected to each other in a circuit diagram, there is actually a case where one conductive film has functions of a plurality of components, such as a case where part of a wiring serves as an electrode. In this specification, connection also means such a case where one conductive film has functions of a plurality of components.

With one embodiment of the present invention, a novel light-emitting device with high emission efficiency can be provided. With one embodiment of the present invention, a novel light-emitting apparatus with high emission efficiency can be provided. With one embodiment of the present invention, a novel light-emitting and light-receiving apparatus with high emission efficiency can be provided. With one embodiment of the present invention, a novel electronic appliance with low power consumption can be provided. With one embodiment of the present invention, a novel lighting device with low power consumption can be provided.

Note that the description of these effects does not preclude the existence of other effects. One embodiment of the present invention does not necessarily have all the effects listed above. Other effects will be apparent from and can be derived from the description of the specification, the drawings, the claims, and the like.

DETAILED DESCRIPTION OF THE INVENTION

Embodiments of the present invention will be described in detail below with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Embodiment 1

In this embodiment, structures of light-emitting devices of embodiments of the present invention are described with reference to FIGS. 1A to 1C.

Figure 1A:
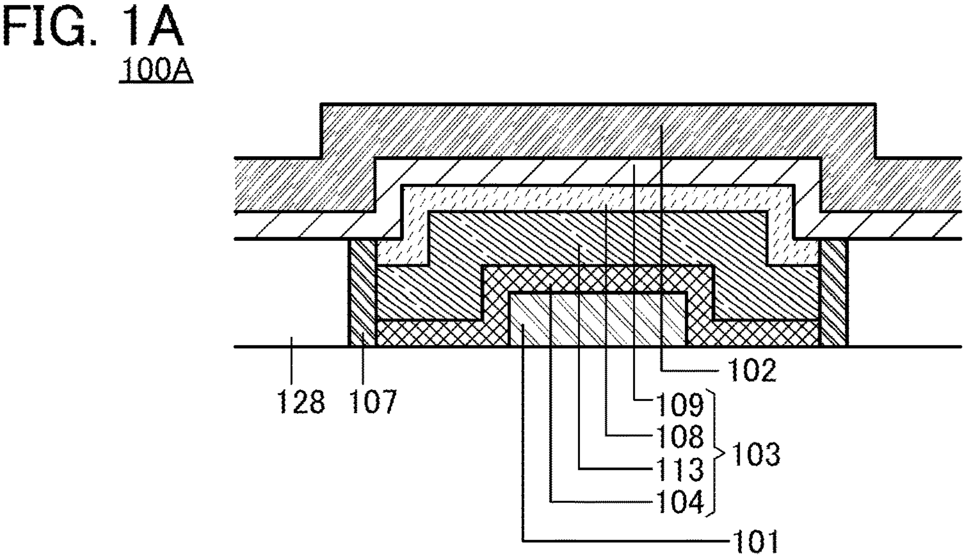
FIGS. 1A to 1C illustrate structures of light-emitting devices of embodiments.

FIG. 1A is a cross-sectional view illustrating a structure of a light-emitting device 100A of one embodiment of the present invention. FIG. 1B is a cross-sectional view illustrating a structure of a light-emitting device 100B of another embodiment of the present invention. FIG. 1C is a cross-sectional view illustrating a structure of a light-emitting device 100C of another embodiment of the present invention.

Figure 1B:
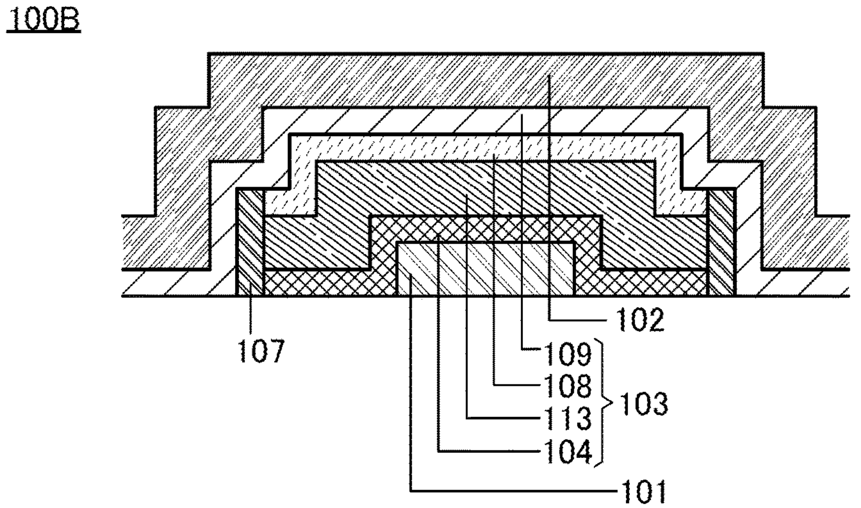

As illustrated in FIGS. 1A and 1B, the light-emitting device 100A and the light-emitting device 100B each include a first electrode 101, a second electrode 102, an EL layer 103, and an insulating layer 107.

In the light-emitting device 100A and the light-emitting device 100B, the EL layer 103 is positioned between the first electrode 101 and the second electrode 102. The EL layer 103 has a structure in which a hole-injection/transport layer 104, a light-emitting layer 113, an electron-transport layer 108, and an electron-injection layer 109 are stacked in this order.

In the EL layer 103 included in the light-emitting device 100A and the light-emitting device 100B, an end portion of the hole-injection/transport layer 104, an end portion of the light-emitting layer 113, and an end portion of the electron-transport layer 108 are aligned or substantially aligned. In other words, the end portion of the hole-injection/transport layer 104, the end portion of the light-emitting layer 113, and the end portion of the electron-transport layer 108 substantially coincide in shape with each other in the plan view (the top view). The insulating layer 107 is in contact with the end portion of the hole-injection/transport layer 104, the end portion of the light-emitting layer 113, and the end portion of the electron-transport layer 108.

In FIG. 1A, a partition 128 is provided adjacent to the light-emitting device 100A, and the insulating layer 107 included in the light-emitting device 100A is in contact with the partition 128. The partition 128 is formed using an insulating material. Thus, the partition 128 can also be referred to as an insulating layer. Moreover, the partition 128 can also function as the insulating layer 107.

The light-emitting device 100B illustrated in FIG. 1B is different from the light-emitting device 100A in not being provided with the partition 128. Thus, in the light-emitting device 100B, the electron-injection layer 109 includes a portion positioned over the electron-transport layer 108 and a portion in contact with the insulating layer 107, and the insulating layer 107 is positioned between the end portions of the hole-injection/transport layer 104, the light-emitting layer 113, and the electron-transport layer 108 and the electron-injection layer 109.

Figure 1C:
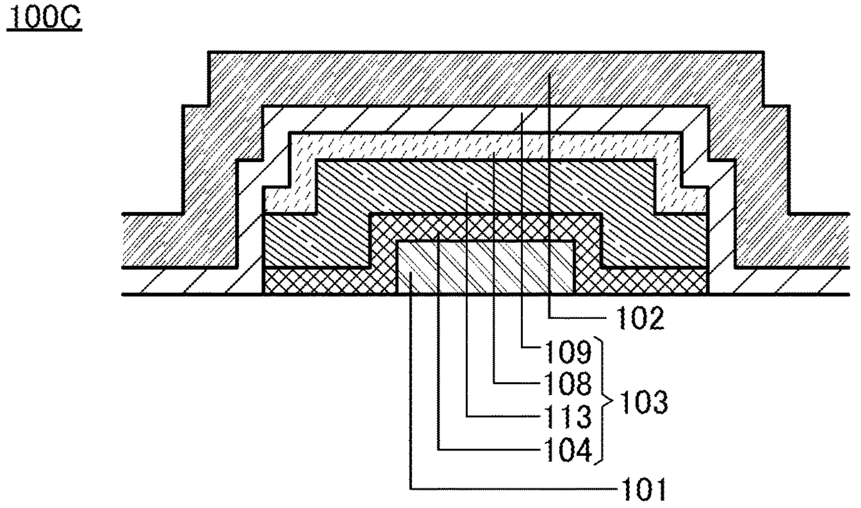

The light-emitting device 100C illustrated in FIG. 1C is different from the light-emitting device 100B in not including the insulating layer 107. Thus, the electron-injection layer 109 includes a portion positioned over the electron-transport layer 108 and a portion in contact with the end portion of the hole-injection/transport layer 104, the end portion of the light-emitting layer 113, and the end portion of the electron-transport layer 108. The above description of the light-emitting device 100B can be referred to for the other structures of the light-emitting device 100C.

Note that although the width of the hole-injection/transport layer 104, the width of the light-emitting layer 113, and the width of the electron-transport layer 108 are larger than the width of the first electrode 101 in the light-emitting devices 100A, 100B, and 100C, one embodiment of the present invention is not limited to the structure. The width of the hole-injection/transport layer 104, the width of the light-emitting layer 113, and the width of the electron-transport layer 108 may be smaller than or equal to the width of the first electrode 101.

The electron-injection layer 109 included in the light-emitting devices 100A, 100B, and 100C is part of the EL layer 103 but has a different shape from the other layers in the EL layer 103 (the hole-injection/transport layer 104, the light-emitting layer 113, and the electron-transport layer 108) as illustrated in FIGS. 1A to 1C. Generally speaking, in the case of manufacturing a light-emitting device in which a layer of the EL layer has a different shape from the other layer(s), the interface between the layer and the other layer(s) is exposed to a chemical solution, an etching gas, an atmosphere, or the like in the manufacturing process, so that the carrier injection barrier at the interface is heightened; thus, a problem such as an increase in driving voltage or a decrease in emission efficiency of the light-emitting device occurs in some cases.

However, the electron-injection layer 109 in the light-emitting devices of embodiments of the present invention includes an alkali metal compound and a reducing agent. In the process of manufacturing the light-emitting devices, the use of the reducing agent together with the alkali metal compound at the time of forming the electron-injection layer 109 facilitates ionization of the alkali metal compound. An alkali metal ion generated by the ionization can give an electron to the electron-transport layer 108 and extract an electron from the second electrode 102; thus, the electron-injection layer 109 can lower the carrier injection barrier from the second electrode 102 to the electron-transport layer 108.

Therefore, even when the interface between the electron-injection layer 109 and the electron-transport layer 108 is exposed to a chemical solution, an etching gas, an atmosphere, or the like in the manufacturing process for the purpose of forming the electron-injection layer 109 having a different shape from the other layers in the EL layer 103 (the hole-injection/transport layer 104, the light-emitting layer 113, and the electron-transport layer 108), the structure including the alkali metal compound and the reducing agent of the electron-injection layer 109 can suppress an increase in the carrier injection barrier at the interface and accordingly prevent an increase in the driving voltage of the light-emitting devices of embodiments of the present invention. Furthermore, a favorable carrier balance can be achieved; accordingly, emission efficiency of the light-emitting devices can be improved.

As the alkali metal compound that can be used in the electron-injection layer 109, lithium fluoride (LiF), cesium fluoride (CsF), 8-quinolinolato-lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), an oxide of lithium ($LiO_x$), cesium carbonate, or the like can be used. Among others, lithium compounds such as lithium fluoride (LiF), 8-quinolinolato-lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), and an oxide of lithium ($LiO_x$) are preferable because of their excellent electron-injection properties.

As the reducing agent that can be used in the electron-injection layer 109, a material having a work function of higher than or equal to 2.5 eV and lower than 4.0 eV is preferable; specifically, magnesium (Mg), calcium (Ca), scandium (Sc), strontium (Sr), yttrium (Y), barium (Ba), cerium (Ce), praseodymium (Pr), neodymium (Nd), samarium (Sm), europium (Eu), terbium (Tb), ytterbium (Yb), thorium (Th), or uranium (U) or a compound of any of these elements can be used. Moreover, the work function of the reducing agent is further preferably higher than or equal to 2.5 eV and lower than 3.0 eV; specifically, calcium, strontium, barium, cerium, praseodymium, samarium, europium, or ytterbium or a compound of any of these elements can be used. Among others, ytterbium is preferable because of its excellent electron-injection property.

The electron-injection layer 109 may be a mixed film including the alkali metal compound and the reducing agent or a stacked-layer film formed of a first layer including the alkali metal compound and a second layer including the reducing agent.

In the case where the electron-injection layer 109 is the mixed film including the alkali metal compound and the reducing agent, the percentage of the reducing agent in the mixed film is preferably more than or equal to 20 vol % and less than or equal to 80 vol %. This structure facilitates ionization of the alkali metal compound.

In the case where the electron-injection layer 109 is the stacked-layer film formed of the first layer including the alkali metal compound and the second layer including the reducing agent, the second layer is preferably positioned between the first layer and the second electrode. This structure facilitates ionization of the alkali metal compound in the first layer by thermal energy at the time of forming the second layer over the first layer in the manufacturing process of the light-emitting device. Furthermore, an interaction between a free alkali metal and the electron-transport layer 108 can easily occur, whereby a favorable property of injecting carriers from the second electrode 102 to the electron-transport layer 108 can be achieved.

The thickness of the electron-injection layer 109 is preferably more than or equal to 0.5 nm and less than or equal to 5 nm.

Materials that can be used for the first electrode 101, the second electrode 102, the hole-injection/transport layer 104, the light-emitting layer 113, and the electron-transport layer 108 are described later in Embodiment 2. Note that as the hole-injection/transport layer 104, the layer having the functions of the hole-injection layer and the hole-transport layer described in Embodiment 2 can be used, and the hole-injection/transport layer 104 may have a stacked-layer structure. Materials that can be used for the insulating layer 107 and the partition 128 are described later in Embodiment 3.

In the El layer 103, the electron-injection layer 109 is formed using a mask different from a mask used for processing the other layers in the EL layer 103 (the hole-injection/transport layer 104, the light-emitting layer 113, and the electron-transport layer 108), so that the electron-injection layer 109 and the other layers can be formed in different shapes. In other words, the different shapes mean those in the plan view (the top view).

The structures described in this embodiment can be used in combination with any of the structures described in the other embodiments as appropriate.

Embodiment 2

In this embodiment, other structures of the light-emitting devices described in Embodiment 1 are described with reference to FIGS. 2A to 2E.

<<Basic Structure of Light-Emitting Device>>

Figure 2A:
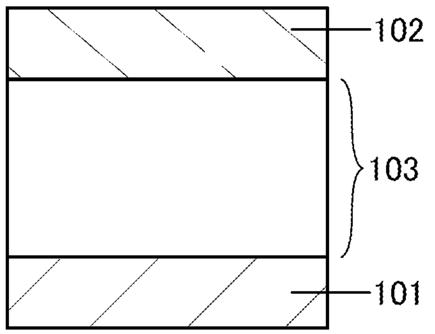
FIGS. 2A to 2E illustrate structures of light-emitting devices of embodiments.

Basic structures of the light-emitting device are described. FIG. 2A illustrates a light-emitting device including, between a pair of electrodes, an EL layer including a light-emitting layer. Specifically, an EL layer 103 is positioned between a first electrode 101 and a second electrode 102.

Figure 2B:
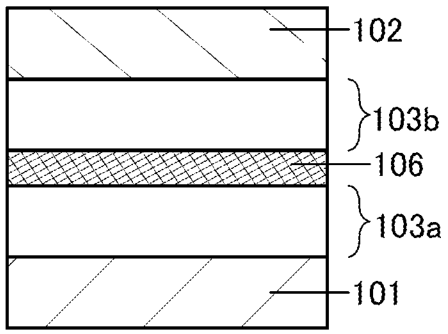

FIG. 2B illustrates a light-emitting device that has a stacked-layer structure (tandem structure) in which a plurality of EL layers (two EL layers 103*a* and 103*b* in FIG. 2B) are provided between a pair of electrodes and a charge-generation layer 106 is provided between the EL layers. A light-emitting device having a tandem structure enables fabrication of a light-emitting apparatus that can be driven at low voltage and has low power consumption.

The charge-generation layer 106 has a function of injecting electrons into one of the EL layers 103*a* and 103*b* and injecting holes into the other of the EL layers 103*a* and 103*b* when a potential difference is caused between the first electrode 101 and the second electrode 102. Thus, when voltage is applied in FIG. 2B such that the potential of the first electrode 101 is higher than that of the second electrode 102, the charge-generation layer 106 injects electrons into the EL layer 103*a* and injects holes into the EL layer 103*b*.

Note that in terms of light extraction efficiency, the charge-generation layer 106 preferably has a property of transmitting visible light (specifically, the charge-generation layer 106 preferably has a visible light transmittance of 40% or more). The charge-generation layer 106 functions even if it has lower conductivity than the first electrode 101 or the second electrode 102.

Figure 2C:
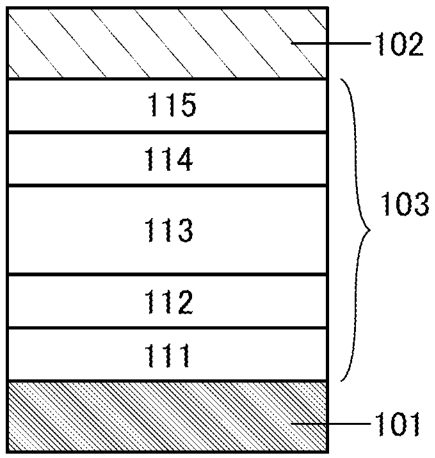

FIG. 2C illustrates a stacked-layer structure of the EL layer 103 in the light-emitting device of one embodiment of the present invention. In this case, the first electrode 101 is regarded as functioning as an anode and the second electrode 102 is regarded as functioning as a cathode. The EL layer 103 has a structure in which a hole-injection layer 111, a hole-transport layer 112, a light-emitting layer 113, an electron-transport layer 114, and an electron-injection layer 115 are stacked in this order over the first electrode 101. Note that the light-emitting layer 113 may have a stacked-layer structure of a plurality of light-emitting layers that emit light of different colors. For example, a light-emitting layer containing a light-emitting substance that emits red light, a light-emitting layer containing a light-emitting substance that emits green light, and a light-emitting layer containing a light-emitting substance that emits blue light may be stacked with or without a layer containing a carrier-transport material therebetween. Alternatively, a light-emitting layer containing a light-emitting substance that emits yellow light and a light-emitting layer containing a light-emitting substance that emits blue light may be used in combination. Note that the stacked-layer structure of the light-emitting layer 113 is not limited to the above. For example, the light-emitting layer 113 may have a stacked-layer structure of a plurality of light-emitting layers that emit light of the same color. For example, a first light-emitting layer containing a light-emitting substance that emits blue light and a second light-emitting layer containing a light-emitting substance that emits blue light may be stacked with or without a layer containing a carrier-transport material therebetween. The structure in which a plurality of light-emitting layers that emit light of the same color are stacked can sometimes achieve higher reliability than a single-layer structure. In the case where a plurality of EL layers are provided as in the tandem structure illustrated in FIG. 2B, the layers in each EL layer are sequentially stacked from the anode side as described above. When the first electrode 101 is the cathode and the second electrode 102 is the anode, the stacking order of the layers in the EL layer 103 is reversed. Specifically, the layer 111 over the first electrode 101 serving as the cathode is an electron-injection layer; the layer 112 is an electron-transport layer; the layer 113 is a light-emitting layer; the layer 114 is a hole-transport layer; and the layer 115 is a hole-injection layer.

The light-emitting layer 113 included in the EL layers (103, 103*a*, and 103*b*) contains an appropriate combination of a plurality of substances containing a light-emitting substance, so that fluorescent or phosphorescent light of a desired emission color can be obtained. The light-emitting layer 113 may have a stacked-layer structure having different emission colors. In that case, light-emitting substances and other substances are different between the stacked light-emitting layers. Alternatively, the plurality of EL layers (103*a* and 103*b*) in FIG. 2B may exhibit their respective emission colors. Also in that case, the light-emitting substances and other substances are different between the stacked light-emitting layers.

The light-emitting device of one embodiment of the present invention can have a micro optical resonator (microcavity) structure when, for example, the first electrode 101 is a reflective electrode and the second electrode 102 is a transflective electrode in FIG. 2C. Thus, light from the light-emitting layer 113 in the EL layer 103 can be resonated between the electrodes and light obtained through the second electrode 102 can be intensified.

Note that when the first electrode 101 of the light-emitting device is a reflective electrode having a stacked structure of a reflective conductive material and a light-transmitting conductive material (transparent conductive film), optical adjustment can be performed by adjusting the thickness of the transparent conductive film. Specifically, when the wavelength of light obtained from the light-emitting layer 113 is $\lambda$, the optical path length between the first electrode 101 and the second electrode 102 (the product of the thickness and the refractive index) is preferably adjusted to be $m\lambda/2$ (m is a natural number) or close to $m\lambda/2$.

To amplify desired light (wavelength: $\lambda$) obtained from the light-emitting layer 113, it is preferable to adjust each of the optical path length from the first electrode 101 to a region where the desired light is obtained in the light-emitting layer 113 (light-emitting region) and the optical path length from the second electrode 102 to the region where the desired light is obtained in the light-emitting layer 113 (light-emitting region) to be $(2m'+1)\lambda/4$ (m' is a natural number) or close to $(2m'+1)\lambda/4$. Here, the light-emitting region means a region where holes and electrons are recombined in the light-emitting layer 113.

By such optical adjustment, the spectrum of specific monochromatic light obtained from the light-emitting layer 113 can be narrowed and light emission with high color purity can be obtained.

In the above case, the optical path length between the first electrode 101 and the second electrode 102 is, to be exact, the total thickness from a reflective region in the first electrode 101 to a reflective region in the second electrode 102. However, it is difficult to precisely determine the reflective regions in the first electrode 101 and the second electrode 102; thus, it is assumed that the above effect can be sufficiently obtained wherever the reflective regions may be set in the first electrode 101 and the second electrode 102. Furthermore, the optical path length between the first electrode 101 and the light-emitting layer that emits the desired light is, to be exact, the optical path length between the reflective region in the first electrode 101 and the light-emitting region in the light-emitting layer that emits the desired light. However, it is difficult to precisely determine the reflective region in the first electrode 101 and the light-emitting region in the light-emitting layer that emits the desired light; thus, it is assumed that the above effect can be sufficiently obtained wherever the reflective region and the light-emitting region may be set in the first electrode 101 and the light-emitting layer that emits the desired light, respectively.

Figure 2D:
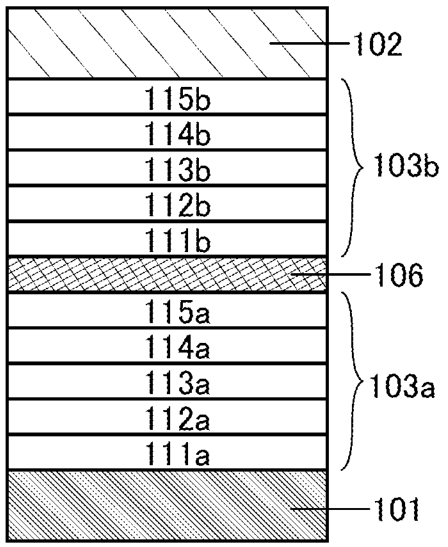

The light-emitting device illustrated in FIG. 2D is a light-emitting device having a tandem structure. Owing to a microcavity structure of the light-emitting device, light (monochromatic light) with different wavelengths from the EL layers (103*a* and 103*b*) can be extracted. Thus, separate coloring for obtaining a plurality of emission colors (e.g., R, G, and B) is not necessary. Therefore, high resolution can be easily achieved. A combination with coloring layers (color filters) is also possible. Furthermore, the emission intensity of light with a specific wavelength in the front direction can be increased, whereby power consumption can be reduced. In addition, a display panel apparatus having a high contrast ratio can be achieved.

Figure 2E:
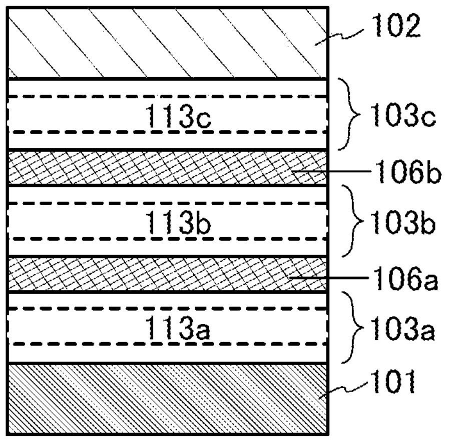

The light-emitting device illustrated in FIG. 2E is an example of the light-emitting device having the tandem structure illustrated in FIG. 2B, and includes three EL layers (103*a*, 103*b*, and 103*c*) stacked with charge-generation layers (106*a* and 106*b*) positioned therebetween, as illustrated in FIG. 2E. The three EL layers (103*a*, 103*b*, and 103*c*) include respective light-emitting layers (113*a*, 113*b*, and 113*c*), and the emission colors of the light-emitting layers can be selected freely. For example, each of the light-emitting layer 113*a* and the light-emitting layer 113*c* can emit blue light, and the light-emitting layer 113*b* can emit red light, green light, or yellow light. For another example, the light-emitting layer 113*a* can emit red light, the light-emitting layer 113*b* can emit blue light, green light, or yellow light, and the light-emitting layer 113*c* can emit red light.

In the light-emitting device of one embodiment of the present invention, at least one of the first electrode 101 and the second electrode 102 is a light-transmitting electrode (e.g., a transparent electrode or a transflective electrode). In the case where the light-transmitting electrode is a transparent electrode, the transparent electrode has a visible light transmittance higher than or equal to 40%. In the case where the light-transmitting electrode is a transflective electrode, the transflective electrode has a visible light reflectance higher than or equal to 20% and lower than or equal to 80%, preferably higher than or equal to 40% and lower than or equal to 70%. These electrodes preferably have a resistivity of $1\times10^{-2}$ Ωcm or less.

When one of the first electrode 101 and the second electrode 102 is a reflective electrode in the light-emitting device of one embodiment of the present invention, the visible light reflectance of the reflective electrode is higher than or equal to 40% and lower than or equal to 100%, preferably higher than or equal to 70% and lower than or equal to 100%. This electrode preferably has a resistivity of $1\times10^{-2}$ S/cm or less.

<<Specific Structure of Light-Emitting Device>>

Next, a specific structure of the light-emitting device of one embodiment of the present invention will be described. Here, the description is made using FIG. 2D showing the tandem structure. Note that the structure of the EL layer applies also to the structure of the light-emitting devices having a single structure in FIG. 2A and FIG. 2C. When the light-emitting device in FIG. 2D has a microcavity structure, the first electrode 101 is formed as a reflective electrode and the second electrode 102 is formed as a transflective electrode. Thus, a single-layer structure or a stacked-layer structure can be formed using one or more kinds of desired electrode materials. Note that the second electrode 102 is formed after formation of the EL layer 103*b*, with the use of a material selected as described above.

<First Electrode and Second Electrode>

As materials for the first electrode 101 and the second electrode 102, any of the following materials can be used in an appropriate combination as long as the above functions of the electrodes can be fulfilled. For example, a metal, an alloy, an electrically conductive compound, a mixture of these, and the like can be used as appropriate. Specifically, an In—Sn oxide (also referred to as ITO), an In—Si—Sn oxide (also referred to as ITSO), an In—Zn oxide, or an In—W—Zn oxide can be used. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table that is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

In the light-emitting device in FIG. 2D, when the first electrode 101 is the anode, a hole-injection layer 111*a* and a hole-transport layer 112*a* of the EL layer 103*a* are sequentially stacked over the first electrode 101 by a vacuum evaporation method. After the EL layer 103*a* and the charge-generation layer 106 are formed, a hole-injection layer 111*b* and a hole-transport layer 112*b* of the EL layer 103*b* are sequentially stacked over the charge-generation layer 106 in a similar manner.

<Hole-Injection Layer>

The hole-injection layers (111, 111*a*, and 111*b*) inject holes from the first electrode 101 serving as the anode or the charge-generation layers (106, 106*a*, and 106*b*) to the EL layers (103, 103*a*, and 103*b*) and contain an organic acceptor material or a material having a high hole-injection property.

The organic acceptor material allows holes to be generated in another organic compound whose highest occupied molecular orbital (HOMO) level is close to the lowest unoccupied molecular orbital (LUMO) level of the organic acceptor material when charge separation is caused between the organic acceptor material and the organic compound.

Thus, as the organic acceptor material, a compound having an electron-withdrawing group (e.g., a halogen group or a cyano group), such as a quinodimethane derivative, a chloranil derivative, and a hexaazatriphenylene derivative, can be used. Examples of the organic acceptor material include 7,7,8,8-tetracyano-2,3,5,6-tetrafluoroquinodimethane (abbreviation: $F_4$-TCNQ), 3,6-difluoro-2,5,7,7,8,8-hexacyanoquinodimethane, chloranil, 2,3,6,7,10,11-hexacyano-1,4,5,8,9,12-hexaazatriphenylene (abbreviation:

HAT-CN), 1,3,4,5,7,8-hexafluorotetracyano-naphthoquinodimethane (abbreviation: F6-TCNNQ), and 2-(7-dicyanomethylene-1,3,4,5,6,8,9,10-octafluoro-7H-pyren-2-ylidene)malononitrile. Note that among organic acceptor materials, a compound in which electron-withdrawing groups are bonded to fused aromatic rings each having a plurality of heteroatoms, such as HAT-CN, is particularly preferred because it has a high acceptor property and stable film quality against heat. Besides, a [3]radialene derivative having an electron-withdrawing group (particularly a cyano group or a halogen group such as a fluoro group), which has a very high electron-accepting property, is preferred; specific examples include α,α',α"-1,2,3-cyclopropanetriylidenetris[4-cyano-2,3,5,6-tetrafluorobenzeneacetonitrile], 1,2,3-cyclopropanetriylidenetris[2,6-dichloro-3,5-difluoro-4-(trifluoromethyl)benzeneacetonitrile], and cyclopropanetriylidenetris[2,3,4,5,6-pentafluorobenzeneacetonitrile].

As the material having a high hole-injection property, an oxide of a metal belonging to Group 4 to Group 8 in the periodic table (e.g., a transition metal oxide such as molybdenum oxide, vanadium oxide, ruthenium oxide, tungsten oxide, or manganese oxide) can be used. Specific examples include molybdenum oxide, vanadium oxide, niobium oxide, tantalum oxide, chromium oxide, tungsten oxide, manganese oxide, and rhenium oxide. Among these oxides, molybdenum oxide is preferable because it is stable in the air, has a low hygroscopic property, and is easily handled. Other examples include phthalocyanine (abbreviation: $H_2Pc$) and a phthalocyanine-based compound such as copper phthalocyanine (abbreviation: CuPc).

Other examples include aromatic amine compounds, which are low molecular compounds, such as 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), N,N-bis {4-[bis(3-methylphenyl)amino]phenyl}-N,N-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Other examples include high-molecular compounds (e.g., oligomers, dendrimers, and polymers) such as poly(N-vinylcarbazole) (abbreviation: PVK), poly(4-vinyltriphenylamine) (abbreviation: PVTPA), poly[N-(4-{N-[4-(4-diphenylamino)phenyl]phenyl-N-phenylamino}phenyl) methacrylamide](abbreviation: PTPDMA), and poly[N,N-bis(4-butylphenyl)-N,N-bis(phenyl)benzidine] (abbreviation: Poly-TPD). Alternatively, it is possible to use a high-molecular compound to which acid is added, such as poly(3,4-ethylenedioxythiophene)/poly(styrenesulfonic acid) (abbreviation: PEDOT/PSS) or polyaniline/poly(styrenesulfonic acid) (abbreviation: PAni/PSS), for example.

As the material having a high hole-injection property, a mixed material containing a hole-transport material and the above-described organic acceptor material (electron-accepting material) can be used. In that case, the organic acceptor material extracts electrons from the hole-transport material, so that holes are generated in the hole-injection layer 111 and the holes are injected into the light-emitting layer 113 through the hole-transport layer 112. Note that the hole-injection layer 111 may be formed to have a single-layer structure using a mixed material containing a hole-transport material and an organic acceptor material (electron-accepting material), or a stacked-layer structure of a layer containing a hole-transport material and a layer containing an organic acceptor material (electron-accepting material).

The hole-transport material preferably has a hole mobility higher than or equal to $1\times10^{-6}$ $cm^2/Vs$ in the case where the square root of the electric field strength [V/cm] is 600. Note that any other substance can also be used as long as the substance has a hole-transport property higher than an electron-transport property.

As the hole-transport material, materials having a high hole-transport property, such as a compound having a π-electron rich heteroaromatic ring (e.g., a carbazole derivative, a furan derivative, or a thiophene derivative) and an aromatic amine (an organic compound having an aromatic amine skeleton), are preferable.

Examples of the carbazole derivative (an organic compound having a carbazole ring) include a bicarbazole derivative (e.g., a 3,3'-bicarbazole derivative) and an aromatic amine having a carbazolyl group.

Specific examples of the bicarbazole derivative (e.g., a 3,3'-bicarbazole derivative) include 3,3'-bis(9-phenyl-9H-carbazole) (abbreviation: PCCP), 9,9'-bis(biphenyl-4-yl)-3,3'-bi-9H-carbazole (abbreviation: BisBPCz), 9,9'-bis(1,1'-biphenyl-3-yl)-3,3-bi-9H-carbazole (abbreviation: BismBPCz), 9-(1,1'-biphenyl-3-yl)-9'-(1,1'-biphenyl-4-yl)-9H,9'H-3,3'-bicarbazole (abbreviation: mBPCCBP), and 9-(2-naphthyl)-9'-phenyl-9H,9'H-3,3'-bicarbazole (abbreviation: βNCCP).

Specific examples of the aromatic amine having a carbazolyl group include 4-phenyl-4'-(9-phenyl-9H-carbazol-3-yl)triphenylamine (abbreviation: PCBA1BP), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 4,4'-diphenyl-4"-(9-phenyl-9H-carbazol-3-yl)triphenylamine (abbreviation: PCBBilBP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N-bis(9-phenylcarbazol-3-yl)-N,N-diphenylbenzene-1,3-diamine (abbreviation: PCA2B), N,N,N'-triphenyl-N,N,N'-tris(9-phenylcarbazol-3-yl)benzene-1,3,5-tri amine (abbreviation: PCA3B), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 2-[N-(9-phenylcarbazol-3-yl)-N-phenylamino]spiro-9,9'-bifluorene (abbreviation: PCASF), N-[4-(9H-carbazol-9-yl)phenyl]-N-(4-phenyl)phenylaniline (abbreviation: YGA1BP), N,N'-bis[4-(carbazol-9-yl)phenyl]-N,N'-diphenyl-9,9-dimethylfluorene-2,7-diamine (abbreviation: YGA2F), and 4,4',4"-tris(carbazol-9-yl)triphenylamine (abbreviation: TCTA).

Other examples of the carbazole derivative include 3-[4-(9-phenanthryl)-phenyl]-9-phenyl-9H-carbazole (abbreviation: PCPPn), 3-[4-(1-naphthyl)-phenyl]-9-phenyl-9H-carbazole (abbreviation: PCPN), 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA).

Specific examples of the furan derivative (an organic compound having a furan ring) include 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II).

Specific examples of the thiophene derivative (an organic compound having a thiophene ring) include organic compounds having a thiophene ring, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV).

Specific examples of the aromatic amine include 4,4'-bis[N-(1-naphthyl)-N-phenylamino]biphenyl (abbreviation: NPB or α-NPD), N,N-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N-phenyl-N-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 2,7-bis[N-(4-diphenyl aminophenyl)-N-phenyl amino]-spiro-9,9'-bifluorene (abbreviation: DPA2SF), 4,4',4"-tris[N-(1-naphthyl)-N-phenylamino]triphenylamine (abbreviation: TNATA), 4,4',4"-tris(N,N-diphenyl amino)triphenyl amine (abbreviation: TDATA), 4,4',4"-tris[N-(3-methylphenyl)-N-phenylamino]triphenylamine (abbreviation: m-MTDATA), N,N-di(p-tolyl)-N,N-diphenyl-p-phenylenediamine (abbreviation: DTDPPA), 4,4'-bis[N-(4-diphenylaminophenyl)-N-phenylamino]biphenyl (abbreviation: DPAB), DNTPD, 1,3,5-tris[N-(4-diphenylaminophenyl)-N-phenylamino]benzene (abbreviation: DPA3B), N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBA(βNαNB), 4,4'-diphenyl-4"-(5;2'-binaphthyl-1-yl)triphenylamine (abbreviation: BBA(βNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAl3NBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: aNBA1BP), 4,4'-bis(1-naphthyl)triphenylamine (abbreviation: aNBB1BP), 4,4'-diphenyl-4"-[4'-(carbazol-9-yl)biphenyl-4-yl]triphenylamine (abbreviation: YGTBilBP), 4'-[4-(3-phenyl-9H-carbazol-9-yl)phenyl]tris(1,1'-biphenyl-4-yl)amine (abbreviation: YGTBi 1BP-02), 4-[4'-(carbazol-9-yl)biphenyl-4-yl]-4'-(2-naphthyl)-4"-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNB SF), N,N-bis([1,1'-biphenyl]-4-yl)-9,9'-spirobi[9H-fluoren]-2-amine (abbreviation: BBASF), N,N-bis([1,1'-biphenyl]-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi[9H-fluoren]-4-amine (abbreviation: oFBiSF), N-(4-biphenyl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-[4-(9-phenylfluoren-9-yl)phenyl]triphenylamine (abbreviation: BPAFLBi), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, and N,N-bis(9,9-dimethyl-9H-fluoren-2-yl)-9,9'-spirobi-9H-fluoren-1-amine.

Other examples of the hole-transport material include high-molecular compounds (e.g., oligomers, dendrimers, and polymers) such as poly(N-vinylcarbazole) (abbreviation: PVK), poly(4-vinyltriphenylamine) (abbreviation: PVTPA), poly[N-(4-{N-[4-(4-diphenyl amino)phenyl]phenyl-N-phenylamino}phenyl)methacrylamide](abbreviation: PTPDMA), and poly[N,N-bis(4-butylphenyl)-N,N-bis(phenyl)benzidine](abbreviation: Poly-TPD). Alternatively, it is possible to use a high-molecular compound to which acid is added, such as poly(3,4-ethylenedioxythiophene)/poly(styrenesulfonic acid) (abbreviation: PEDOT/PSS) or polyaniline/poly(styrenesulfonic acid) (abbreviation: PAni/PSS), for example.

Note that the hole-transport material is not limited to the above examples, and any of a variety of known materials may be used alone or in combination as the hole-transport material.

The hole-injection layers (111, 111*a*, and 111*b*) can be formed by any of known film formation methods such as a vacuum evaporation method.

<Hole-Transport Layer>

The hole-transport layers (112, 112*a*, and 112*b*) transport the holes, which are injected from the first electrode 101 by the hole-injection layers (111, 111*a*, and 111*b*), to the light-emitting layers (113, 113*a*, and 113*b*). Note that the hole-transport layers (112, 112*a*, and 112*b*) contain a hole-transport material. Thus, the hole-transport layers (112,

112*a*, and 112*b*) can be formed using a hole-transport material that can be used for the hole-injection layers (111, 111*a*, and 111*b*).

Note that in the light-emitting device described in this embodiment, the organic compound used for the hole-transport layers (112, 112*a*, and 112*b*) can also be used for the light-emitting layers (113, 113*a*, and 113*b*). The use of the same organic compound for the hole-transport layers (112, 112*a*, and 112*b*) and the light-emitting layers (113, 113*a*, and 113*b*) is preferable, in which case holes can be efficiently transported from the hole-transport layers (112, 112*a*, and 112*b*) to the light-emitting layers (113, 113*a*, and 113*b*).

<Light-Emitting Layer>

The light-emitting layers (113, 113*a*, and 113*b*) contain a light-emitting substance. Note that as a light-emitting substance that can be used in the light-emitting layers (113, 113*a*, and 113*b*), a substance whose emission color is blue, violet, bluish violet, green, yellowish green, yellow, orange, red, or the like can be used as appropriate. When a plurality of light-emitting layers are provided, the use of different light-emitting substances for the light-emitting layers enables a structure that exhibits different emission colors (e.g., white light emission obtained by a combination of complementary emission colors). Furthermore, one light-emitting layer may have a stacked-layer structure of layers containing different light-emitting substances.

The light-emitting layers (113, 113*a*, and 113*b*) may each contain one or more kinds of organic compounds (e.g., a host material) in addition to a light-emitting substance (guest material).

In the case where a plurality of host materials are used in the light-emitting layers (113, 113*a*, and 113*b*), a second host material that is additionally used is preferably a substance having a larger energy gap than a known guest material and a first host material. Preferably, the lowest singlet excitation energy level (Si level) of the second host material is higher than that of the first host material, and the lowest triplet excitation energy level (T1 level) of the second host material is higher than that of the guest material. Preferably, the lowest triplet excitation energy level (T1 level) of the second host material is higher than that of the first host material. With such a structure, an exciplex can be formed by the two kinds of host materials. To form an exciplex efficiently, it is particularly preferable to combine a compound that easily accepts holes (hole-transport material) and a compound that easily accepts electrons (electron-transport material). With the above structure, high efficiency, low voltage, and a long lifetime can be achieved at the same time.

As an organic compound used as the host material (including the first host material and the second host material), organic compounds such as the hole-transport materials usable in the hole-transport layers (112, 112*a*, and 112*b*) and electron-transport materials usable in electron-transport layers (114, 114*a*, and 114*b*) described later can be used as long as they satisfy requirements for the host material used in the light-emitting layer. Another example is an exciplex formed by two or more kinds of organic compounds (the first host material and the second host material). An exciplex whose excited state is formed by two or more kinds of organic compounds has an extremely small difference between the S1 level and the T1 level and functions as a TADF material capable of converting triplet excitation energy into singlet excitation energy. In an example of a preferred combination of two or more kinds of organic compounds forming an exciplex, one of the two or more kinds of organic compounds has a π-electron deficient heteroaromatic ring and the other has a π-electron rich heteroaromatic ring. A phosphorescent substance such as an iridium-, rhodium-, or platinum-based organometallic complex or a metal complex may be used as one component of the combination for forming an exciplex.

There is no particular limitation on the light-emitting substances that can be used for the light-emitting layers (113, 113*a*, and 113*b*), and a light-emitting substance that converts singlet excitation energy into light in the visible light range or a light-emitting substance that converts triplet excitation energy into light in the visible light range can be used.

<<Light-emitting substance that converts singlet excitation energy into light>>

The following substances that exhibit fluorescent light (fluorescent substances) can be given as examples of the light-emitting substance that converts singlet excitation energy into light and can be used in the light-emitting layer 113: a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. A pyrene derivative is particularly preferable because it has a high emission quantum yield. Specific examples of pyrene derivatives include N,N-bis(3-methylphenyl)-N,N-bis[3-(9-phenyl-9H-fluoren-9-yl)phenyl]pyrene-1,6-diamine (abbreviation: 1,6mMemFLPAPrn), (N,N-diphenyl-N,N-bis[4-(9-phenyl-9H-fluoren-9-yl)phenyl]pyrene-1,6-diamine) (abbreviation: 1,6FLPAPrn), N,N-bis(dibenzofuran-2-yl)-N,N-diphenylpyrene-1,6-diamine (abbreviation: 1,6FrAPrn), N,N-bis(dibenzothiophen-2-yl)-N,N-diphenylpyrene-1,6-diamine (abbreviation: 1,6ThAPrn), N,N-(pyrene-1,6-diyl)bis[(N-phenylbenzo[b]naphtho[1,2-d]furan)-6-amine](abbreviation: 1,6BnfAPrn), N,N-(pyrene-1,6-diyl)bis[(N-phenylbenzo[b]naphtho[1,2-d]furan)-8-amine] (abbreviation: 1,6BnfAPrn-02), and N,N-(pyrene-1,6-diyl)bis[(6,N-diphenylbenzo[b]naphtho[1,2-d]furan)-8-amine] (abbreviation: 1,6BnfAPrn-03).

In addition, it is possible to use, for example, 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl)triphenylamine (abbreviation: PCBAPBA), perylene, 2,5,8,11-tetra(tert-butyl)perylene (abbreviation: TBP), N,N'-(2-tert-butylanthracene-9,10-diyldi-4,1-phenylene)bis[N,N,N-triphenyl-1,4-phenylenediamine](abbreviation: DPABPA), N,9-diphenyl-N-[4-(9,10-diphenyl-2-anthryl)phenyl]-9H-carbazol-3-amine (abbreviation: 2PCAPPA), and N-[4-(9,10-diphenyl-2-anthryl)phenyl]-N,N,N-triphenyl-1,4-phenylenediamine (abbreviation: 2DPAPPA).

It is also possible to use, for example, N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N,N-triphenyl-1,4-phenylenediamine (abbreviation: 2DPAPA), N-[9,10-bis(1,1'-biphenyl-2-yl)-2-anthryl]-N,N'P-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N'P-tetrakis(4-methylphenyl) tetracene-5,11-diamine (abbreviation: p-mPhTD), 7,14-diphenyl-N,N,N,N-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[4]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[4]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[4]quinolizin-9-yl)ethenyl]-4H-pyran-4-ylidene}propanedinitrile (abbreviation: BisDCJTM), 1,6BnfAPrn-03,3,10-bis[N-(9-phenyl-9H-carbazol-2-yl)-N-phenylamino]naphtho[2,3-b;6,7-b]bisbenzofuran (abbreviation: 3,10PCA2Nbf(IV)-02), and 3,10-bis[N-(dibenzofuran-3-yl)-N-phenylamino]naphtho[2,3-b; 6,7-b']bisbenzofuran (abbreviation: 3,10FrA2Nbf(IV)-02). In particular, pyrenediamine compounds such as 1,6FLPAPrn, 1,6mMemFLPAPrn, and 1,6BnfAPrn-03 can be used, for example.

<<Light-Emitting Substance that Converts Triplet Excitation Energy into Light>>

Examples of the light-emitting substance that converts triplet excitation energy into light and can be used in the light-emitting layer 113 include substances that emit phosphorescent light (phosphorescent substances) and thermally activated delayed fluorescent (TADF) materials that exhibit thermally activated delayed fluorescence.

A phosphorescent substance is a compound that exhibits phosphorescent light but does not exhibit fluorescent light at a temperature higher than or equal to a low temperature (e.g., 77 K) and lower than or equal to room temperature (i.e., higher than or equal to 77 K and lower than or equal to 313 K). The phosphorescent substance preferably contains a metal element with large spin-orbit interaction, and can be an organometallic complex, a metal complex (platinum complex), or a rare earth metal complex, for example. Specifically, the phosphorescent substance preferably contains a transition metal element. It is particularly preferable that the phosphorescent substance contain a platinum group element (ruthenium (Ru), rhodium (Rh), palladium (Pd), osmium (Os), iridium (Ir), or platinum (Pt)), especially iridium, in which case the probability of direct transition between the singlet ground state and the triplet excited state can be increased.

<<Phosphorescent Substance (from 450 nm to 570 nm, Blue or Green)>>

As examples of a phosphorescent substance which emits blue or green light and whose emission spectrum has a peak wavelength of greater than or equal to 450 nm and less than or equal to 570 nm, the following substances can be given.

Examples include organometallic complexes having a 4H-triazole ring, such as tris {2-[5-(2-methylphenyl)-4-(2,6-dimethylphenyl)-4H-1,2,4-triazol-3-yl-κ$N^2$]phenyl-κC}iridium(III) (abbreviation: $[Ir(mpptz-dmp)_3]$), tris(5-methyl-3,4-diphenyl-4H-1,2,4-triazolato)iridium(III) (abbreviation: $[Ir(Mptz)_3]$), tris[4-(3-biphenyl)-5-isopropyl-3-phenyl-4H-1,2,4-triazolato]iridium(III) (abbreviation: $[Ir(Mptz-3b)_3]$), and tris[3-(5-biphenyl)-5 isopropyl-4-phenyl-4H-1,2,4-triazolato]iridium(III) (abbreviation: $[Ir(iPr5btz)_3]$); organometallic complexes having a 1H-triazole ring, such as tris[3-methyl-1-(2-methylphenyl)-5-phenyl-1H-1,2,4-triazolato]iridium(III) (abbreviation: $[Ir(Mptz1-mp)_3]$) and tris(1-methyl-5-phenyl-3-propyl-1H-1,2,4-triazolato) iridium(III) (abbreviation: $[Ir(Prptzl-Me)_3]$); organometallic complexes having an imidazole ring, such as fac-tris[1-(2,6-diisopropylphenyl)-2-phenyl-1H-imidazole]iridium(III) (abbreviation: $[Ir(iPrpmi)_3]$) and tris[3-(2,6-dimethylphenyl)-7-methylimidazo[1,2-f]phenanthridinato]iridium(III) (abbreviation: $[Ir(dmpimpt-Me)_3]$); and organometallic complexes in which a phenylpyridine derivative having an electron-withdrawing group is a ligand, such as bis[2-(4',6'-difluorophenyl)pyridinato-N,$C^2$]iridium(III) tetrakis(1-pyrazolyl)borate (abbreviation: FIr6), bis[2-(4',6'-difluorophenyl)pyridinato-N,$C^2$]iridium(111) picolinate (abbreviation: FIrpic), bis{2-[3',5'-bis(trifluoromethyl)phenyl]pyridinato-N, $C^2$}iridium(III) picolinate (abbreviation: $[Ir(CF_3ppy)_2(pic)]$), and bis[2-(4',6'-difluorophenyl)pyridinato-N,$C^2$]iridium(III) acetylacetonate (abbreviation: FIr(acac)).

<<Phosphorescent Substance (from 495 nm to 590 nm, Green or Yellow)>>

As examples of a phosphorescent substance which emits green or yellow light and whose emission spectrum has a peak wavelength of greater than or equal to 495 nm and less than or equal to 590 nm, the following substances can be given.

Examples include organometallic iridium complexes having a pyrimidine ring, such as tris(4-methyl-6-phenylpyrimidinato)iridium(III) (abbreviation: $[Ir(mppm)_3]$), tris(4-t-butyl-6-phenylpyrimidinato)iridium(III) (abbreviation: $[Ir(tBuppm)_3]$), (acetylacetonato)bis(6-methyl-4-phenylpyrimidinato)iridium(III) (abbreviation: $[Ir(mppm)_2(acac)]$), (acetylacetonato)bis(6-tert-butyl-4-phenylpyrimidinato)iridium(III) (abbreviation: $[Ir(tBuppm)_2(acac)]$), (acetylacetonato)bis[6-(2-norbornyl)-4-phenylpyrimidinato]iridium(III) (abbreviation: $[Ir(nbppm)_2(acac)]$), (acetylacetonato)bis[5-methyl-6-(2-methylphenyl)-4-phenylpyrimidinato]iridium(III) (abbreviation: $[Ir(mpmppm)_2(acac)]$), (acetylacetonato)bis{4,6-dimethyl-2-[6-(2,6-dimethylphenyl)-4-pyrimidinyl-κ$N^3$]phenyl-κC}iridium(III) (abbreviation: $[Ir(dmppm-dmp)_2(acac)]$), and (acetylacetonato)bis(4,6-diphenylpyrimidinato)iridium(III) (abbreviation: $[Ir(dppm)_2(acac)]$); organometallic iridium complexes having a pyrazine ring, such as (acetylacetonato)bis(3,5-dimethyl-2-phenylpyrazinato)iridium(III) (abbreviation: $[Ir(mppr-Me)_2(acac)]$) and (acetylacetonato)bis(5 sopropyl-3-methyl-2-phenylpyrazinato)iridium(III) (abbreviation: $[Ir(mppr-iPr)_2(acac)]$); organometallic iridium complexes having a pyridine ring, such as tris(2-phenylpyridinato-N,$C^{2'}$)iridium(III) (abbreviation: $[Ir(ppy)_3]$), bis(2-phenylpyridinato-N,$C^{2'}$)iridium(III) acetyl acetonate (abbreviation: $[Ir(ppy)_2(acac)]$), bis(benzo[h]quinolinato)iridium(III) acetyl acetonate (abbreviation: $[Ir(bzq)_2(acac)]$), tris(benzo[h]quinolinato)iridium(III) (abbreviation: $[Ir(bzq)_3]$), tris(2-phenylquinolinato-N,$C^{2'}$)iridium(III) (abbreviation: $[Ir(pq)_3]$), bis(2-phenylquinolinato-N,$C^{2'}$) iridium(III) acetylacetonate (abbreviation: $[Ir(pq)_2(acac)]$), bis[2-(2-pyridinyl-κN)phenyl-κC][2-(4-phenyl-2-pyridinyl-κN)phenyl-κC]iridium(III) (abbreviation: $[Ir(ppy)_2(4dppy)]$), bis[2-(2-pyridinyl-κN)phenyl-κC][2-(4-methyl- 5-phenyl-2-pyridinyl-κN)phenyl-κC], [2-$d_3$-methyl-8-(2-pyridinyl-κN)benzofuro[2,3-b]pyridine-κC]bis[2-(5-$d_3$-methyl-2-pyridinyl-κ$N^2$)phenyl-κC]iridium(III) (abbreviation: Ir(5mppy-$d_3$)$_2$(mbfpypy-$d_3$)), [2-(methyl-$d_3$)-8-[4-(1-methylethyl-1-d)-2-pyridinyl-κN]benzofuro[2,3-b]pyridin-7-yl-κC]bis[5-(methyl-$d_3$)-2-[5-(methyl-$d_3$)-2-pyridinyl-κN]phenyl-κC]iridium(III) (abbreviation: Ir(5mtpy-$d_6$)$_2$(mbfpypy-iPr-$d_4$)), [2-$d_3$-methyl-(2-pyridinyl-κN)benzofuro[2,3-b]pyridine-κC]bis[2-(2-pyridinyl-κN)phenyl-κC]iridium(III) (abbreviation: Ir(ppy)$_2$(mbfpypy-$d_3$)), and [2-(4-methyl-5-phenyl-2-pyridinyl-κN)phenyl-κC]bis[2-(2-pyridinyl-κN)phenyl-κC]iridium(III) (abbreviation: Ir(ppy)$_2$(mdppy)); organometallic complexes such as bis(2,4-diphenyl-1,3-oxazolato-N,$C^{2'}$)iridium(III) acetyl acetonate (abbreviation: [Ir(dpo)$_2$(acac)]), bis {2-[4'-(perfluorophenyl)phenyl]pyridinato-N,$C^{2'}$}iridium(III) acetylacetonate (abbreviation: [Ir(p-PF-ph)$_2$(acac)]), and bis (2-phenylbenzothiazolato-N,$C^{2'}$)iridium(III) acetylacetonate (abbreviation: [Ir(bt)$_2$(acac)]); and a rare earth metal complex such as tris(acetylacetonato) (monophenanthroline)terbium(III) (abbreviation: [Tb(acac)$_3$(Phen)]).

<<Phosphorescent Substance (from 570 nm to 750 nm, Yellow or Red)>>

As examples of a phosphorescent substance which emits yellow or red light and whose emission spectrum has a peak wavelength of greater than or equal to 570 nm and less than or equal to 750 nm, the following substances can be given.

Examples include organometallic complexes having a pyrimidine ring, such as (diisobutyrylmethanato)bis[4,6-bis (3-methylphenyl)pyrimidinato]iridium(III) (abbreviation: [Ir(5mdppm)$_2$(dibm)]), bis[4,6-bis(3-methylphenyl)pyrimidinato](dipivaloylmethanato)iridium(III) (abbreviation: [Ir (5mdppm)$_2$(dpm)]), and (dipivaloylmethanato)bis[4,6-di (naphthalen-1-yl)pyrimidinato]iridium(III) (abbreviation: [Ir(d1npm)$_2$(dpm)]); organometallic complexes having a pyrazine ring, such as (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium (III) (abbreviation: [Ir(tppr)$_2$(dpm)]), bis {4,6-dimethyl-2-[3-(3,5-dimethylphenyl)-5-phenyl-2-pyrazinyl-κN]phenyl-κC}(2,6-dimethyl-3,5-heptanedionato-κ$^2$O,O')iridium(III) (abbreviation: [Ir(dmdppr-P)$_2$(dibm)]), bis{4,6-dimethyl-2-[5-(4-cyano-2,6-dimethylphenyl)-3-(3,5-dimethylphenyl)-2-pyrazinyl-κN]phenyl-κC}(2,2,6,6-tetramethyl-3,5-heptanedionato-κ$^2$O,O')iridium(III) (abbreviation: [Ir(dmdppr-dmCP)$_2$(dpm)]), bis[2-(5-(2,6-dimethylphenyl)-3-(3,5-dimethylphenyl)-2-pyrazinyl-κN)-4,6-dimethylphenyl-κC] (2,2',6,6'-tetramethyl-3,5-heptanedionato-κ$^2$O,O')iridium (III) (abbreviation: [Ir(dmdppr-dmp)$_2$(dpm)]), (acetylacetonato)bis[2-methyl-3-phenylquinoxalinato-N, $C^2$]iridium(III) (abbreviation: [Ir(mpq)$_2$(acac)]), (acetylacetonato)bis(2,3-diphenylquinoxalinato-N, $C^{2'}$)iridium(III) (abbreviation: [Ir(dpq)$_2$(acac)]), and (acetylacetonato)bis[2,3-bis(4-fluorophenyl)quinoxalinato]iridium(III) (abbreviation: [Ir(Fdpq)$_2$(acac)]); organometallic complexes having a pyridine ring, such as tris(1-phenylisoquinolinato-N,$C^{2'}$) iridium(III) (abbreviation: [Ir(piq)$_3$]), bis(1-phenylisoquinolinato-N,$C^{2'}$)iridium(III) acetylacetonate (abbreviation: [Ir (piq)$_2$(acac)]), and bis[4,6-dimethyl-2-(2-quinolinyl-κN) phenyl-κC](2,4-pentanedionato-κ$^2$O,O')iridium(III) (abbreviation: [Ir(dmpqn)$_2$(acac)]); a platinum complex such as 2,3,7,8,12,13,17,18-octaethyl-21H,23H-porphyrin platinum(II) (abbreviation: [PtOEP]); and rare earth metal complexes such as tris(1,3-diphenyl-1,3-propanedionato) (monophenanthroline)europium(III) (abbreviation: [Eu (DBM)$_3$(Phen)]) and tris[1-(2-thenoyl)-3,3,3-trifluoroacetonato](monophenanthroline)europium(III) (abbreviation: [Eu (TTA)$_3$(Phen)]).

<<TADF Material>>

Any of materials described below can be used as the TADF material. The TADF material is a material that has a small difference between its S1 and T1 levels (preferably less than or equal to 0.2 eV), enables up-conversion of a triplet excited state into a singlet excited state (i.e., reverse intersystem crossing) using a little thermal energy, and efficiently exhibits light (fluorescent light) from the singlet excited state. The thermally activated delayed fluorescence is efficiently obtained under the condition where the difference in energy between the triplet excited energy level and the singlet excited energy level is greater than or equal to 0 eV and less than or equal to 0.2 eV, preferably greater than or equal to 0 eV and less than or equal to 0.1 eV. Note that delayed fluorescence by the TADF material refers to light emission having a spectrum similar to that of normal fluorescence and an extremely long lifetime. The lifetime is longer than or equal to $1\times10^{-6}$ seconds, preferably longer than or equal to $1\times10^{-3}$ seconds.

Examples of the TADF material include fullerene, a fullerene derivative, an acridine derivative such as proflavine, and eosin. Other examples include a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (abbreviation: $SnF_2$(Proto IX)), a mesoporphyrin-tin fluoride complex (abbreviation: $SnF_2$(Meso IX)), a hematoporphyrin-tin fluoride complex (abbreviation: $SnF_2$(Hemato IX)), a coproporphyrin tetramethyl ester-tin fluoride complex (abbreviation: $SnF_2$(Copro III-4Me)), an octaethylporphyrin-tin fluoride complex (abbreviation: $SnF_2$(OEP)), an etioporphyrin-tin fluoride complex (abbreviation: $SnF_2$(Etio I)), and an octaethylporphyrin-platinum chloride complex (abbreviation: $PtCl_2OEP$).

[Chemical Formula 1]

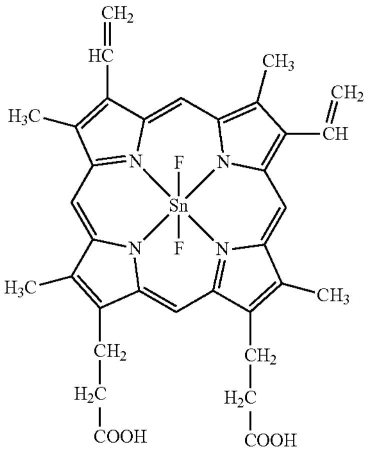

$SnF_2$(Proto IX)

-continued

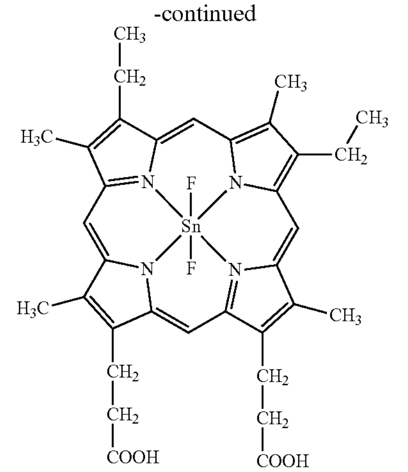

SnF2(Meso IX)

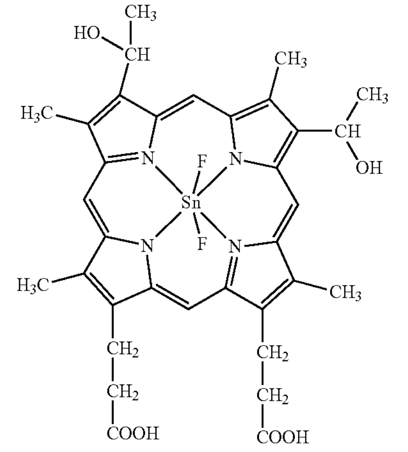

SnF2(Hemato IX)

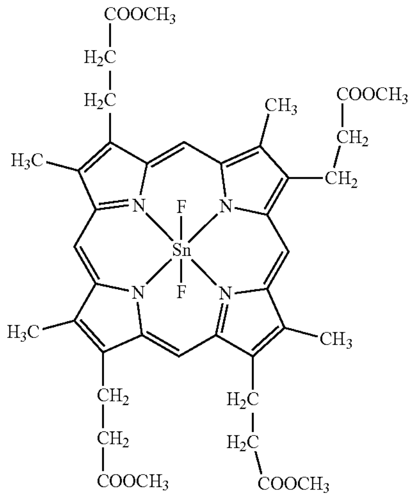

SnF2(Copro III-4Me)

-continued

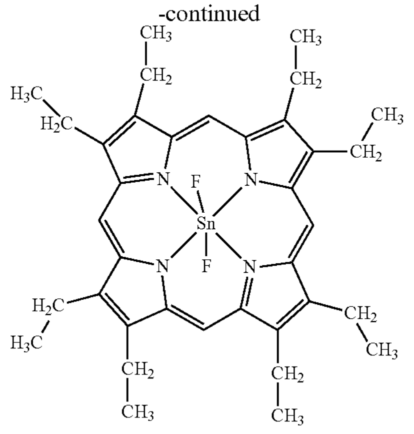

SnF2(OEP)

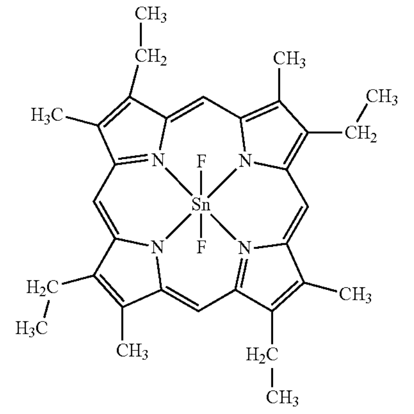

SnF2(Etio I)

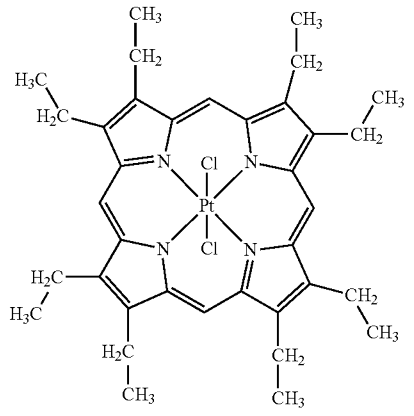

PtCl2OEP

Alternatively, a heteroaromatic compound having a π-electron rich heteroaromatic compound and a π-electron deficient heteroaromatic compound, such as 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(1 OH-phenoxazin-10-yl)phenyl]-4,6-diphenyl-1,3,5-triazine (abbreviation: PXZ-TRZ), 3-[4-(5-phenyl-5,10-dihydrophenazin-10-yl) phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H,10'H-spiro[acridin-9,9'-anthracen]-

10'-one (abbreviation: ACRSA), 4-(9'-phenyl-3,3'-bi-9H-carbazol-9-yl)benzofuro[3,2-d]pyrimidine (abbreviation: 4PCCzBfpm), 4-[4-(9'-phenyl-3,3'-bi-9H-carbazol-9-yl)phenyl]benzofuro[3,2-d]pyrimidine (abbreviation: 4PCCzPBfpm), or 9-[3-(4,6-diphenyl-1,3,5-triazin-2-yl)phenyl]-9'-phenyl-2,3'-bi-9H-carbazole (abbreviation: mPCCzPTzn-02) may be used.

Note that a substance in which a π-electron rich heteroaromatic compound is directly bonded to a π-electron deficient heteroaromatic compound is particularly preferable because both the donor property of the π-electron rich heteroaromatic compound and the acceptor property of the π-electron deficient heteroaromatic compound are improved and the energy difference between the singlet excited state and the triplet excited state becomes small. As the TADF material, a TADF material in which the singlet and triplet excited states are in thermal equilibrium (TADF100) may be used. Since such a TADF material enables a short emission lifetime (excitation lifetime), an efficiency decrease of a light-emitting element in a high-luminance region can be inhibited.

[Chemical Formula 2]

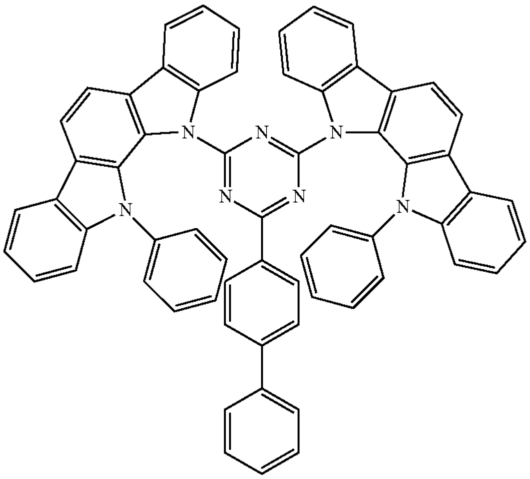

PIC-TRZ

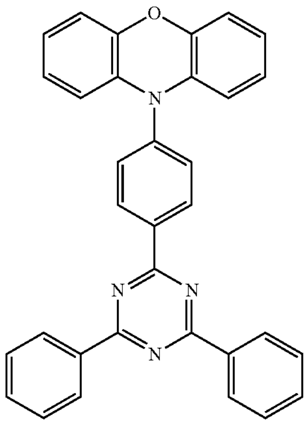

PXZ-TRZ

-continued

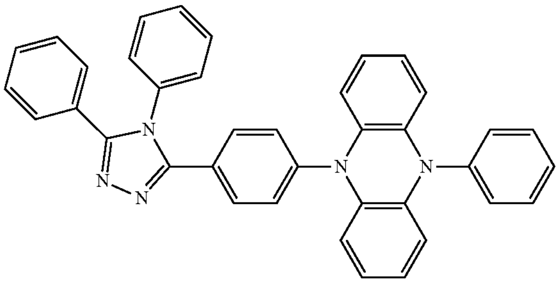

PPZ-3TPT

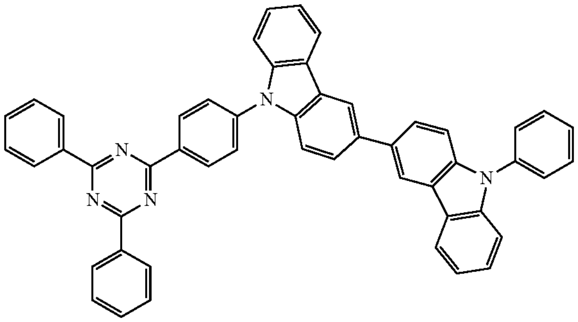

PCCzPTzn

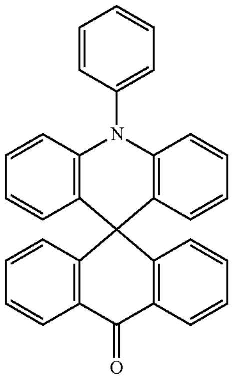

ACRSA

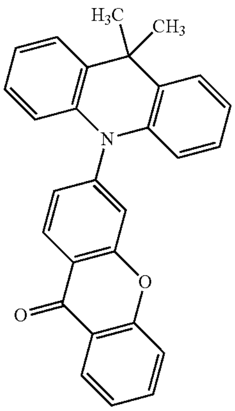

ACRXTN

-continued

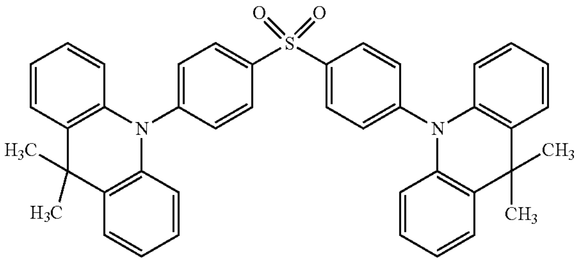

DMAC-DPS

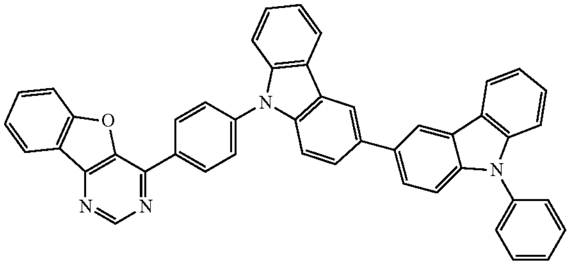

4PCCzPBfpm

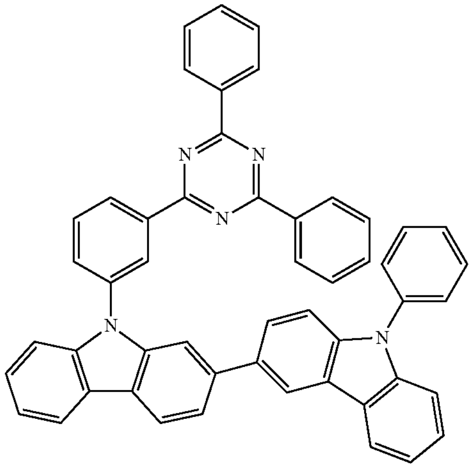

mPCCzPTzn-02

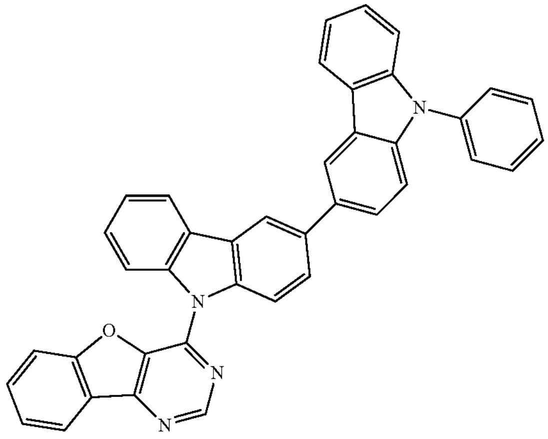

4PCCzBfpm

-continued

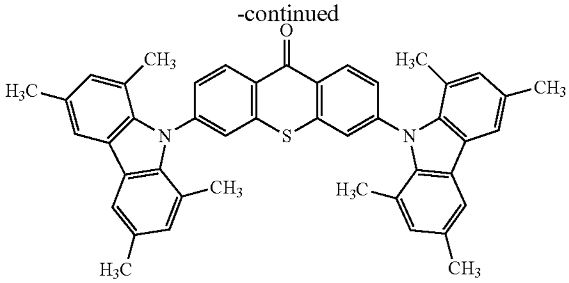

TADF100

In addition to the above, another example of a material having a function of converting triplet excitation energy into light is a nano-structure of a transition metal compound having a perovskite structure. In particular, a nano-structure of a metal halide perovskite material is preferable. The nano-structure is preferably a nanoparticle or a nanorod.

As the organic compound (e.g., the host material) used in combination with the above-described light-emitting substance (guest material) in the light-emitting layers (113, 113*a*, 113*b*, and 113*c*), one or more kinds selected from substances having a larger energy gap than the light-emitting substance (guest material) are used.

<<Host Material for Fluorescence>>

In the case where the light-emitting substance used in the light-emitting layers (113, 113*a*, 113*b*, and 113*c*) is a fluorescent substance, an organic compound (a host material) used in combination with the fluorescent substance is preferably an organic compound that has a high energy level in a singlet excited state and has a low energy level in a triplet excited state, or an organic compound having a high fluorescence quantum yield. Therefore, the hole-transport material (described above) and the electron-transport material (described below) described in this embodiment, for example, can be used as long as they are organic compounds that satisfy such a condition.

In terms of a preferred combination with the light-emitting substance (fluorescent substance), examples of the organic compound (host material), some of which overlap the above specific examples, include fused polycyclic aromatic compounds such as an anthracene derivative, a tetracene derivative, a phenanthrene derivative, a pyrene derivative, a chrysene derivative, and a dibenzo[g,p]chrysene derivative.

Specific examples of the organic compound (host material) that is preferably used in combination with the fluorescent substance include 9-phenyl-3-[4-(10-phenyl-9-anthryl)phenyl]-9H-carbazole (abbreviation: PCzPA), 3,6-diphenyl-9-[4-(10-phenyl-9-anthryl)phenyl]-9H-carbazole (abbreviation: DPCzPA), 3-[4-(1-naphthyl)-phenyl]-9-phenyl-9H-carbazole (abbreviation: PCPN), 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N, 9-diphenyl-9H-carbazol-3-amine (abbreviation: 2PCAPA), 6,12-dimethoxy-5,11-diphenylchrysene, N,N,N',N',N",N",N"', N"'-octaphenyldibenzo[g,p]chrysene-2,7,10,15-tetraamine (abbreviation: DBC1), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-

(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9-(1-naphthyl)-10-(2-naphthyl)anthracene (abbreviation: α,βADN), 2-(10-phenylanthracen-9-yl)dibenzofuran, 2-(10-phenyl-9-anthracenyl)-benzo[b]naphtho[2,3-d]furan (abbreviation: Bnf(II)PhA), 9-(1-naphthyl)-10-[4-(2-naphthyl)phenyl]anthracene (abbreviation: αN-βNPAnth), 9-(2-naphthyl)-10-[3-(2-naphthyl)phenyl]anthracene (abbreviation: βN-mβNPAnth), 1-[4-(10-[1,1'-biphenyl]-4-yl-9-anthracenyl)phenyl]-2-ethyl-1H-benzimidazole (abbreviation: EtBImPBPhA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), 5,12-diphenyltetracene, and 5,12-bis(biphenyl-2-yl)tetracene.

<<Host Material for Phosphorescence>>

In the case where the light-emitting substance used in the light-emitting layers (113, **113*a*, 113*b*, and 113*c***) is a phosphorescent substance, an organic compound having triplet excitation energy (an energy difference between a ground state and a triplet excited state) which is higher than that of the light-emitting substance is preferably selected as the organic compound (host material) used in combination with the phosphorescent substance. Note that when a plurality of organic compounds (e.g., a first host material and a second host material (or an assist material)) are used in combination with a light-emitting substance so that an exciplex is formed, the plurality of organic compounds are preferably mixed with the phosphorescent substance.

With such a structure, light emission can be efficiently obtained by exciplex-triplet energy transfer (ExTET), which is energy transfer from an exciplex to a light-emitting substance. Note that a combination of the plurality of organic compounds that easily forms an exciplex is preferably employed, and it is particularly preferable to combine a compound that easily accepts holes (hole-transport material) and a compound that easily accepts electrons (electron-transport material).

In terms of a preferred combination with the light-emitting substance (phosphorescent substance), examples of the organic compounds (the host material and the assist material), some of which overlap the above specific examples, include an aromatic amine (an organic compound having an aromatic amine skeleton), a carbazole derivative (an organic compound having a carbazole ring), a dibenzothiophene derivative (an organic compound having a dibenzothiophene ring), a dibenzofuran derivative (an organic compound having a dibenzofuran ring), an oxadiazole derivative (an organic compound having an oxadiazole ring), a triazole derivative (an organic compound having a triazole ring), a benzimidazole derivative (an organic compound having a benzimidazole ring), a quinoxaline derivative (an organic compound having a quinoxaline ring), a dibenzoquinoxaline derivative (an organic compound having a dibenzoquinoxaline ring), a pyrimidine derivative (an organic compound having a pyrimidine ring), a triazine derivative (an organic compound having a triazine ring), a pyridine derivative (an organic compound having a pyridine ring), a bipyridine derivative (an organic compound having a bipyridine ring), a phenanthroline derivative (an organic compound having a phenanthroline ring), a furodiazine derivative (an organic compound having a furodiazine ring), and zinc- and aluminum-based metal complexes.

Among the above organic compounds, specific examples of the aromatic amine and the carbazole derivative, which are organic compounds having a high hole-transport property, are the same as the specific examples of the hole-transport materials described above, and those materials are preferable as the host material.

Among the above organic compounds, specific examples of the dibenzothiophene derivative and the dibenzofuran derivative, which are organic compounds having a high hole-transport property, include 4-{3-[3-(9-phenyl-9H-fluoren-9-yl)phenyl]phenyl}dibenzofuran (abbreviation: mmDBFFLBi-II), 4,4',4"-(benzene-1,3,5-triyl)tri(dibenzofuran) (abbreviation: DBF3P-II), DBT3P-II, 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylen-2-yl)phenyl]dibenzothiophene (abbreviation: mDBTPTp-II). Such derivatives are preferable as the host material.

Other examples of preferred host materials include metal complexes having an oxazole-based or thiazole-based ligand, such as bis[2-(2-benzoxazolyl)phenolato]zinc(II) (abbreviation: ZnPBO) and bis[2-(2-benzothiazolyl)phenolato]zinc(II) (abbreviation: ZnBTZ).

Among the above organic compounds, specific examples of the oxadiazole derivative, the triazole derivative, the benzimidazole derivative, the quinoxaline derivative, the dibenzoquinoxaline derivative, the quinazoline derivative, and the phenanthroline derivative, which are organic compounds having a high electron-transport property, include an organic compound including a heteroaromatic ring having a polyazole ring, such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), or 4,4'-bis(5-methylbenzoxazol-2-yl)stilbene (abbreviation: BzOs), an organic compound including a heteroaromatic ring having a pyridine ring, such as bathophenanthroline (abbreviation: BPhen), bathocuproine (abbreviation: BCP), 2,9-di(naphthalen-2-yl)-4,7-diphenyl-1,10-phenanthroline (abbreviation: NBPhen), or 2,2-(1,3-phenylene)bis[9-phenyl-1,10-phenanthroline](abbreviation: mPPhen2P), 2-[3-(dibenzothiophen-4-yl)phenyl]dibenzo[f,h]quinoxaline (abbreviation: 2mDBTPDBq-II), 2-[3-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDB q), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDB q-II), 2-{4-[9,10-di(2-naphthyl)-2-anthryl]phenyl}-1-phenyl-1H-benzimidazole (abbreviation: ZADN), and 2-[4'-(9-phenyl-9H-carbazol-3-yl)-3,1'-biphenyl-1-yl]dibenzo[f,h]quinoxaline (abbreviation: 2mpPCBPDBq). Such organic compounds are preferable as the host material.

Among the above organic compounds, specific examples of the pyridine derivative, the diazine derivative (including the pyrimidine derivative, the pyrazine derivative, and the pyridazine derivative), the triazine derivative, and the furodiazine derivative, which are organic compounds having a high electron-transport property, include organic compounds including a heteroaromatic ring having a diazine ring, such as 4,6-bis[3-(phenanthren-9-yl)phenyl]pyrimidine (abbreviation: 4,6mPnP2Pm), 4,6-bis[3-(4-dibenzothienyl)phenyl] pyrimidine (abbreviation: 4,6mDBTP2Pm-II), 4,6-bis[3-(9H-carbazol-9-yl)phenyl]pyrimidine (abbreviation: 4,6mCzP2Pm), 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl) phenyl]-9'-phenyl-2,3-bi-9H-carbazole (abbreviation: mPCCzPTzn-02), 3,5-bis[3-(9H-carbazol-9-yl)phenyl]pyridine (abbreviation: 35DCzPPy), 1,3,5-tri[3-(3-pyridyl)phenyl]benzene (abbreviation: TmPyPB), 9,9'-[pyrimidine-4,6-diylbis(biphenyl-3,3'-diyl)]bis(9H-carbazole) (abbreviation: 4,6mCzBP2Pm), 2-[3-(9,9-dimethyl-9H-fluoren-2-yl)-1,1'-biphenyl-3-yl]-4,6-diphenyl-1,3,5-triazine (abbreviation: mFBPTzn), 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm), 9-[3-(dibenzothiophen-4-yl)biphenyl-3-yl]naphtho[1',2':4,5]furo[2,3-b]pyrazine (abbreviation: 9mDBtBPNfpr), 9-[(3'-dibenzothiophen-4-yl)biphenyl-4-yl]naphtho[1',2':4,5]furo[2,3-b]pyrazine (abbreviation: 9pmDBtBPNfpr), 5-[3-(4,6-diphenyl-1,3,5-triazin-2-yl) phenyl]-7,7-dimethyl-5H,7H-indeno[2,1-b]carbazole (abbreviation: mlNc(II)PTzn), 2-[3'-(triphenylen-2-yl)-1,1'-biphenyl-3-yl]-4,6-diphenyl-1,3,5-triazine (abbreviation: mTpBPTzn), 2-[(1,1'-biphenyl)-4-yl]-4-phenyl-6-[9,9'-spirobi(9H-fluoren)-2-yl]-1,3,5-triazine (abbreviation: BP-SFTzn), 2,6-bis(4-naphthalen-1-ylphenyl)-4-[4-(3-pyridyl)phenyl]pyrimidine (abbreviation: 2,4NP-6PyPPm), 9-[4-(4,6-diphenyl-1,3,5-triazin-2-yl)-2-dibenzothi ° phenyl]-2-phenyl-9H-carbazol e (abbreviation: PCDBfTzn), 2-[1,1'-biphenyl]-3-yl-4-phenyl-6-(8-[1:4',1"-terphenyl]-4-yl-1-dibenzofuranyl)-1,3,5-triazine (abbreviation: mBP-TPDBfTzn), 6-(1,1'-biphenyl-3-yl)-4-[3,5-bis(9H-carbazol-9-yl)phenyl)-2-phenylpyrimidine (abbreviation: 6mBP-4Cz2PPm), and 4-[3,5-bis(9H-carbazol-9-yl)phenyl]-2-phenyl-6-(1,1'-biphenyl-4-yl)pyrimidine (abbreviation: 6BP-4Cz2PPm). Such organic compounds are preferable as the host material.

Among the above organic compounds, specific examples of metal complexes that are organic compounds having a high electron-transport property include zinc- and aluminum-based metal complexes, such as tris(8-quinolinolato) aluminum(III) (abbreviation: Alq), tris(4-methyl-8-quinolinolato)aluminum(III) (abbreviation: $Almq_3$), bis(10-hydroxybenzo[h]quinolinato)beryllium(II) (abbreviation: $BeBq_2$), bis(2-methyl-8-quinolinolato)(4-phenylphenolato) aluminum(III) (abbreviation: BAlq), and bis(8-quinolinolato)zinc(II) (abbreviation: Znq), and metal complexes having a quinoline ring or a benzoquinoline ring. Such metal complexes are preferable as the host material.

Moreover, high molecular compounds such as poly(2,5-pyridinediyl) (abbreviation: PPy), poly[(9,9-dihexylfluorene-2,7-diyl)-co-(pyridine-3,5-diyl)](abbreviation: PF-Py), and poly[(9,9-dioctylfluorene-2,7-diyl)-co-(2,2'-bipyridine-6,6'-diyl)](abbreviation: PF-BPy) are preferable as the host material.

Examples of organic compounds having bipolar properties, a high hole-transport property and a high electron-transport property, which can be used as the host material, include organic compounds having a diazine ring, such as 9-phenyl-9'-(4-phenyl-2-quinazolinyl)-3,3'-bi-9H-carbazole (abbreviation: PCCzQz), 2-[4'-(9-phenyl-9H-carbazol-3-yl)-3,1'-biphenyl-1-yl]dibenzo[f,h]quinoxaline (abbreviation: 2mpPCBPDBq), 5-[3-(4,6-diphenyl-1,3,5-triazin-2-yl) phenyl]-7,7-dimethyl-5H,7H-indeno[2,1-b]carbazole (abbreviation: mlNc(II)PTzn), 11-(4-[1,1'-biphenyl]-4-yl-6-phenyl-1,3,5-triazin-2-yl)-11,12-dihydro-12-phenyl-indolo [2,3-a]carbazole (abbreviation: BP-Icz(II)Tzn), and 7-[4-(9-phenyl-9H-carbazol-2-yl)quinazolin-2-yl]-7H-dibenzo[c,g] carbazole (abbreviation: PC-cgDBCzQz).

<Electron-Transport Layer>

The electron-transport layers (114, 114*a*, and 114*b*) transport the electrons, which are injected from the second electrode 102 or the charge-generation layers (106, 106*a*, and 106*b*) by electron-injection layers (115, 115*a*, and 115*b*) described later, to the light-emitting layers (113, 113*a*, 113*b*, and 113*c*). It is preferable that the electron-transport material used in the electron-transport layers (114, 114*a*, and 114*b*) be a substance having an electron mobility higher than or equal to $1\times10^{-6}$ $cm^2/Vs$ in the case where the square root of the electric field strength [V/cm] is 600. Note that any other substance can also be used as long as the substance has an electron-transport property higher than a hole-transport property. The electron-transport layers (114, 114*a*, and 114*b*) can function even with a single-layer structure and may have a stacked-layer structure including two or more layers. A photolithography process performed over the electron-transport layer including the above-described mixed material, which has heat resistance, can inhibit an adverse effect of the thermal process on the device characteristics.

<<Electron-Transport Material>>

As the electron-transport material that can be used for the electron-transport layers (114, 114*a*, and 114*b*), an organic compound having a high electron-transport property can be used, and for example, a heteroaromatic compound can be used. The heteroaromatic compound refers to a cyclic compound including at least two different kinds of elements in a ring. Examples of cyclic structures include a three-membered ring, a four-membered ring, a five-membered ring, and a six-membered ring, among which a five-membered ring and a six-membered ring are particularly preferred. The elements included in the heteroaromatic compound are preferably one or more of nitrogen, oxygen, and sulfur, in addition to carbon. In particular, a heteroaromatic compound containing nitrogen (a nitrogen-containing heteroaromatic compound) is preferred, and any of materials having a high electron-transport property (electron-transport materials), such as a nitrogen-containing heteroaromatic compound and a π-electron deficient heteroaromatic compound including the nitrogen-containing heteroaromatic compound, is preferably used.

The heteroaromatic compound is an organic compound including at least one heteroaromatic ring.

The heteroaromatic ring includes any one of a pyridine ring, a diazine ring, a triazine ring, a polyazole ring, an oxazole ring, a thiazole ring, and the like. A heteroaromatic ring having a diazine ring includes a heteroaromatic ring having a pyrimidine ring, a pyrazine ring, a pyridazine ring, or the like. A heteroaromatic ring having a polyazole ring includes a heteroaromatic ring having an imidazole ring, a triazole ring, or an oxadiazole ring.

The heteroaromatic ring includes a fused heteroaromatic ring having a fused ring structure. Examples of the fused heteroaromatic ring include a quinoline ring, a benzoquinoline ring, a quinoxaline ring, a dibenzoquinoxaline ring, a quinazoline ring, a benzoquinazoline ring, a dibenzoquinazoline ring, a phenanthroline ring, a furodiazine ring, and a benzimidazole ring.

Examples of the heteroaromatic compound having a five-membered ring structure, which is a heteroaromatic compound including carbon and one or more of nitrogen, oxygen, sulfur, and the like, include a heteroaromatic compound having an imidazole ring, a heteroaromatic compound having a triazole ring, a heteroaromatic compound having an oxazole ring, a heteroaromatic compound having an oxadiazole ring, a heteroaromatic compound having a thiazole ring, and a heteroaromatic compound having a benzimidazole ring.

Examples of the heteroaromatic compound having a six-membered ring structure, which is a heteroaromatic compound including carbon and one or more of nitrogen, oxygen, sulfur, and the like, include a heteroaromatic compound having a heteroaromatic ring, such as a pyridine ring, a diazine ring (including a pyrimidine ring, a pyrazine ring, a pyridazine ring, or the like), a triazine ring, or a polyazole ring. Other examples include a heteroaromatic compound having a bipyridine structure and a heteroaromatic compound having a terpyridine structure, although they are included in examples of a heteroaromatic compound in which pyridine rings are connected.

Examples of the heteroaromatic compound having a fused ring structure including the above six-membered ring structure as a part include a heteroaromatic compound having a fused heteroaromatic ring such as a quinoline ring, a benzoquinoline ring, a quinoxaline ring, a dibenzoquinoxaline ring, a phenanthroline ring, a furodiazine ring (including a structure in which an aromatic ring is fused to a furan ring of a furodiazine ring), or a benzimidazole ring.

Specific examples of the above-described heteroaromatic compound having a five-membered ring structure (a polyazole ring (including an imidazole ring, a triazole ring, or an oxadiazole ring), an oxazole ring, a thiazole ring, or a benzimidazole ring) include 2-(4-biphenylyl)-5-(4-tert-butylphenyl)-1,3,4-oxadiazole (abbreviation: PBD), 1,3-bis [5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 3-(4-tert-butylphenyl)-4-(4-ethylphenyl)-5-(4-biphenylyl)-1,2,4-triazole (abbreviation: p-Et-TAZ), 2,2',2"-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), and 4,4'-bis(5-methylbenzoxazol-2-yl)stilbene (abbreviation: BzOs).

Specific examples of the above-described heteroaromatic compound having a six-membered ring structure (including a heteroaromatic ring having a pyridine ring, a diazine ring, a triazine ring, or the like) include a heteroaromatic compound including a heteroaromatic ring having a pyridine ring, such as 3,5-bis[3-(9H-carbazol-9-yl)phenyl]pyridine (abbreviation: 35DCzPPy) or 1,3,5-tri[3-(3-pyridyl)phenyl]benzene (abbreviation: TmPyPB), a heteroaromatic compound including a heteroaromatic ring having a triazine ring, such as 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl)phenyl]-9'-phenyl-2,3'-bi-9H-carbazole (abbreviation: mPCCzPTzn-02), 5-[3-(4,6-diphenyl-1,3,5-triazin-2-yl)phenyl]-7,7-dimethyl-5H,7H-indeno[2,1-b]carbazole (abbreviation: mINc (II)PTzn), 2-[3'-(triphenylen-2-yl)-1,1'-biphenyl-3-yl]-4,6-diphenyl-1,3,5-triazine (abbreviation: mTpBPTzn), 2-[(1,1'- biphenyl)-4-yl]-4-phenyl-6-[9,9'-spirobi(9H-fluoren)-2-yl]-1,3,5-triazine (abbreviation: BP-SFTzn), 2,6-bis(4-naphthalen-1-ylphenyl)-4-[4-(3-pyridyl)phenyl]pyrimidine (abbreviation: 2,4NP-6PyPPm), 9-[4-(4,6-diphenyl-1,3,5-triazin-2-yl)-2-dibenzothiophenyl]-2-phenyl-9H-carbazole (abbreviation: PCDBfTzn), 2-[1,1'-biphenyl]-3-yl-4-phenyl-6-(8-[1,1',4',1"-terphenyl]-4-yl-1-dibenzofuranyl)-1,3, 5-triazin e (abbreviation: mBP-TPDBfTzn), 2-{3-[3-(dibenzothiophen-4-yl)phenyl]phenyl}-4,6-diphenyl-1,3,5-triazine (abbreviation: mDBtBPTzn), or mFBPTzn, and a heteroaromatic compound including a heteroaromatic ring having a diazine (pyrimidine) ring, such as 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), 4,6mCzBP2Pm, 6-(1,1'-biphenyl-3-yl)-4-[3,5-bis(9H-carbazol-9-yl)phenyl)-2-phenylpyrimidine (abbreviation: 6mBP-4Cz2PPm), 4-[3,5-bis(9H-carbazol-9-yl)phenyl]-2-phenyl-6(1, 1'-biphenyl-4-yl)pyrimidine (abbreviation: 6BP-4Cz2PPm), 4-[3-(dibenzothiophen-4-yl)phenyl]-8-(naphthalen-2-yl)-[1]benzofuro[3,2-d]pyrimidine (abbreviation: 8(3N-4mDBtPBfpm), 8BP-4mDBtPBfpm, 9mDBtBPNfpr, 9pmDBtBPNfpr, 3,8-bis[3-(dibenzothiophen-4-yl)phenyl]benzofuro[2,3-b]pyrazine (abbreviation: 3,8mDBtP2Bfpr), 4,8-bis[3-(dibenzothiophen-4-yl)phenyl]-[1]benzofuro[3,2-d]pyrimidine (abbreviation: 4,8mDBtP2Bfpm), 8-[3-(dibenzothiophen-4-yl)(1,1'-biphenyl-3-yl)]naphtho[1',2':4,5]furo[3,2-d]pyrimidine (abbreviation: 8mDBtBPNfpm), or 8-[(2,2'-binaphthalen)-6-yl]-4-[3-(dibenzothiophen-4-yl)phenyl]-[1]benzofuro[3,2-d] pyrimidine (abbreviation: 8(βN2)-4mDBtPBfpm). Note that the above aromatic compounds including a heteroaromatic ring include a heteroaromatic compound having a fused heteroaromatic ring.

Other examples include a heteroaromatic compound including a heteroaromatic ring having a diazine (pyrimidine) ring, such as 2,2'-(pyridine-2,6-diyl)bis(4-phenylbenzo[h]quinazoline) (abbreviation: 2,6(P-Bqn)2Py), 2,2'-(2,2'-bipyridine-6,6'-diyl)bis(4-phenylbenzo[h]quinazoline) (abbreviation: 6,6'(P-Bqn)2BPy), 2,2'-(pyridine-2,6-diyl)bis{4-[4-(2-naphthyl)phenyl]-6-phenylpyrimidine}(abbreviation: 2,6(NP-PPm)2Py), or 6-(1,1'-biphenyl-3-yl)-4-[3,5-bis(9H-carbazol-9-yl)phenyl]-2-phenylpyrimidine (abbreviation: 6mBP-4Cz2PPm), and a heteroaromatic compound including a heteroaromatic ring having a triazine ring, such as 2,4,6-tris(3'-(pyridin-3-yl)biphenyl-3-yl)-1,3,5-triazine (abbreviation: TmPPPyTz), 2,4,6-tris(2-pyridyl)-1,3,5-triazine (abbreviation: 2Py3Tz), or 2-[3-(2,6-dimethyl-3-pyridyl)-5-(9-phenanthryl)phenyl]-4,6-diphenyl-1,3,5-triazine (abbreviation: mPn-mDMePyPTzn).

Specific examples of the above-described heteroaromatic compound having a fused ring structure including the above six-membered ring structure as a part (a heteroaromatic compound having a fused ring structure) include a heteroaromatic compound having a quinoxaline ring, such as bathophenanthroline (abbreviation: BPhen), bathocuproine (abbreviation: BCP), 2,9-di(naphthalen-2-yl)-4,7-diphenyl-1,10-phenanthroline (abbreviation: NBPhen), 2,2-(1,3-phenylene)bis[9-phenyl-1,10-phenanthroline](abbreviation: mPPhen2P), 2,2'-(pyridine-2,6-diyl)bis(4-phenylbenzo[h]quinazoline) (abbreviation: 2,6(P-Bqn)2Py), 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-

(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), or 2mpPCBPDBq.

For the electron-transport layers (114, 114*a*, and 114*b*), any of the metal complexes given below as well as the heteroaromatic compounds described above can be used. Examples of the metal complexes include a metal complex having a quinoline ring or a benzoquinoline ring, such as tris(8-quinolinolato)aluminum(III) (abbreviation: $Alq_3$), $Almq_3$, 8-quinolinolatolithium(I) (abbreviation: Liq), $BeBq_2$, bis(2-methyl-8-quinolinolato) (4-phenylphenolato) aluminum(III) (abbreviation: BAlq), or bis(8-quinolinolato) zinc(II) (abbreviation: Znq), and a metal complex having an oxazole ring or a thiazole ring, such as bis[2-(2-benzoxazolyl)phenolato]zinc(II) (abbreviation: ZnPBO) or bis[2-(2-benzothiazolyl)phenolato]zinc(II) (abbreviation: ZnBTZ).

High-molecular compounds such as poly(2,5-pyridinediyl) (abbreviation: PPy), poly[(9,9-dihexylfluorene-2,7-diyl)-co-(pyridine-3,5-diyl)](abbreviation: PF-Py), and poly[(9,9-dioctylfluorene-2,7-diyl)-co-(2,2'-bipyridine-6,6'-diyl)](abbreviation: PF-BPy) can be used as the electron-transport material.

Each of the electron-transport layers (114, 114*a*, and 114*b*) is not limited to a single layer and may be a stack of two or more layers each containing any of the above substances.

<Electron-Injection Layer>

The electron-injection layers (115, 115*a*, and 115*b*) contain a substance having a high electron-injection property. Any of the alkali metal compounds and any of the reducing agents described in Embodiment 1 can be used in the electron-injection layers (115, 115*a*, and 115*b*).

The electron-injection layers (115, 115*a*, and 115*b*) are layers for increasing the efficiency of electron injection from the second electrode 102 and are preferably formed using a material whose value of the LUMO level has a small difference (0.5 eV or less) from the work function of a material used for the second electrode 102. Thus, the electron-injection layer 115 can be formed using an alkali metal, an alkaline earth metal, or a compound thereof, such as lithium, cesium, lithium fluoride (LiF), cesium fluoride (CsF), calcium fluoride ($CaF_2$), 8-quinolinolato-lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), an oxide of lithium ($LiO_x$), or cesium carbonate. A rare earth metal and a compound thereof such as erbium fluoride ($ErF_3$) and ytterbium (Yb) can also be used. To form the electron-injection layers (115, 115*a*, and 115*b*), a plurality of kinds of materials given above may be mixed or stacked. Electride may also be used for the electron-injection layers (115, 115*a*, and 115*b*). Examples of the electride include a substance in which electrons are added at high concentration to calcium oxide-aluminum oxide. Any of the substances used for the electron-transport layers (114, 114*a*, and 114*b*), which are given above, can also be used.

A mixed material in which an organic compound and an electron donor (donor) are mixed may also be used for the electron-injection layers (115, 115*a*, and 115*b*). Such a mixed material is excellent in an electron-injection property and an electron-transport property because electrons are generated in the organic compound by the electron donor. The organic compound here is preferably a material excellent in transporting the generated electrons; specifically, for example, the above-described electron-transport materials used for the electron-transport layers (114, 114*a*, and 114*b*), such as a metal complex and a heteroaromatic compound, can be used. As the electron donor, a substance showing an electron-donating property with respect to an organic compound is used. Specifically, an alkali metal, an alkaline earth metal, and a rare earth metal are preferable, and lithium, cesium, magnesium, calcium, erbium, ytterbium, and the like are given. In addition, an alkali metal oxide and an alkaline earth metal oxide are preferable; specifically, lithium oxide, calcium oxide, barium oxide, and the like are given. Alternatively, a Lewis base such as magnesium oxide can be used. Further alternatively, an organic compound such as tetrathiafulvalene (abbreviation: TTF) can be used. Alternatively, a stack of two or more of these materials may be used.

A mixed material in which an organic compound and a metal are mixed may also be used for the electron-injection layers (115, 115*a*, and 115*b*). The organic compound used here preferably has a LUMO level higher than or equal to −3.6 eV and lower than or equal to −2.3 eV. Moreover, a material having an unshared electron pair is preferable.

Thus, as the organic compound used in the above mixed material, a mixed material obtained by mixing a metal and the heteroaromatic compound given above as the material that can be used for the electron-transport layer may be used. Preferred examples of the heteroaromatic compound include materials having an unshared electron pair, such as a heteroaromatic compound having a five-membered ring structure (e.g., an imidazole ring, a triazole ring, an oxazole ring, an oxadiazole ring, a thiazole ring, or a benzimidazole ring), a heteroaromatic compound having a six-membered ring structure (e.g., a pyridine ring, a diazine ring (including a pyrimidine ring, a pyrazine ring, a pyridazine ring, or the like), a triazine ring, a bipyridine ring, or a terpyridine ring), and a heteroaromatic compound having a fused ring structure including a six-membered ring structure as a part (e.g., a quinoline ring, a benzoquinoline ring, a quinoxaline ring, a dibenzoquinoxaline ring, or a phenanthroline ring). Since the materials are specifically described above, description thereof is omitted here.

As a metal used for the above mixed material, a transition metal that belongs to Group 5, Group 7, Group 9, or Group 11 or a material that belongs to Group 13 in the periodic table is preferably used, and examples include Ag, Cu, Al, and In. Here, the organic compound forms a singly occupied molecular orbital (SOMO) with the transition metal.

To amplify light obtained from the light-emitting layer 113*b*, for example, the optical path length between the second electrode 102 and the light-emitting layer 113*b* is preferably less than one fourth of the wavelength λ of light emitted from the light-emitting layer 113*b*. In that case, the optical path length can be adjusted by changing the thickness of the electron-transport layer 114*b* or the electron-injection layer 115*b*.

When the charge-generation layer 106 is provided between the two EL layers (103*a* and 103*b*) as in the light-emitting device in FIG. 2D, a structure in which a plurality of EL layers are stacked between the pair of electrodes (the structure is also referred to as a tandem structure) can be obtained.

<Charge-Generation Layer>

The charge-generation layer 106 has a function of injecting electrons into the EL layer 103*a* and injecting holes into the EL layer 103*b* when voltage is applied between the first electrode (anode) 101 and the second electrode (cathode)

102. The charge-generation layer 106 may be either a p-type layer in which an electron acceptor (acceptor) is added to a hole-transport material or an electron-injection buffer layer in which an electron donor (donor) is added to an electron-transport material. Alternatively, both of these layers may be stacked. Furthermore, an electron-relay layer may be provided between the p-type layer and the electron-injection buffer layer. Note that forming the charge-generation layer 106 with the use of any of the above materials can inhibit an increase in driving voltage caused by the stack of the EL layers.

In the case where the charge-generation layer 106 is a p-type layer in which an electron acceptor is added to a hole-transport material, which is an organic compound, any of the materials described in this embodiment can be used as the hole-transport material. Examples of the electron acceptor include 7,7,8,8-tetracyano-2,3,5,6-tetrafluoroquinodimethane (abbreviation: $F_4$-TCNQ) and chloranil. Other examples include oxides of metals that belong to Group 4 to Group 8 of the periodic table. Specific examples include vanadium oxide, niobium oxide, tantalum oxide, chromium oxide, molybdenum oxide, tungsten oxide, manganese oxide, and rhenium oxide. Any of the above-described acceptor materials may be used. Furthermore, a mixed film obtained by mixing materials of a p-type layer or a stack of films containing the respective materials may be used.

In the case where the charge-generation layer 106 is an electron-injection buffer layer in which an electron donor is added to an electron-transport material, any of the materials described in this embodiment can be used as the electron-transport material. As the electron donor, it is possible to use an alkali metal, an alkaline earth metal, a rare earth metal, a metal belonging to Group 2 or Group 13 of the periodic table, or an oxide or a carbonate thereof. Specifically, lithium (Li), cesium (Cs), magnesium (Mg), calcium (Ca), ytterbium (Yb), indium (In), lithium oxide ($Li_2O$), cesium carbonate, or the like is preferably used. An organic compound such as tetrathianaphthacene may be used as the electron donor.

When an electron-relay layer is provided between a p-type layer and an electron-injection buffer layer in the charge-generation layer 106, the electron-relay layer contains at least a substance having an electron-transport property and has a function of preventing an interaction between the electron-injection buffer layer and the p-type layer and transferring electrons smoothly. The LUMO level of the substance having an electron-transport property in the electron-relay layer is preferably between the LUMO level of the acceptor substance in the p-type layer and the LUMO level of the substance having an electron-transport property in the electron-transport layer in contact with the charge-generation layer 106. Specifically, the LUMO level of the substance having an electron-transport property in the electron-relay layer is preferably higher than or equal to −5.0 eV, further preferably higher than or equal to −5.0 eV and lower than or equal to −3.0 eV. Note that as the substance having an electron-transport property in the electron-relay layer, a phthalocyanine-based material or a metal complex having a metal-oxygen bond and an aromatic ligand is preferably used.

Although FIG. 2D illustrates the structure in which two EL layers 103 are stacked, three or more EL layers may be stacked with charge-generation layers each provided between two adjacent EL layers.

<Substrate>

The light-emitting device described in this embodiment can be formed over a variety of substrates. Note that the type of substrate is not limited to a certain type. Examples of the substrate include semiconductor substrates (e.g., a single crystal substrate and a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film.

Examples of the glass substrate include a barium borosilicate glass substrate, an aluminoborosilicate glass substrate, and a soda lime glass substrate. Examples of the flexible substrate, the attachment film, and the base material film include plastics typified by polyethylene terephthalate (PET), polyethylene naphthalate (PEN), and polyether sulfone (PES), a synthetic resin such as acrylic, polypropylene, polyester, polyvinyl fluoride, polyvinyl chloride, polyamide, polyimide, aramid, an epoxy resin, an inorganic vapor deposition film, and paper.

For fabrication of the light-emitting device in this embodiment, a gas phase method such as an evaporation method or a liquid phase method such as a spin coating method or an ink-jet method can be used. When an evaporation method is used, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, the layers having various functions (the hole-injection layer 111, the hole-transport layer 112, the light-emitting layer 113, the electron-transport layer 114, and the electron-injection layer 115 included in the EL layers of the light-emitting device can be formed by an evaporation method (e.g., a vacuum evaporation method), a coating method (e.g., a dip coating method, a die coating method, a bar coating method, a spin coating method, or a spray coating method), a printing method (e.g., an ink-jet method, screen printing (stencil), offset printing (planography), flexography (relief printing), gravure printing, or micro-contact printing), or the like.

In the case where a film formation method such as the coating method or the printing method is employed, a high molecular compound (e.g., an oligomer, a dendrimer, or a polymer), a middle molecular compound (a compound between a low molecular compound and a high molecular compound with a molecular weight of 400 to 4000), an inorganic compound (e.g., a quantum dot material), or the like can be used. The quantum dot material can be a colloidal quantum dot material, an alloyed quantum dot material, a core-shell quantum dot material, a core quantum dot material, or the like.

Materials that can be used for the layers (the hole-injection layer 111, the hole-transport layer 112, the light-emitting layer 113, the electron-transport layer 114, and the electron-injection layer 115) included in the EL layer 103 of the light-emitting device described in this embodiment are not limited to the materials described in this embodiment, and other materials can be used in combination as long as the functions of the layers are fulfilled.

In this specification and the like, the terms "layer" and "film" can be interchanged with each other as appropriate.

The structures described in this embodiment can be used in combination with any of the structures described in the other embodiments as appropriate.

Embodiment 3

In this embodiment, specific structure examples and manufacturing methods of a light-emitting apparatus (also referred to as a display panel) of one embodiment of the present invention will be described.

<Structure example 1 of light-emitting apparatus 700>

Figure 3A:
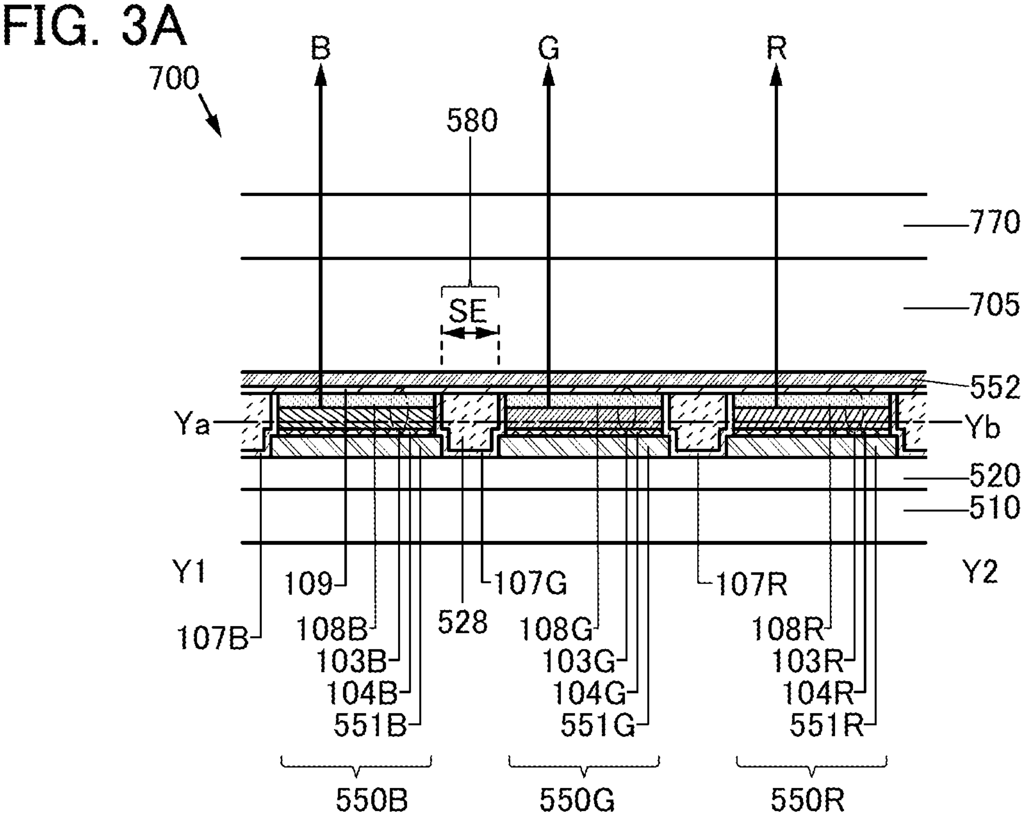
FIGS. 3A to 3C illustrate a light-emitting apparatus of an embodiment.

A light-emitting apparatus 700 illustrated in FIG. 3A includes a light-emitting device 550B, a light-emitting device 550G, a light-emitting device 550R, and a partition 528. The light-emitting device 550B, the light-emitting device 550G, the light-emitting device 550R, and the partition 528 are formed over a functional layer 520 provided over a first substrate 510. The functional layer 520 includes, for example, a driver circuit GD, a driver circuit SD, and the like that are composed of a plurality of transistors, and wirings that electrically connect these circuits. Note that these driver circuits are electrically connected to the light-emitting device 550B, the light-emitting device 550G, and the light-emitting device 550R, for example, to drive them. The light-emitting apparatus 700 includes an insulating layer 705 over the functional layer 520 and the light-emitting devices, and the insulating layer 705 has a function of attaching a second substrate 770 and the functional layer 520.

The light-emitting device 550B, the light-emitting device 550G, and the light-emitting device 550R each have any of the device structures described in Embodiments 1 and 2. That is, the case is described in which the EL layer 103 in the structure illustrated in FIG. 2A differs between the light-emitting devices.

In this specification and the like, a structure in which light-emitting layers in light-emitting devices of different colors (e.g., blue (B), green (G), and red (R)) are separately formed or separately patterned may be referred to as a side-by-side (SBS) structure. Note that in the light-emitting apparatus 700 illustrated in FIG. 3A, the light-emitting device 550B, the light-emitting device 550G, and the light-emitting device 550R are arranged in this order; however, one embodiment of the present invention is not limited thereto. For example, in the light-emitting apparatus 700, the light-emitting device 550R, the light-emitting device 550G, and the light-emitting device 550B may be arranged in this order.

As illustrated in FIG. 3A, the light-emitting device 550B includes an electrode 551B, an electrode 552, and an EL layer 103B. Note that a specific structure of each layer is as described in Embodiments 1 and 2. The EL layer 103B has a stacked-layer structure of layers having different functions including a light-emitting layer. Although FIG. 3A illustrates only a hole-injection/transport layer 104B, an electron-transport layer 108B, and an electron-injection layer 109 as layers of the EL layer 103B, which includes the light-emitting layer, the present invention is not limited thereto. Note that as the hole-injection/transport layer 104B, the layer having the functions of the hole-injection layer and the hole-transport layer described in Embodiment 2 can be used, and the hole-injection/transport layer 104B may have a stacked-layer structure. Note that in this specification, a hole-injection/transport layer in any light-emitting device can be interpreted in the above manner.

The electron-transport layer 108B can have a function of blocking holes moving from the anode side to the cathode side through the light-emitting layer. The electron-injection layer 109 may have a stacked-layer structure in which some or all of layers are formed using different materials.

As illustrated in FIG. 3A, an insulating layer 107B may be formed on side surfaces (or end portions) of the hole-injection/transport layer 104B, the light-emitting layer, and the electron-transport layer 108B, which are included in the EL layer 103B including the light-emitting layer. The insulating layer 107B is formed in contact with side surfaces (or end portions) of the EL layer 103B. Accordingly, entry of oxygen, moisture, or constituent elements thereof through the side surface of the EL layer 103B into the inside of the EL layer 103B can be inhibited. For the insulating layer 107B, aluminum oxide, magnesium oxide, hafnium oxide, gallium oxide, indium gallium zinc oxide, silicon nitride, or silicon nitride oxide can be used, for example. Some of the above-described materials may be stacked to form the insulating layer 107B. The insulating layer 107B can be formed by a sputtering method, a CVD method, an MBE method, a PLD method, an ALD method, or the like and is formed preferably by an ALD method, which achieves favorable coverage. Note that as illustrated in FIG. 3A, in addition to the insulating layer 107B, an insulating layer 107G may be formed on side surfaces (or end portions) of the hole-injection/transport layer 104B, the light-emitting layer, and the electron-transport layer 108B, which are included in the EL layer 103B including the light-emitting layer. The structure of the insulating layer 107G is described later.

The electron-injection layer 109 is formed to cover some layers in the EL layer 103B (including the light-emitting layer, the hole-injection/transport layer 104B, and the electron-transport layer 108B) and the insulating layer 107B. The electron-injection layer 109 may have a stacked-layer structure of two or more layers having different electric resistances.

The electrode 552 is formed over the electron-injection layer 109. Note that the electrode 551B and the electrode 552 have an overlap region. The EL layer 103B is positioned between the electrode 551B and the electrode 552.

The EL layer 103B illustrated in FIG. 3A has a structure similar to that of the EL layer 103 described in Embodiment 2. The EL layer 103B is capable of emitting blue light, for example.

As illustrated in FIG. 3A, the light-emitting device 550G includes an electrode 551G, the electrode 552, and an EL layer 103G. Note that a specific structure of each layer is as described in Embodiments 1 and 2. The EL layer 103G has a stacked-layer structure of layers having different functions including a light-emitting layer. Although FIG. 3A illustrates only a hole-injection/transport layer 104G, an electron-transport layer 108G, and the electron-injection layer 109 as layers of the EL layer 103G, which includes the light-emitting layer, the present invention is not limited thereto. Note that the hole-injection/transport layer 104G represents the layer having the functions of the hole-injection layer and the hole-transport layer described in Embodiment 2 and may have a stacked-layer structure.

The electron-transport layer 108G can have a function of blocking holes moving from the anode side to the cathode side through the light-emitting layer. The electron-injection layer 109 may have a stacked-layer structure in which some or all of layers are formed using different materials.

As illustrated in FIG. 3A, the insulating layer 107G may be formed on side surfaces (or end portions) of the hole-injection/transport layer 104G, the light-emitting layer, and the electron-transport layer 108G, which are included in the EL layer 103G including the light-emitting layer. The insulating layer 107G is formed in contact with side surfaces (or end portions) of the EL layer 103G. Accordingly, entry of oxygen, moisture, or constituent elements thereof through the side surface of the EL layer 103G into the inside of the EL layer 103G can be inhibited. For the insulating layer 107G, a material similar to that of the insulating layer 107B can be used, and aluminum oxide, magnesium oxide, hafnium oxide, gallium oxide, indium gallium zinc oxide, silicon nitride, or silicon nitride oxide can be used, for example. Some of the above-described materials may be stacked to form the insulating layer 107G. The insulating layer 107G can be formed by a sputtering method, a CVD method, an MBE method, a PLD method, an ALD method, or the like and is formed preferably by an ALD method, which achieves favorable coverage. Note that as illustrated in FIG. 3A, in addition to the insulating layer 107G, an insulating layer 107R may be formed on side surfaces (or end portions) of the hole-injection/transport layer 104G, the light-emitting layer, and the electron-transport layer 108G, which are included in the EL layer 103G including the light-emitting layer. The structure of the insulating layer 107R is described later.

The electron-injection layer 109 is formed to cover some layers in the EL layer 103G (including the light-emitting layer, the hole-injection/transport layer 104G, and the electron-transport layer 108G) and the insulating layer 107G. The electron-injection layer 109 may have a stacked-layer structure of two or more layers having different electric resistances.

The electrode 552 is formed over the electron-injection layer 109. Note that the electrode 551G and the electrode 552 have an overlap region. The EL layer 103G is positioned between the electrode 551G and the electrode 552.

The EL layer 103G illustrated in FIG. 3A has a structure similar to that of the EL layer 103 described in Embodiment 2. The EL layer 103G is capable of emitting green light, for example.

As illustrated in FIG. 3A, the light-emitting device 550R includes an electrode 551R, the electrode 552, and an EL layer 103R. Note that a specific structure of each layer is as described in Embodiments 1 and 2. The EL layer 103R has a stacked-layer structure of layers having different functions including a light-emitting layer. Although FIG. 3A illustrates only a hole-injection/transport layer 104R, an electron-transport layer 108R, and the electron-injection layer 109 as layers of the EL layer 103R, which includes the light-emitting layer, the present invention is not limited thereto. Note that as the hole-injection/transport layer 104R, the layer having the functions of the hole-injection layer and the hole-transport layer described in Embodiment 2 can be used, and the hole-injection/transport layer 104R may have a stacked-layer structure.

The electron-transport layer 108R can have a function of blocking holes moving from the anode side to the cathode side through the light-emitting layer. The electron-injection layer 109 may have a stacked-layer structure in which some or all of layers are formed using different materials.

As illustrated in FIG. 3A, the insulating layer 107R may be formed on side surfaces (or end portions) of the hole-injection/transport layer 104R, the light-emitting layer, and the electron-transport layer 108R, which are included in the EL layer 103R including the light-emitting layer. The insulating layer 107R is formed in contact with side surfaces (or end portions) of the EL layer 103R. Accordingly, entry of oxygen, moisture, or constituent elements thereof through the side surface of the EL layer 103R into the inside of the EL layer 103R can be inhibited. For the insulating layer 107R, a material similar to those of the insulating layer 107B and the insulating layer 107G can be used, and aluminum oxide, magnesium oxide, hafnium oxide, gallium oxide, indium gallium zinc oxide, silicon nitride, or silicon nitride oxide can be used, for example. Some of the above-described materials may be stacked to form the insulating layer 107R. The insulating layer 107R can be formed by a sputtering method, a CVD method, an MBE method, a PLD method, an ALD method, or the like and is formed preferably by an ALD method, which achieves favorable coverage.

The electron-injection layer 109 is formed to cover some layers in the EL layer 103R (including the light-emitting layer, the hole-injection/transport layer 104R, and the electron-transport layer 108R) and the insulating layer 107R. The electron-injection layer 109 may have a stacked-layer structure of two or more layers having different electric resistances.

The electrode 552 is formed over the electron-injection layer 109. Note that the electrode 551R and the electrode 552 have an overlap region. The EL layer 103R is positioned between the electrode 551R and the electrode 552.

The EL layer 103R illustrated in FIG. 3A has a structure similar to that of the EL layer 103 described in Embodiment 2. The EL layer 103R is capable of emitting red light, for example.

The partition 528 is provided between the EL layer 103B, the EL layer 103G, and the EL layer 103R. As illustrated in FIG. 3A, the side surfaces (or end portions) of each of the EL layers (the EL layer 103B, the EL layer 103G, and the EL layer 103R) of the light-emitting devices are in contact with the partition 528 with the insulating layers (107B, 107G, 107R) therebetween.

In each of the EL layers, particularly the hole-injection layer, which is included in the hole-transport region between the anode and the light-emitting layer, often has high conductivity; thus, a hole-injection layer formed as a layer shared by adjacent light-emitting devices might cause crosstalk. Thus, providing the partition 528 made of an insulating material between the EL layers as shown in this structure example can suppress occurrence of crosstalk between adjacent light-emitting devices.

In the manufacturing method described in this embodiment, a side surface (or an end portion) of the EL layer is exposed in the middle of the patterning step. This accelerates deterioration of the EL layer due to entry of oxygen, water, or the like through the side surface (or the end portion) of the EL layer. Hence, providing the partition 528 can inhibit the deterioration of the EL layer in the manufacturing process.

Furthermore, the partition 528 can flatten the surface by reducing a depression portion generated between adjacent light-emitting devices. When the depression portion is reduced, disconnection of the electrode 552 formed over the EL layers can be inhibited. Examples of an insulating material used to form the partition 528 include organic materials such as an acrylic resin, a polyimide resin, an epoxy resin, an imide resin, a polyamide resin, a polyimide-amide resin, a silicone resin, a siloxane resin, a benzocyclobutene-based resin, a phenol resin, and precursors of these resins. Other examples include organic materials such as polyvinyl alcohol (PVA), polyvinyl butyral, polyvinyl pyrrolidone, polyethylene glycol, polyglycerin, pullulan, water-soluble cellulose, and an alcohol-soluble polyamide resin. A photosensitive resin such as a photoresist can also be used. Examples of the photosensitive resin include positive-type materials and negative-type materials.

With the use of a photosensitive resin, the partition 528 can be formed only by light exposure and development steps. Alternatively, a negative-type photosensitive resin (e.g., a resist material) may be used to form the partition 528. In the case of using an insulating layer including an organic material as the partition 528, a material that absorbs visible light is suitably used. When a material that absorbs visible light is used as the partition 528, light emitted by the EL layer can be absorbed by the partition 528, whereby light that might leak to an adjacent EL layer (stray light) can be reduced. Accordingly, a display panel having high display quality can be provided.

For example, the difference between the level of the top surface of the partition 528 and the level of the top surface of any of the EL layer 103B, the EL layer 103G, and the EL layer 103R is preferably 0.5 times or less, and further preferably 0.3 times or less the thickness of the partition 528. The partition 528 may be provided such that the level of the top surface of any of the EL layer 103B, the EL layer 103G, and the EL layer 103R is higher than the level of the top surface of the partition 528, for example. The partition 528 may be provided such that the level of the top surface of the partition 528 is higher than the level of the top surface of the light-emitting layer in any of the EL layer 103B, the EL layer 103G, and the EL layer 103R, for example.

When electrical continuity is established between the EL layer 103B, the EL layer 103G, and the EL layer 103R in a light-emitting apparatus (display panel) with a high resolution exceeding 1000 ppi, crosstalk occurs, resulting in a narrower color gamut that the light-emitting apparatus is capable of reproducing. Providing the partition 528 in a high-resolution display panel with more than 1000 ppi, preferably more than 2000 ppi, or further preferably in an ultrahigh-resolution display panel with more than 5000 ppi allows the display panel to express vivid colors.

Figure 3B:
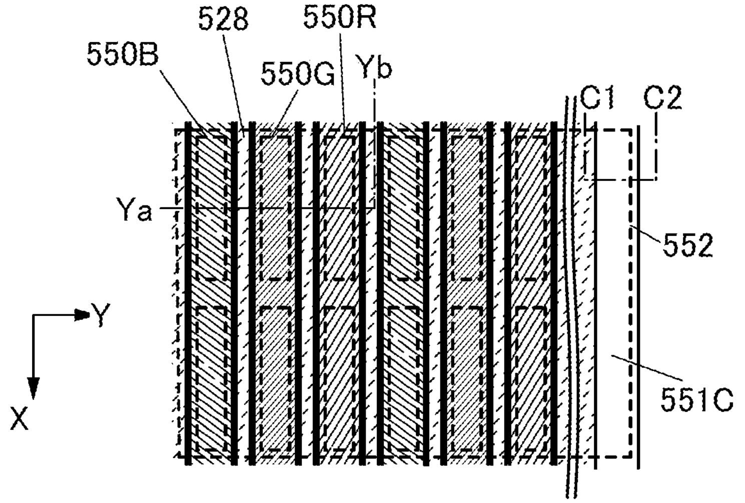

FIG. 3B is a schematic top view of the light-emitting apparatus 700 taken along the dashed-dotted line Ya-Yb in the cross-sectional view of FIG. 3A. Note that FIG. 3B illustrates what is called a stripe arrangement, in which the light-emitting devices of the same color are arranged in the Y direction. In the X direction intersecting with the Y direction, light-emitting devices of the same color are arranged. Specifically, the light-emitting device 550B, the light-emitting device 550G, and the light-emitting device 550R are arranged in a matrix. Note that the arrangement method of the light-emitting devices is not limited thereto; another method such as a delta, zigzag, PenTile, or diamond arrangement may also be used.

The EL layers (103B, 103G, and 103R) are processed to be separated by patterning using a photolithography method; hence, a high-resolution light-emitting apparatus (display panel) can be fabricated. End portions (side surfaces) of the EL layer processed by patterning using a photolithography method have substantially one surface (or are positioned on substantially the same plane). In this case, the width (SE) of a space 580 between the EL layers is preferably 5 μm or less, further preferably 1 μm or less.

In the EL layer, particularly the hole-injection layer, which is included in the hole-transport region between the anode and the light-emitting layer, often has high conductivity; thus, a hole-injection layer formed as a layer shared by adjacent light-emitting devices might cause crosstalk. Thus, processing the EL layers to be separated by patterning using a photolithography method as shown in this structure example can suppress occurrence of crosstalk between adjacent light-emitting devices.

Figure 3C:
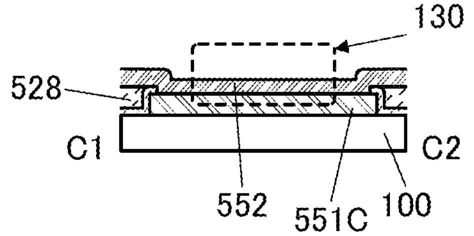

FIG. 3C is a schematic cross-sectional view taken along the dashed-dotted line C1-C2 in FIG. 3B. FIG. 3C illustrates a connection portion 130 where a connection electrode 551C and the electrode 552 are electrically connected to each other. In the connection portion 130, the electrode 552 is provided over and in contact with the connection electrode 551C. The partition 528 is provided to cover an end portion of the connection electrode 551C.

Example 1 of Method for Manufacturing Light-Emitting Apparatus

Figure 4A:
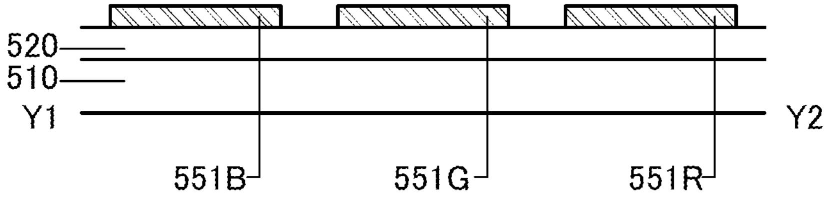
FIGS. 4A to 4C illustrate a method for manufacturing a light-emitting apparatus of an embodiment.

The electrode 551B, the electrode 551G, and the electrode 551R are formed as illustrated in FIG. 4A. For example, a conductive film is formed over the functional layer 520 over the first substrate 510 and processed into predetermined shapes by a photolithography method.

The conductive film can be formed by any of a sputtering method, a chemical vapor deposition (CVD) method, a molecular beam epitaxy (MBE) method, a vacuum evaporation method, a pulsed laser deposition (PLD) method, an atomic layer deposition (ALD) method, and the like. Examples of the CVD method include a plasma-enhanced chemical vapor deposition (PECVD) method and a thermal CVD method. An example of a thermal CVD method is a metal organic CVD (MOCVD) method.

The conductive film may be processed by a nanoimprinting method, a sandblasting method, a lift-off method, or the like as well as a photolithography method described above. Alternatively, island-shaped thin films may be directly formed by a film formation method using a shielding mask such as a metal mask.

There are two typical methods in a photolithography method. In one of the methods, a resist mask is formed over a thin film that is to be processed, the thin film is processed by etching or the like, and then the resist mask is removed. In the other method, a photosensitive thin film is formed and then processed into a desired shape by light exposure and development. The former method involves heat treatment steps such as pre-applied bake (PAB) after resist application and post-exposure bake (PEB) after light exposure. In one embodiment of the present invention, a lithography method is used not only for processing of a conductive film but also for processing of a thin film used for the formation of an EL layer (a film made of an organic compound or a film partly including an organic compound).

As light for exposure in a photolithography method, it is possible to use light with the i-line (wavelength: 365 nm), light with the g-line (wavelength: 436 nm), light with the h-line (wavelength: 405 nm), or light in which the i-line, the g-line, and the K-line are mixed. Alternatively, ultraviolet light, KrF laser light, ArF laser light, or the like can be used. Exposure may be performed by liquid immersion exposure technique. As the light for exposure, extreme ultraviolet (EUV) light or X-rays may also be used. Instead of the light for exposure, an electron beam can be used. It is preferable to use EUV, X-rays, or an electron beam because extremely minute processing can be performed. Note that a photomask is not needed when exposure is performed by scanning with a beam such as an electron beam.

For etching of a thin film using a resist mask, a dry etching method, a wet etching method, a sandblasting method, or the like can be used.

Figure 4B:
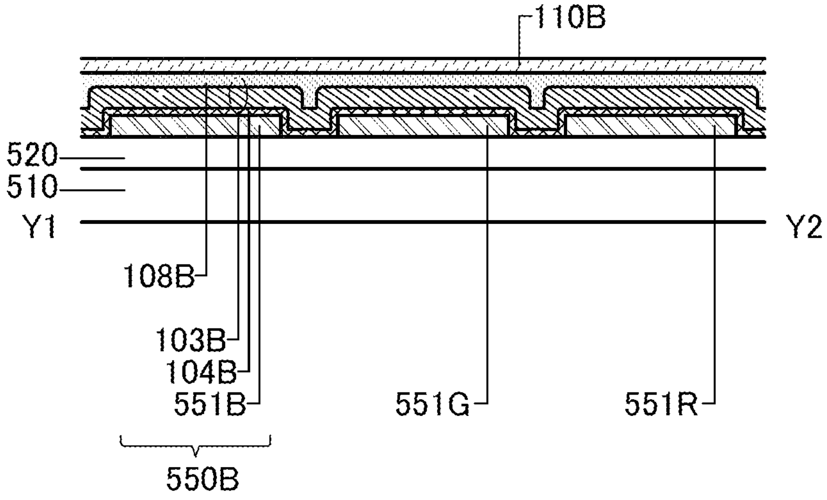

Then, as illustrated in FIG. 4B, the EL layer 103B is formed over the electrode 551B, the electrode 551G, and the electrode 551R. Note that in the EL layer 103B in FIG. 4B, the hole-injection/transport layer 104B, the light-emitting layer, and the electron-transport layer 108B are formed. For example, the EL layer 103B is formed by a vacuum evaporation method over the electrode 551B, the electrode 551G, and the electrode 551R to cover them. Furthermore, a sacrifice layer 110B is formed over the EL layer 103B.

For the sacrifice layer 110B, a film highly resistant to etching treatment performed on the EL layer 103B, i.e., a film having high etching selectivity with respect to the EL layer 103B, can be used. The sacrifice layer 110B preferably has a stacked-layer structure of a first sacrifice layer and a second sacrifice layer which have different etching selectivities to the EL layer 103B. For the sacrifice layer 110B, it is possible to use a film that can be removed by a wet etching method, which causes less damage to the EL layer 103B. In wet etching, oxalic acid or the like can be used as an etching material. Note that in this specification and the like, a sacrifice layer may be called a mask layer.

For the sacrifice layer 110B, an inorganic film such as a metal film, an alloy film, a metal oxide film, a semiconductor film, or an inorganic insulating film can be used, for example. The sacrifice layer 110B can be formed by any of a variety of film formation methods such as a sputtering method, an evaporation method, a CVD method, and an ALD method.

For the sacrifice layer 110B, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used, for example. It is particularly preferable to use a low-melting-point material such as aluminum or silver.

A metal oxide such as indium gallium zinc oxide (also referred to as In—Ga—Zn oxide or IGZO) can be used for the sacrifice layer 110B. It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Indium tin oxide containing silicon, or the like can also be used.

An element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) can be used instead of gallium. In particular, M is preferably one or more of gallium, aluminum, and yttrium.

For the sacrifice layer 110B, an inorganic insulating material such as aluminum oxide, hafnium oxide, or silicon oxide can be used.

The sacrifice layer 110B is preferably formed using a material that can be dissolved in a solvent which is less likely to chemically influence at least the uppermost film (the electron-transport layer 108B) of the EL layer 103B. Specifically, a material that will be dissolved in water or alcohol can be suitably used for the sacrifice layer 110B. In formation of the sacrifice layer 110B, it is preferable that application of such a material dissolved in a solvent such as water or alcohol be performed by a wet process and followed by heat treatment for evaporating the solvent. At this time, the heat treatment is preferably performed under a reduced-pressure atmosphere, in which case the solvent can be removed at a low temperature in a short time and thermal damage to the EL layer 103B can be accordingly minimized.

In the case where the sacrifice layer 110B having a stacked-layer structure is formed, the stacked-layer structure can include the first sacrifice layer formed using any of the above-described materials and the second sacrifice layer thereover.

The second sacrifice layer in that case is a film used as a hard mask for etching of the first sacrifice layer. In processing the second sacrifice layer, the first sacrifice layer is exposed. Thus, a combination of films having greatly different etching rates is selected for the first sacrifice layer and the second sacrifice layer. Thus, a film that can be used for the second sacrifice layer can be selected in accordance with the etching conditions of the first sacrifice layer and those of the second sacrifice layer.

For example, in the case where the second sacrifice layer is etched by dry etching involving a fluorine-containing gas (also referred to as fluorine-based gas), the second sacrifice layer can be formed using silicon, silicon nitride, silicon oxide, tungsten, titanium, molybdenum, tantalum, tantalum nitride, an alloy containing molybdenum and niobium, an alloy containing molybdenum and tungsten, or the like. Here, a film of a metal oxide such as IGZO or ITO can be given as an example of a film having a high etching selectivity to the second sacrifice layer (i.e., a film with a low etching rate) in the dry etching involving the fluorine-based gas, and can be used for the first sacrifice layer.

Note that the material for the second sacrifice layer is not limited to the above and can be selected from a variety of materials in view of the etching conditions of the first sacrifice layer and those of the second sacrifice layer. For example, any of the films that can be used for the first sacrifice layer can be used for the second sacrifice layer.

For the second sacrifice layer, for example, a nitride film can be used. Specifically, it is possible to use a nitride such as silicon nitride, aluminum nitride, hafnium nitride, titanium nitride, tantalum nitride, tungsten nitride, gallium nitride, or germanium nitride.

Alternatively, an oxide film can be used for the second sacrifice layer. Typically, it is possible to use a film of an oxide or an oxynitride such as silicon oxide, silicon oxynitride, aluminum oxide, aluminum oxynitride, hafnium oxide, or hafnium oxynitride.

Figure 4C:
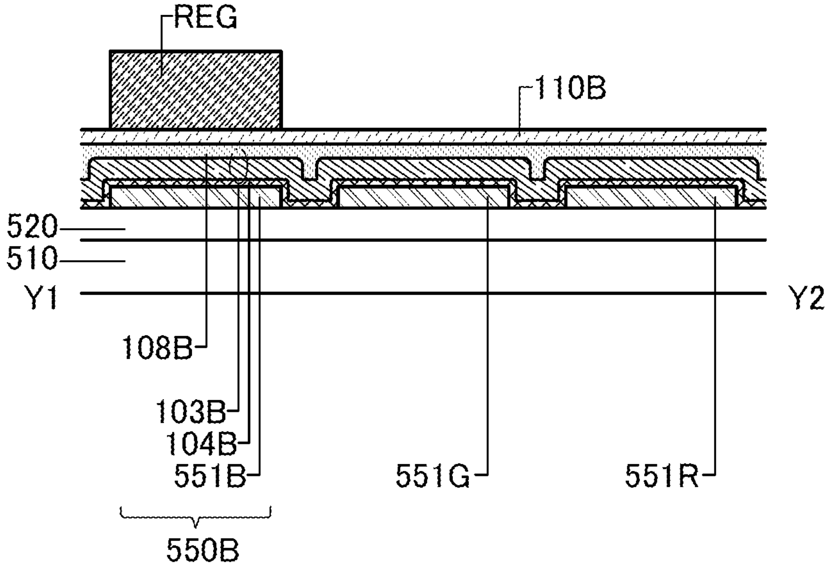

Next, as illustrated in FIG. 4C, a resist is applied onto the sacrifice layer 110B, and the resist having a desired shape (a resist mask REG) is formed by a photolithography method. Such a method involves heat treatment steps such as pre-applied bake (PAB) after the resist application and post-exposure bake (PEB) after light exposure. The temperature reaches approximately 100° C. during the PAB, and approximately 120° C. during the PEB, for example. Therefore, the light-emitting device should be resistant to such high treatment temperatures.

Figure 5A:
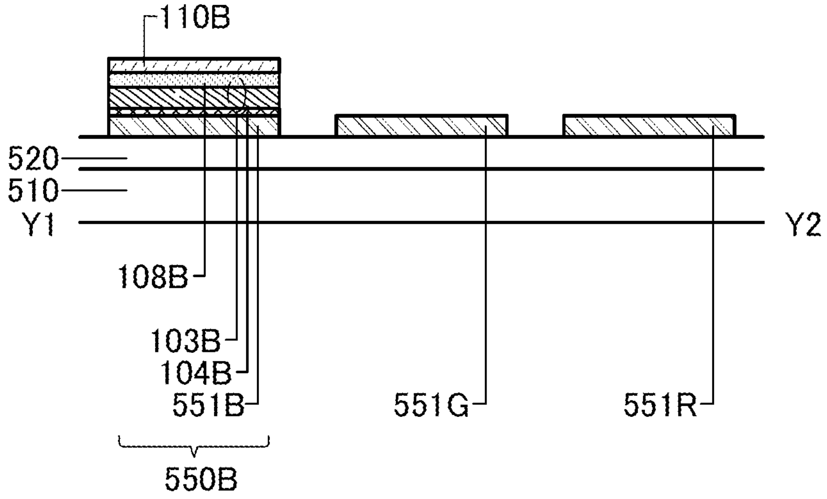
FIGS. 5A to 5C illustrate the method for manufacturing a light-emitting apparatus of an embodiment.

Next, with the use of the obtained resist mask REG, part of the sacrifice layer 110B not covered with the resist mask REG is removed by etching; the resist mask REG is removed; and part of the EL layer 103B not covered with the sacrifice layer 110B is then removed by etching, i.e., the EL layer 103B over the electrode 551G and the EL layer 103B over the electrode 551R are removed by etching, so that the EL layer 103B is processed to have side surfaces (or have their side surfaces exposed) or have a belt-like shape that extends in the direction intersecting the sheet of the diagram. Specifically, dry etching is performed using the sacrifice layer 110B formed in a pattern over the EL layer 103B overlapping with the electrode 551B. Note that in the case where the sacrifice layer 110B has the aforementioned stacked-layer structure of the first sacrifice layer and the second sacrifice layer, the EL layer 103B may be processed into a predetermined shape in the following manner: part of the second sacrifice layer is etched with the use of the resist mask REG, the resist mask REG is then removed, and part of the first sacrifice layer is etched with the use of the second sacrifice layer as a mask. The structure illustrated in FIG. 5A is obtained through these etching steps.

Figure 5B:
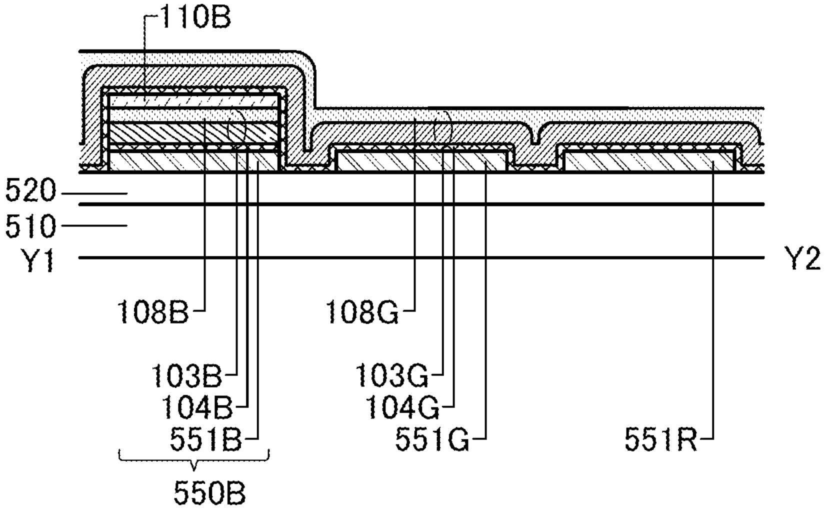

Then, as illustrated in FIG. 5B, the EL layer 103G is formed over the sacrifice layer 110B, the electrode 551G, and the electrode 551R. Note that in the EL layer 103G in FIG. 5B, the hole-injection/transport layer 104G, the light-emitting layer, and the electron-transport layer 108G are formed. For example, the EL layer 103G is formed by a vacuum evaporation method over the sacrifice layer 110B, the electrode 551G, and the electrode 551R to cover them.

Figure 5C:
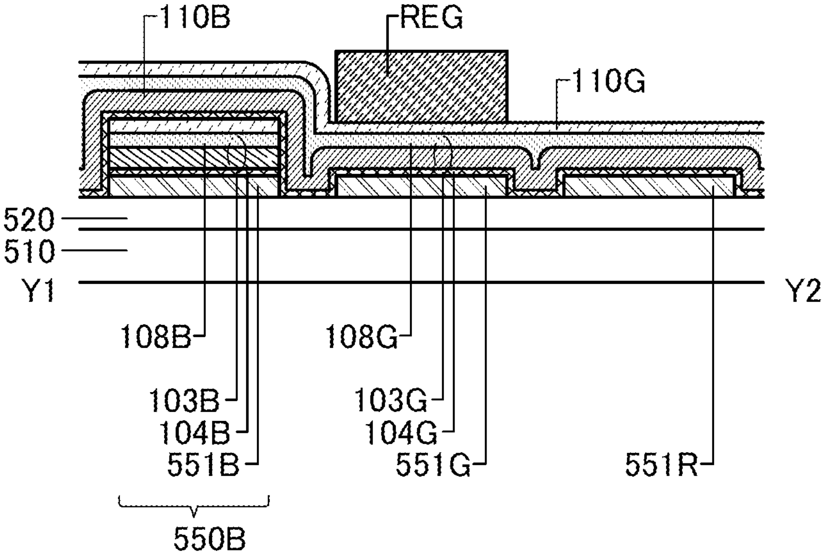
Figure 6A:
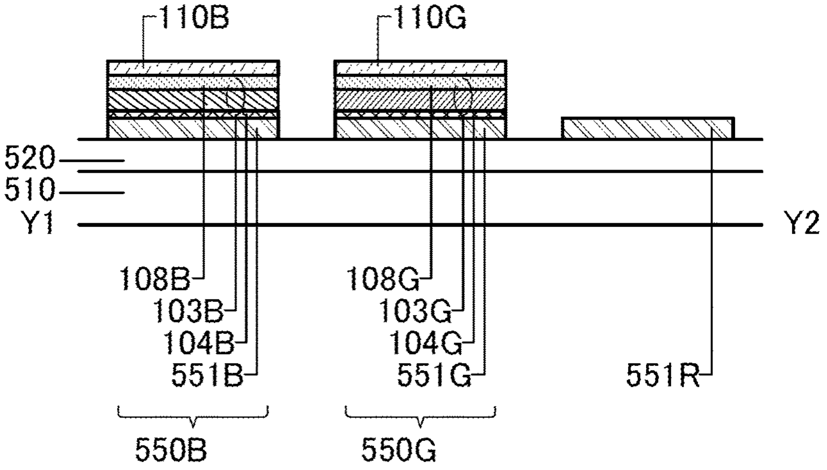
FIGS. 6A to 6C illustrate the method for manufacturing a light-emitting apparatus of an embodiment.

Then, as illustrated in FIG. 5C, a sacrifice layer 110G is formed over the EL layer 103G, a resist is applied onto the sacrifice layer 110G, and the resist having a desired shape (resist mask REG) is formed by a photolithography method. Part of the sacrifice layer 110G not covered with the obtained resist mask is removed by etching, the resist mask is removed, and part of the EL layer 103G not covered with the sacrifice layer 110G is then removed by etching. Thus, the EL layer 103G over the electrode 551B and the EL layer 103G over the electrode 551R are removed by etching, so that the EL layer 103G is processed to have side surfaces (or have their side surfaces exposed) or have a belt-like shape that extends in the direction intersecting the sheet of the diagram as illustrated in FIG. 6A. Note that in the case where the sacrifice layer 110G has the aforementioned stacked-layer structure of the first sacrifice layer and the second sacrifice layer, the EL layer 103G may be processed into a predetermined shape in the following manner: part of the second sacrifice layer is etched with the use of the resist mask, the resist mask is then removed, and part of the first sacrifice layer is etched with the use of the second sacrifice layer as a mask.

Figure 6B:
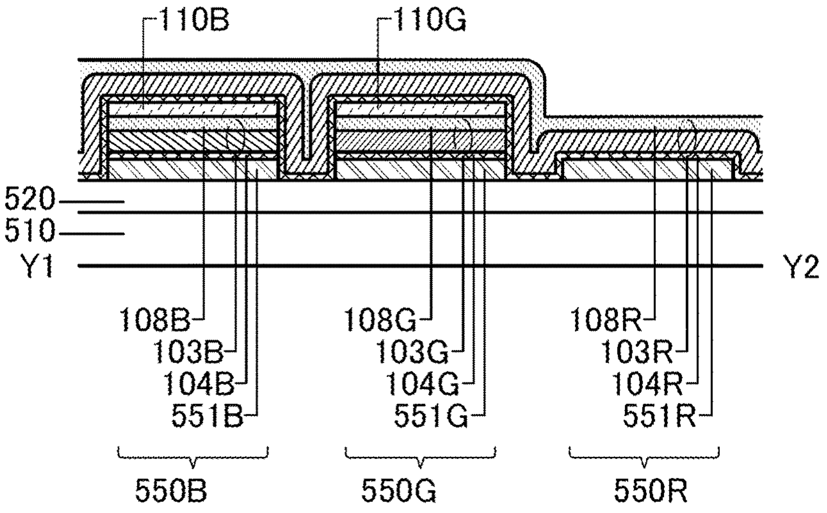

Next, as illustrated in FIG. 6B, the EL layer 103R is formed over the sacrifice layer 110B, the sacrifice layer 110G, and the electrode 551R. Note that in the EL layer 103R in FIG. 6B, the hole-injection/transport layer 104R, the light-emitting layer, and the electron-transport layer 108R are formed. For example, the EL layer 103R is formed by a vacuum evaporation method over the sacrifice layer 110B, the sacrifice layer 110G, and the electrode 551R to cover them.

Figure 6C:
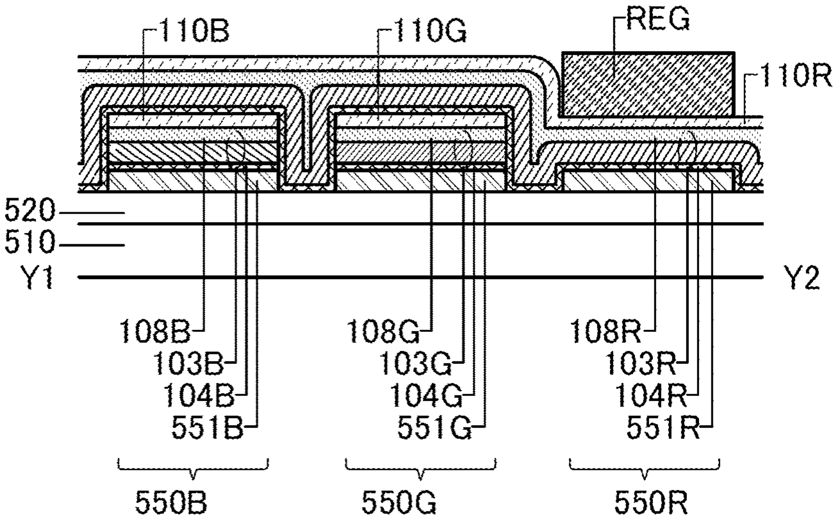
Figure 7A:
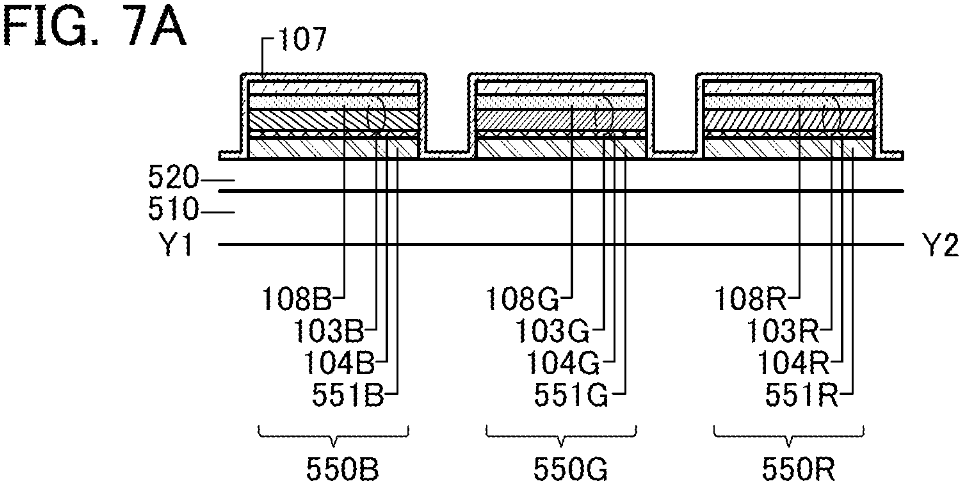
FIGS. 7A to 7C illustrate the method for manufacturing a light-emitting apparatus of an embodiment.

Then, as illustrated in FIG. 6C, a sacrifice layer 110R is formed over the EL layer 103R, a resist is applied onto the sacrifice layer 110R, and the resist having a desired shape (resist mask REG) is formed by a photolithography method. Part of the sacrifice layer 110R not covered with the obtained resist mask is removed by etching, the resist mask is removed, and part of the EL layer 103R not covered with the sacrifice layer 110R is then removed by etching. Thus, the EL layer 103R over the electrode 551B and the EL layer 103R over the electrode 551G are removed by etching, so that the EL layer 103R is processed to have side surfaces (or have their side surfaces exposed) or have a belt-like shape that extends in the direction intersecting the sheet of the diagram. Note that in the case where the sacrifice layer 110R has the aforementioned stacked-layer structure of the first sacrifice layer and the second sacrifice layer, the EL layer 103R may be processed into a predetermined shape in the following manner: part of the second sacrifice layer is etched with the use of the resist mask, the resist mask is then removed, and part of the first sacrifice layer is etched with the use of the second sacrifice layer as a mask. Then, the insulating layer 107 is formed over the sacrifice layers (110B, 110G, and 110R) with the sacrifice layers (110B, 110G, and 110R) remaining over the EL layers (103B, 103G, and 103R), so that the structure illustrated in FIG. 7A is obtained.

Note that the insulating layer 107 can be formed by an ALD method, for example. In this case, the insulating layer 107 is formed in contact with the side surfaces of the EL layers (103B, 103G, and 103R) as illustrated in FIG. 7A. This can inhibit entry of oxygen, moisture, or constituent elements thereof into the inside through the side surfaces of the EL layers (103B, 103G, and 103R). Examples of the material used for the insulating layer 107 include aluminum oxide, magnesium oxide, hafnium oxide, gallium oxide, indium gallium zinc oxide, silicon nitride, and silicon nitride oxide.

Figure 7B:
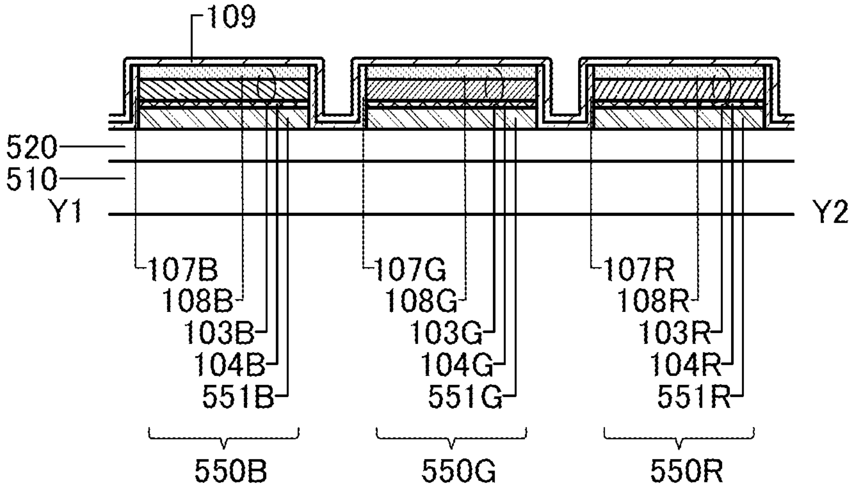

Then, as illustrated in FIG. 7B, the sacrifice layers (110B, 110G, and 110R) are removed, part of the insulating layer 107 is removed to form the insulating layers (107B, 107G, and 107R), and then the electron-injection layer 109 is formed over the EL layers (103B, 103G, and 103R). The electron-injection layer 109 is formed by a vacuum evaporation method, for example. Note that the electron-injection layer 109 is formed over the electron-transport layers (108B, 108G, and 108R). The electron-injection layer 109 is in contact with the side surfaces (or end portions) of the hole-injection/transport layers (104R, 104G, and 104B), the light-emitting layers, and the electron-transport layers (108B, 108G, and 108R) in the EL layers (103B, 103G, and 103R) with the insulating layers (107B, 107G, and 107R) therebetween.

Figure 7C:
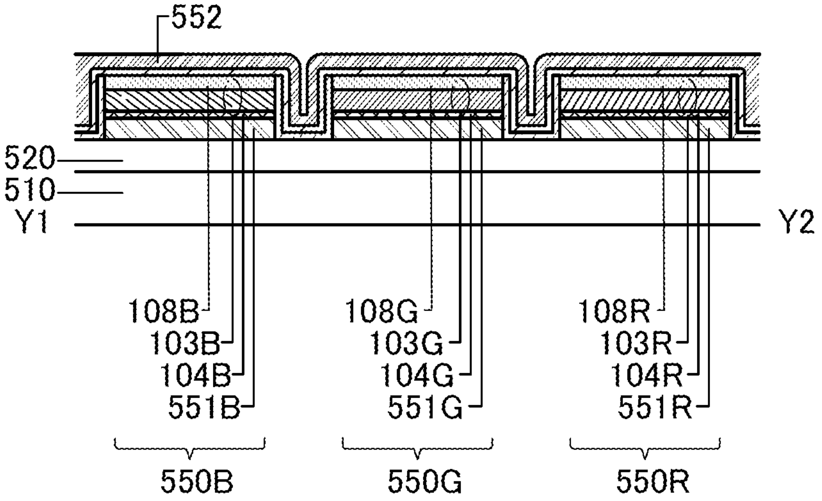

Next, as illustrated in FIG. 7C, the electrode 552 is formed. The electrode 552 is formed by a vacuum evaporation method, for example. The electrode 552 is formed over the electron-injection layer 109. The electrode 552 is in contact with the side surfaces (or end portions) of the EL layers (103B, 103G, and 103R) with the electron-injection layer 109 and the insulating layers (107B, 107G, and 107R) therebetween; note that the EL layers (103B, 103G, and 103R) illustrated in FIG. 7C include the hole-injection/transport layers (104R, 104G, and 104B), the light-emitting layers, and the electron-transport layers (108B, 108G, and 108R). Thus, the EL layers (103B, 103G, and 103R) and the electrode 552, specifically the hole-injection/transport layers (104B, 104G, and 104R) in the EL layers (103B, 103G, and 103R) and the electrode 552 can be prevented from being electrically short-circuited.

Through the above steps, the EL layer 103B, the EL layer 103G, and the EL layer 103R in the light-emitting device 550B, the light-emitting device 550G, and the light-emitting device 550R can be processed to be separated from each other.

The EL layers 103B, 103G, and 103R are processed to be separated by patterning using a photolithography method; hence, a high-resolution light-emitting apparatus (display panel) can be fabricated. End portions (side surfaces) of the EL layer processed by patterning using a photolithography method have substantially one surface (or are positioned on substantially the same plane).

In the EL layer, particularly the hole-injection layer, which is included in the hole-transport region between the anode and the light-emitting layer, often has high conductivity; thus, a hole-injection layer formed as a layer shared by adjacent light-emitting devices might cause crosstalk. Thus, processing the EL layers to be separated by patterning using a photolithography method as shown in this structure example can suppress occurrence of crosstalk between adjacent light-emitting devices.

Structure Example 2 of Light-Emitting Apparatus 700

Figure 8:
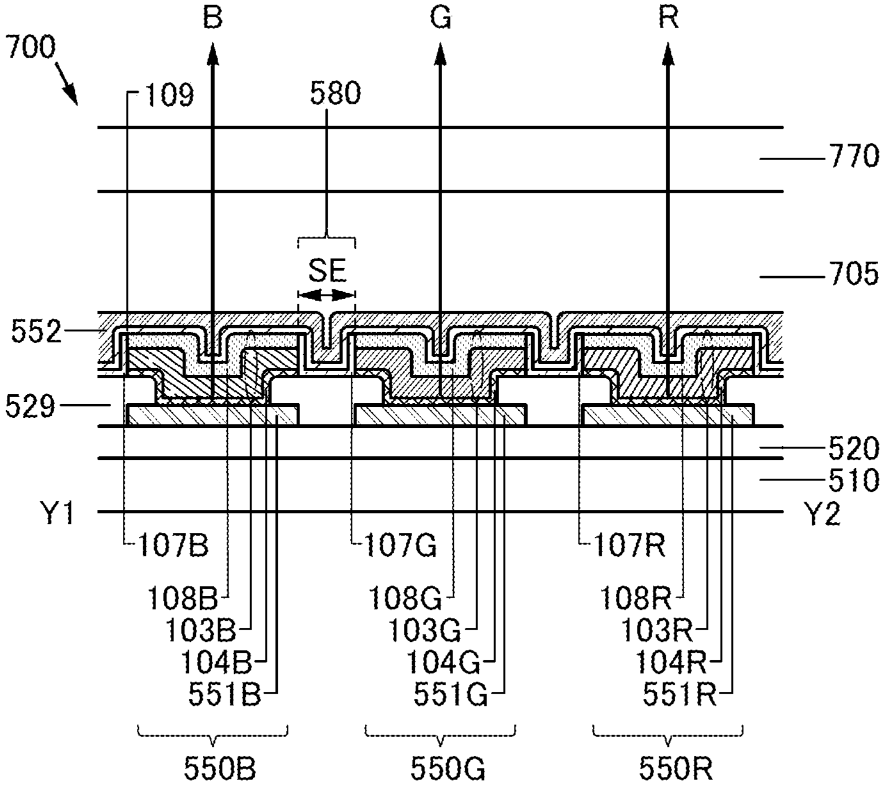
FIG. 8 illustrates a light-emitting apparatus of an embodiment.

The light-emitting apparatus 700 illustrated in FIG. 8 includes the light-emitting device 550B, the light-emitting device 550G, the light-emitting device 550R, and an insulating layer 529. The light-emitting device 550B, the light-emitting device 550G, the light-emitting device 550R, and the insulating layer 529 are formed over the functional layer 520 provided over the first substrate 510. The functional layer 520 includes, for example, the driver circuit GD, the driver circuit SD, and the like that are composed of a plurality of transistors, and wirings that electrically connect these circuits. Note that these driver circuits are electrically connected to the light-emitting device 550B, the light-emitting device 550G, and the light-emitting device 550R, for example, to drive them.

The light-emitting device 550B, the light-emitting device 550G, and the light-emitting device 550R each have any of the device structures described in Embodiments 1 and 2. Specifically, the case is described in which the EL layer 103 in the structure illustrated in FIG. 2A differs between the light-emitting devices.

Note that specific structures of the light-emitting devices illustrated in FIG. 8 are the same as the structures of the light-emitting devices 550B, 550G, and 550R described with reference to FIGS. 3A to 3C.

As illustrated in FIG. 8, the EL layers (103B, 103G, and 103R) of the light-emitting devices (550B, 550G, and 550R) include the hole-injection/transport layers (104B, 104G, and 104R), the electron-transport layers (108B, 108G, and 108R), and the electron-injection layer 109.

The EL layers 103B, 103G, and 103R in this structure are processed to be separated by patterning using a photolithography method; hence, end portions (side surfaces) of the processed EL layers have substantially one surface (or are positioned on substantially the same plane).

The EL layers 103B, 103G, and 103R in the light-emitting devices include the space 580 between the adjacent light-emitting devices. When the space 580 is denoted by a distance SE between the EL layers in the adjacent light-emitting devices, decreasing the distance SE can increase the aperture ratio and resolution. By contrast, as the distance SE increases, the effect of variation in the manufacturing process between the adjacent light-emitting devices becomes permissible, which leads to an increase in manufacturing yield. Since the light-emitting device manufactured according to this specification is suitable for a miniaturization process, the distance SE between the EL layers in the adjacent light-emitting devices can be longer than or equal to 0.5 μm and shorter than or equal to 5 μm, preferably longer than or equal to 1 μm and shorter than or equal to 3 μm, further preferably longer than or equal to 1 μm and shorter than or equal to 2.5 μm, still further preferably longer than or equal to 1 μm and shorter than or equal to 2 μm. Typically, the distance SE is preferably longer than or equal to 1 μm and shorter than or equal to 2 μm (e.g., 1.5 μm or a neighborhood thereof).

In the EL layer, particularly the hole-injection layer, which is included in the hole-transport region between the anode and the light-emitting layer, often has high conductivity; thus, a hole-injection layer formed as a layer shared by adjacent light-emitting devices might cause crosstalk. Thus, processing the EL layers to be separated by patterning using a photolithography method as shown in this structure example can suppress occurrence of crosstalk between adjacent light-emitting devices.

In this specification and the like, a device manufactured using a metal mask or a fine metal mask (FMM; a high-resolution metal mask) may be referred to as a device having a metal mask (MM) structure. In this specification and the like, a device manufactured without using a metal mask or an FMM may be referred to as a device having a metal maskless (MML) structure. A display apparatus having an MML structure is manufactured without using a metal mask and thus has higher flexibility in designing the pixel arrangement, the pixel shape, and the like than a display apparatus having an FMM structure or an MM structure.

Note that in the method for manufacturing a display apparatus having an MML structure, an island-shaped EL layer is formed not by processing with the use of a metal mask but by processing after formation of an EL layer over an entire surface. Accordingly, a high-resolution display apparatus or a display apparatus with a high aperture ratio, which has been difficult to be formed so far, can be obtained. Moreover, EL layers of different colors can be formed separately, which enables extremely vivid images; thus, a display apparatus with a high contrast and high display quality can be fabricated. Provision of a sacrifice layer over an EL layer can reduce damage on the EL layer during a manufacturing process of the display apparatus and increase the reliability of the light-emitting device.

A display apparatus of one embodiment of the present invention can have a structure in which an insulator which covers an end portion of a pixel electrode is not provided, i.e., a structure in which an insulator is not provided between the pixel electrode and the EL layer. With such a structure, light can be efficiently extracted from the EL layer, leading to extremely low viewing angle dependence. For example, in a display apparatus of one embodiment of the present invention, the viewing angle (the maximum angle with a certain contrast ratio maintained when the screen is seen from an oblique direction) can be more than or equal to 100° and less than 180°, preferably more than or equal to 150° and less than 170°. Note that the viewing angle refers to that in both the vertical direction and the horizontal direction. The display apparatus of one embodiment of the present invention can have improved viewing angle dependence and high image visibility.

In the case where a display apparatus is formed using a fine metal mask (FMM) structure, the pixel arrangement structure or the like is limited in some cases. Here, the FMM structure is described below.

In the FMM structure, a metal mask provided with an opening (also referred to as an FMM) is set to be opposed to a substrate so that an EL material can be deposited to a desired region at the time of EL evaporation. Then, the EL material is deposited to the desired region by EL evaporation through the FMM. When the size of the substrate at the time of EL evaporation is larger, the size of the FMM is increased and accordingly the weight thereof is also increased. In addition, heat or the like is applied to the FMM at the time of EL evaporation and may change the shape of the FMM. Furthermore, there is a method in which EL evaporation is performed while a certain level of tension is applied to the FMM. Therefore, the weight and strength of the FMM are important parameters.

The pixel arrangement structure with an FMM needs to be designed under certain restrictions; for example, the above-described parameters and the like need to be considered. In contrast, in the display apparatus of one embodiment of the present invention manufactured using an MML structure, an excellent effect such as higher flexibility in the pixel arrangement structure or the like than the FMM structure can be exhibited. This structure is highly compatible with a flexible device or the like, for example, and thus one or both of a pixel and a driver circuit can have a variety of circuit arrangements.

The structures described in this embodiment can be used in combination with any of the structures described in the other embodiments as appropriate.

Embodiment 4

In this embodiment, an apparatus 720 is described with reference to FIGS. 9A to 9F, FIGS. 10A to 10C, and FIGS. 11A and 11B. The apparatus 720 illustrated in FIGS. 9A to 9F, FIGS. 10A to 10C, and FIGS. 11A and 11B includes any of the light-emitting devices described in Embodiments 1 and 2 and therefore is a light-emitting apparatus. Furthermore, the apparatus 720 described in this embodiment can be used in a display portion of an electronic appliance or the like and therefore can also be referred to as a display panel or a display apparatus. Moreover, when the apparatus 720 includes the light-emitting device as a light source and a light-receiving device that can receive light from the light-emitting device, the apparatus 720 can be referred to as a light-emitting and light-receiving apparatus. Note that the light-emitting apparatus, the display panel, the display apparatus, and the light-emitting and light-receiving apparatus each include at least a light-emitting device.

Furthermore, the light-emitting apparatus, the display panel, the display apparatus, and the light-emitting and light-receiving apparatus of this embodiment can have high definition or large size. Therefore, the light-emitting apparatus, the display panel, the display apparatus, and the light-emitting and light-receiving apparatus of this embodiment can be used, for example, in display portions of electronic appliances such as a digital camera, a digital video camera, a digital photo frame, a mobile phone, a portable game console, a smart phone, a wristwatch terminal, a tablet terminal, a portable information terminal, and an audio reproducing apparatus, in addition to display portions of electronic appliances with a relatively large screen, such as a television apparatus, a desktop or laptop personal computer, a monitor of a computer or the like, digital signage, and a large game machine such as a pachinko machine.

Figure 9A:
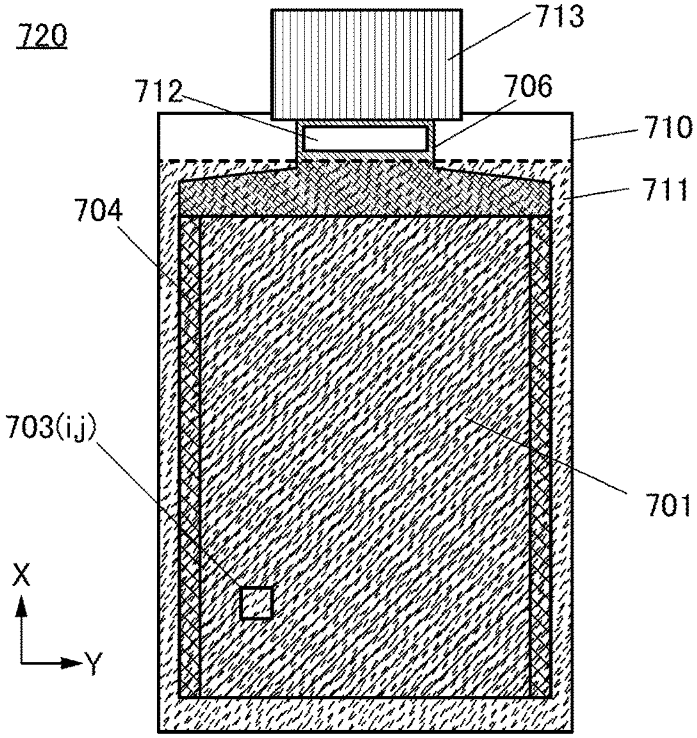
FIGS. 9A to 9F illustrate an apparatus of an embodiment and pixel arrangements.

FIG. 9A is a top view of the apparatus 720 (e.g., the light-emitting apparatus, the display panel, the display apparatus, and the light-emitting and light-receiving apparatus).

Figure 9B:
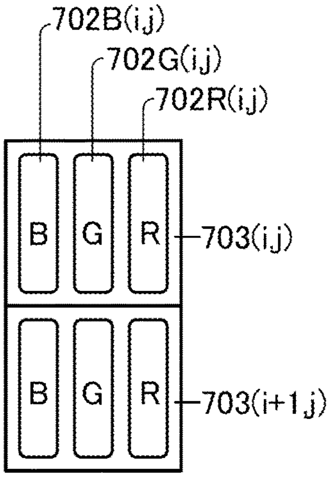

In FIG. 9A, the apparatus 720 has a structure in which a substrate 710 and a substrate 711 are attached to each other. In addition, the apparatus 720 includes a display region 701, a circuit 704, a wiring 706, and the like. Note that the display region 701 includes a plurality of pixels. As illustrated in FIG. 9B, a pixel 703(*i, j*) illustrated in FIG. 9A and a pixel 703(*i*+1,j) are adjacent to each other.

Furthermore, in the example of the apparatus 720 illustrated in FIG. 9A, the substrate 710 is provided with an integrated circuit (IC) 712 by a chip on glass (COG) method, a chip on film (COF) method, or the like. As the IC 712, an IC including a scan line driver circuit, a signal line driver circuit, or the like can be used, for example. In the example illustrated in FIG. 9A, an IC including a signal line driver circuit is used as the IC 712, and a scan line driver circuit is used as the circuit 704.

The wiring 706 has a function of supplying signals and power to the display region 701 and the circuit 704. The signals and power are input to the wiring 706 from the outside through a flexible printed circuit (FPC) 713 or to the wiring 706 from the IC 712. Note that the apparatus 720 is not necessarily provided with the IC. The IC may be mounted on the FPC by a COF method or the like.

FIG. 9B illustrates the pixel 703(*i, j*) and the pixel 703(*i*+1, j) of the display region 701. A plurality of kinds of subpixels including light-emitting devices that emit different color light from each other can be included in the pixel 703(*i,j*). Alternatively, a plurality of subpixels including light-emitting devices that emit the same color light may be included. In the case where a plurality of kinds of subpixels including light-emitting devices that emit different color light from each other are included in the pixel, three kinds of subpixels can be included, for example. The three subpixels can be of three colors of red (R), green (G), and blue (B) or of three colors of yellow (Y), cyan (C), and magenta (M), for example. Alternatively, the pixel can include four kinds of subpixels. The four subpixels can be of four colors of R, G, B, and white (W) or of four colors of R, G, B, and Y, for example. Specifically, the pixel 703(*i, j*) can consist of a subpixel 702B(i,j) for blue display, a subpixel 702G(i,j) for green display, and a subpixel 702R(i,j) for red display.

Other than the subpixels including the light-emitting devices, a subpixel including a light-receiving device may also be provided. In the case where the subpixel includes a light-receiving device, the apparatus 720 is also referred to as a light-emitting and light-receiving apparatus.

Figure 9C:
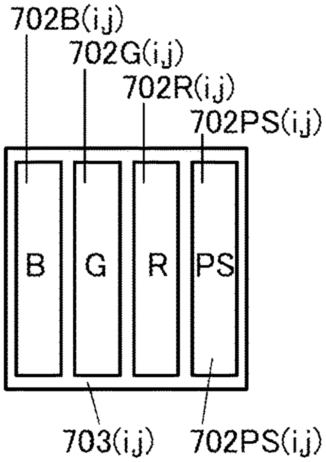
Figure 9D:
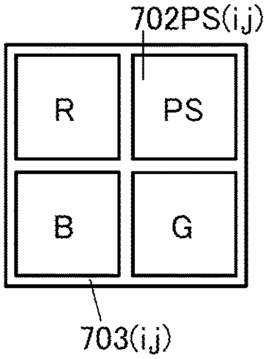
Figure 9E:
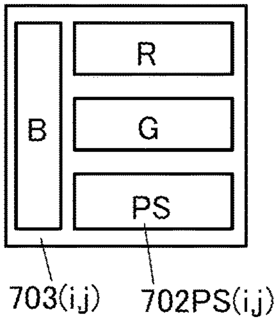

FIGS. 9C to 9E illustrate various layout examples of the pixel 703(*i,j*) including a subpixel 702PS(i,j) including a light-receiving device. The pixel arrangement in FIG. 9C is stripe arrangement, and the pixel arrangement in FIG. 9D is matrix arrangement. The pixel arrangement in FIG. 9E has a structure where three subpixels (the subpixels R, G, and PS) are vertically arranged next to one subpixel (the subpixel B).

Figure 9F:
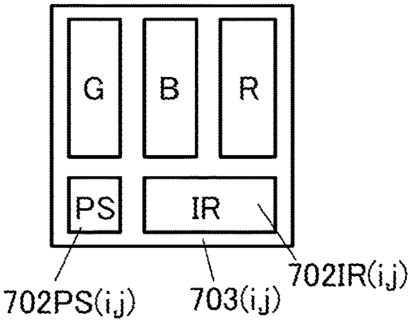

Furthermore, as illustrated in FIG. 9F, a subpixel 702IR (i,j) that emits infrared rays may be added to any of the above-described sets of subpixels in the pixel 703(*i, j*). In the pixel 703(*i, j*) in FIG. 9F, the vertically oriented three subpixels G, B, and R are arranged laterally, and the subpixel PS and the horizontally oriented subpixel IR are arranged laterally below the three subpixels. Specifically, the subpixel 702IR(i,j) that emits light including light with a wavelength of higher than or equal to 650 nm and lower than or equal to 1000 nm may be used in the pixel 703(*i, j*). Note that the wavelength of light detected by the subpixel 702PS (i,j) is not particularly limited; however, the light-receiving device included in the subpixel 702PS(i,j) preferably has sensitivity to light emitted by the light-emitting device included in the subpixel 702R(i,j), the subpixel 702G(i,j), the subpixel 702B(i,j), or the subpixel 7021R(i,j). For example, the light-receiving device preferably detects one or more kinds of light in blue, violet, bluish violet, green, yellowish green, yellow, orange, red, and infrared wavelength ranges, for example.

Note that the arrangement of subpixels is not limited to the structures illustrated in FIGS. 9B to 9F and a variety of arrangement methods can be employed. The arrangement of subpixels may be stripe arrangement, S stripe arrangement, matrix arrangement, delta arrangement, Bayer arrangement, or pentile arrangement, for example.

Furthermore, top surfaces of the subpixels may have a triangular shape, a quadrangular shape (including a rectangular shape and a square shape), a polygonal shape such as a pentagonal shape, a polygonal shape with rounded corners, an elliptical shape, or a circular shape, for example. The top surface shape of a subpixel herein refers to a top surface shape of a light-emitting region of a light-emitting device.

Furthermore, in the case where not only a light-emitting device but also a light-receiving device is included in a pixel, the pixel has a light-receiving function and thus can detect a contact or approach of an object while displaying an image. For example, an image can be displayed by using all the subpixels included in a light-emitting apparatus; or light can be emitted by some of the subpixels as a light source and an image can be displayed by using the remaining subpixels.

Note that the light-receiving area of the subpixel 702PS (i,j) is preferably smaller than the light-emitting areas of the other subpixels. A smaller light-receiving area leads to a narrower image-capturing range, prevents a blur in a captured image, and improves the definition. Thus, by using the subpixel 702PS(i,j), high-resolution or high-definition image capturing is possible. For example, image capturing for personal authentication with the use of a fingerprint, a palm print, the iris, the shape of a blood vessel (including the shape of a vein and the shape of an artery), a face, or the like is possible by using the subpixel 702PS(i,j).

Moreover, the subpixel 702PS(i,j) can be used in a touch sensor (also referred to as a direct touch sensor), a near touch sensor (also referred to as a hover sensor, a hover touch sensor, a contactless sensor, or a touchless sensor), or the like. For example, the subpixel 702PS(i,j) preferably detects infrared light. Thus, touch sensing is possible even in a dark place.

Here, the touch sensor or the near touch sensor can detect an approach or contact of an object (e.g., a finger, a hand, or a pen). The touch sensor can detect the object when the light-emitting and light-receiving apparatus and the object come in direct contact with each other. Furthermore, the near touch sensor can detect the object even when the object is not in contact with the light-emitting and light-receiving apparatus. For example, the light-emitting and light-receiving apparatus can preferably detect the object when the distance between the light-emitting and light-receiving apparatus and the object is more than or equal to 0.1 mm and less than or equal to 300 nm, preferably more than or equal to 3 mm and less than or equal to 50 mm. With this structure, light-emitting and light-receiving apparatus can be controlled without the object directly contacting with the light-emitting and light-receiving apparatus. In other words, the light-emitting and light-receiving apparatus can be controlled in a contactless (touchless) manner. With the above-described structure, the light-emitting and light-receiving apparatus can be controlled with a reduced risk of making the light-emitting and light-receiving apparatus dirty or damaging the light-emitting and light-receiving apparatus or without the object directly touching a dirt (e.g., dust, bacteria, or a virus) attached to the di splay apparatus.

For high-resolution image capturing, the subpixel 702PS (i,j) is preferably provided in every pixel included in the light-emitting and light-receiving apparatus. Meanwhile, in the case where the subpixel 702PS(i,j) is used in a touch sensor, a near touch sensor, or the like, high accuracy is not required as compared to the case of capturing an image of a fingerprint or the like; accordingly, the subpixel 702PS(i,j) is provided in some subpixels in the light-emitting and light-receiving apparatus. When the number of subpixels 702PS (i,j) included in the light-emitting and light-receiving apparatus is smaller than the number of subpixels 702R(i,j) or the like, higher detection speed can be achieved.

Next, an example of a pixel circuit of a subpixel included in the light-emitting device is described with reference to FIG. 10A. A pixel circuit 530 illustrated in FIG. 10A includes a light-emitting device (EL) 550, a transistor M15, a transistor M16, a transistor M17, and a capacitor C3. Note that a light-emitting diode can be used as the light-emitting device 550. In particular, any of the light-emitting devices described in Embodiment 1 and Embodiment 2 is preferably used as the light-emitting device 550.

Figure 10A:
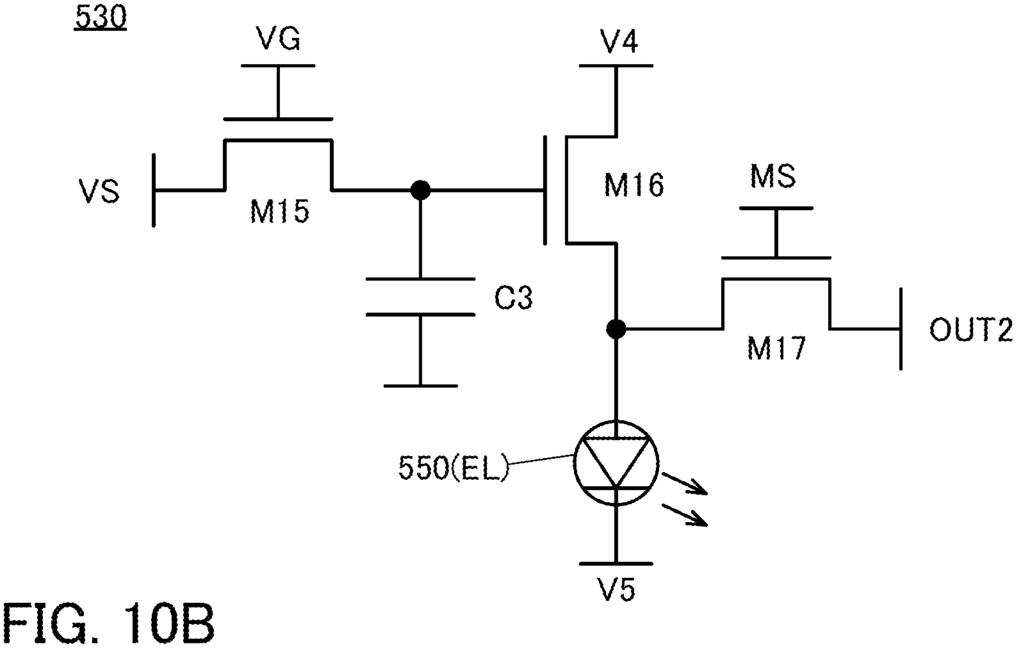
FIGS. 10A to 10C illustrate pixel circuits of embodiments.

In FIG. 10A, a gate of the transistor M15 is electrically connected to a wiring VG, one of a source and a drain of the transistor M15 is electrically connected to a wiring VS, and the other of the source and the drain of the transistor M15 is electrically connected to one electrode of the capacitor C3 and a gate of the transistor M16. One of a source and a drain of the transistor M16 is electrically connected to a wiring V4, and the other is electrically connected to an anode of the light-emitting device 550 and one of a source and a drain of the transistor M17. A gate of the transistor M17 is electrically connected to a wiring MS, and the other of the source and the drain of the transistor M17 is electrically connected to a wiring OUT2. A cathode of the light-emitting device 550 is electrically connected to a wiring V5.

A constant potential is supplied to the wiring V4 and the wiring V5. In the light-emitting device 550, the anode side can have a high potential and the cathode side can have a lower potential than the anode side. The transistor M15 is controlled by a signal supplied to the wiring VG and functions as a selection transistor for controlling a selection state of the pixel circuit 530. The transistor M16 functions as a driving transistor that controls a current flowing through the light-emitting device 550 in accordance with a potential supplied to the gate of the transistor M16. When the transistor M15 is on, a potential supplied to the wiring VS is supplied to the gate of the transistor M16, and the luminance of the light-emitting device 550 can be controlled in accordance with the potential. The transistor M17 is controlled by a signal supplied to the wiring MS and has a function of outputting a potential between the transistor M16 and the light-emitting device 550 to the outside through the wiring OUT2.

Figure 10B:
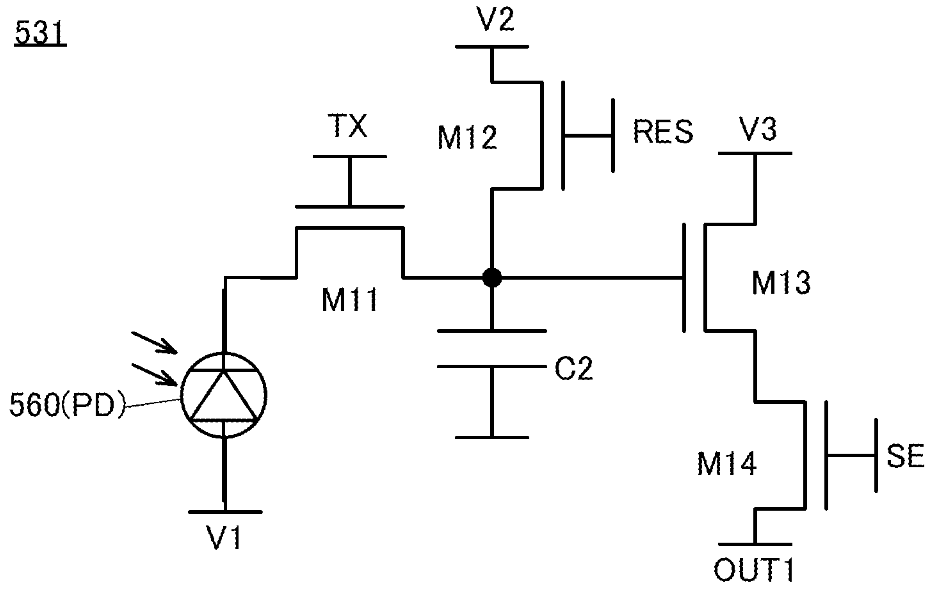

Here, a transistor in which a metal oxide (an oxide semiconductor) is used in a semiconductor layer where a channel is formed is preferably used as transistors M11, M12, M13, and M14 included in a pixel circuit 531 in FIG. 10B and the transistors M15, M16, and M17 included in the pixel circuit 530.

A transistor using a metal oxide having a wider band gap and a lower carrier density than silicon can achieve an extremely low off-state current. Such a low off-state current enables retention of charges accumulated in a capacitor that is connected in series with the transistor for a long time. Therefore, it is particularly preferable to use a transistor including an oxide semiconductor as the transistors M11, M12, and M15 each of which is connected in series with a capacitor C2 or the capacitor C3. When each of the other transistors also includes an oxide semiconductor, manufacturing cost can be reduced.

Alternatively, transistors using silicon as a semiconductor in which a channel is formed can be used as the transistors M11 to M17. It is particularly preferable to use silicon with high crystallinity such as single crystal silicon or polycrystalline silicon because high field-effect mobility can be achieved and higher-speed operation can be performed.

Alternatively, a transistor including an oxide semiconductor may be used as at least one of the transistors M11 to M17, and transistors including silicon may be used as the other transistors.

Next, an example of a pixel circuit of a subpixel including a light-receiving device is described with reference to FIG. 10B. The pixel circuit 531 illustrated in FIG. 10B includes a light-receiving device (PD) 560, the transistor M11, the transistor M12, the transistor M13, the transistor M14, and the capacitor C2. In the example illustrated here, a photodiode is used as the light-receiving device (PD) 560.

In FIG. 10B, an anode of the light-receiving device (PD) 560 is electrically connected to a wiring V1, and a cathode of the light-receiving device (PD) 560 is electrically connected to one of a source and a drain of the transistor M11. A gate of the transistor M11 is electrically connected to a wiring TX, and the other of the source and the drain of the transistor M11 is electrically connected to one electrode of the capacitor C2, one of a source and a drain of the transistor M12, and a gate of the transistor M13. A gate of the transistor M12 is electrically connected to a wiring RES, and the other of the source and the drain of the transistor M12 is electrically connected to a wiring V2. One of a source and a drain of the transistor M13 is electrically connected to a wiring V3, and the other of the source and the drain of the transistor M13 is electrically connected to one of a source and a drain of the transistor M14. A gate of the transistor M14 is electrically connected to a wiring SE, and the other of the source and the drain of the transistor M14 is electrically connected to a wiring OUT1.

A constant potential is supplied to the wiring V1, the wiring V2, and the wiring V3. When the light-receiving device (PD) 560 is driven with a reverse bias, the wiring V2 is supplied with a potential higher than the potential of the wiring V1. The transistor M12 is controlled by a signal supplied to the wiring RES and has a function of resetting the potential of a node connected to the gate of the transistor M13 to a potential supplied to the wiring V2. The transistor M11 is controlled by a signal supplied to the wiring TX and has a function of controlling the timing at which the potential of the node changes, in accordance with a current flowing through the light-receiving device (PD) 560. The transistor M13 functions as an amplifier transistor for outputting a signal corresponding to the potential of the node. The transistor M14 is controlled by a signal supplied to the wiring SE and functions as a selection transistor for reading an output corresponding to the potential of the node by an external circuit connected to the wiring OUT1.

Although n-channel transistors are illustrated in FIGS. 10A and 10B, p-channel transistors can alternatively be used.

The transistors included in the pixel circuit 530 and the transistors included in the pixel circuit 531 are preferably formed side by side over the same substrate. It is particularly preferable that the transistors included in the pixel circuit 530 and the transistors included in the pixel circuit 531 be periodically arranged in one region.

One or more layers including the transistor and/or the capacitor are preferably provided to overlap with the light-receiving device (PD) 560 or the light-emitting device (EL) 550. Thus, the effective area of each pixel circuit can be reduced, and a high-resolution light-receiving portion or display portion can be achieved.

Figure 10C:
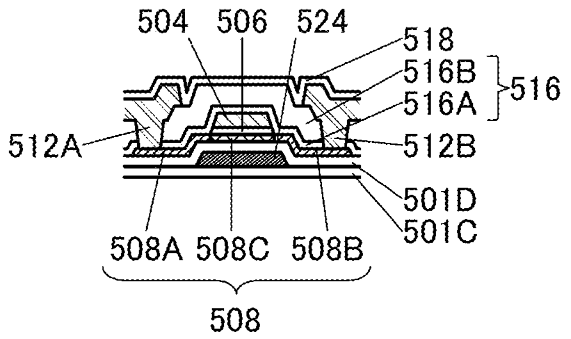

FIG. 10C illustrates an example of a specific structure of a transistor that can be used in the pixel circuit described with reference to FIGS. 10A and 10B. As the transistor, a bottom-gate transistor, a top-gate transistor, or the like can be used as appropriate.

The transistor illustrated in FIG. 10C includes a semiconductor film 508, a conductive film 504, an insulating film 506, a conductive film 512A, and a conductive film 512B. The transistor is formed over an insulating film 501C, for example. The transistor also includes an insulating film 516 (an insulating film 516A and an insulating film 516B) and an insulating film 518.

The semiconductor film 508 includes a region 508A electrically connected to the conductive film 512A and a region 508B electrically connected to the conductive film 512B. The semiconductor film 508 includes a region 508C between the region 508A and the region 508B.

The conductive film 504 includes a region overlapping with the region 508C and has a function of a gate electrode.

The insulating film 506 includes a region positioned between the semiconductor film 508 and the conductive film 504. The insulating film 506 has a function of a first gate insulating film.

The conductive film 512A has one of a function of a source electrode and a function of a drain electrode, and the conductive film 512B has the other.

A conductive film 524 can be used in the transistor. The semiconductor film 508 is sandwiched between the conductive film 504 and a region included in the conductive film 524. The conductive film 524 has a function of a second gate electrode.

An insulating film 501D is positioned between the semiconductor film 508 and the conductive film 524 and has a function of a second gate insulating film.

The insulating film 516 functions as, for example, a protective film covering the semiconductor film 508. Specifically, a film including a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film can be used as the insulating film 516, for example.

For the insulating film 518, a material that has a function of inhibiting diffusion of oxygen, hydrogen, water, an alkali metal, an alkaline earth metal, and the like is preferably used. Specifically, the insulating film 518 can be formed using silicon nitride, silicon oxynitride, aluminum nitride, or aluminum oxynitride, for example. In each of silicon oxynitride and aluminum oxynitride, the number of nitrogen atoms contained is preferably larger than the number of oxygen atoms contained.

Note that in a step of forming the semiconductor film used in the transistor of the pixel circuit, the semiconductor film used in the transistor of the driver circuit can be formed. A semiconductor film having the same composition as the semiconductor film used in the transistor of the pixel circuit can be used in the driver circuit, for example.

For the semiconductor film 508, a semiconductor containing an element of Group 14 can be used. Specifically, a semiconductor containing silicon can be used for the semiconductor film 508.

Hydrogenated amorphous silicon can be used for the semiconductor film 508. Microcrystalline silicon or the like can also be used for the semiconductor film 508. In such cases, it is possible to provide an apparatus having less display unevenness than an apparatus (including a light-emitting apparatus, a display panel, a display apparatus, and a light-emitting and light-receiving apparatus) using polysilicon for the semiconductor film 508, for example. Moreover, it is easy to increase the size of the apparatus.

Polysilicon can be used for the semiconductor film 508. In this case, for example, the field-effect mobility of the transistor can be higher than that of a transistor using hydrogenated amorphous silicon for the semiconductor film 508. For another example, the driving capability can be higher than that of a transistor using hydrogenated amorphous silicon for the semiconductor film 508. For another example, the aperture ratio of the pixel can be higher than that in the case of employing a transistor using hydrogenated amorphous silicon for the semiconductor film 508.

For another example, the reliability of the transistor can be higher than that of a transistor using hydrogenated amorphous silicon for the semiconductor film 508.

The temperature required for fabricating the transistor can be lower than that required for a transistor using single crystal silicon, for example.

The semiconductor film used in the transistor of the driver circuit can be formed in the same step as the semiconductor film used in the transistor of the pixel circuit. The driver circuit can be formed over a substrate where the pixel circuit is formed. The number of components of an electronic appliance can be reduced.

Single crystal silicon can be used for the semiconductor film 508. In this case, for example, the resolution can be higher than that of a light-emitting apparatus (or a display panel) using hydrogenated amorphous silicon for the semiconductor film 508. For another example, it is possible to provide a light-emitting apparatus having less display unevenness than a light-emitting apparatus using polysilicon for the semiconductor film 508. For another example, smart glasses or a head-mounted display can be provided.

A metal oxide can be used for the semiconductor film 508. In this case, the pixel circuit can hold an image signal for a longer time than a pixel circuit including a transistor that uses amorphous silicon for the semiconductor film. Specifically, a selection signal can be supplied at a frequency of lower than 30 Hz, preferably lower than 1 Hz, further preferably less than once per minute while flickering is suppressed. Consequently, fatigue of a user of an electronic device can be reduced. Furthermore, power consumption for driving can be reduced.

An oxide semiconductor can be used for the semiconductor film 508. Specifically, an oxide semiconductor containing indium, an oxide semiconductor containing indium, gallium, and zinc, or an oxide semiconductor containing indium, gallium, zinc, and tin can be used for the semiconductor film 508.

The use of an oxide semiconductor for the semiconductor film achieves a transistor having lower leakage current in the off state than a transistor using amorphous silicon for the semiconductor film. Thus, a transistor using an oxide semiconductor for the semiconductor film is preferably used as a switch or the like. Note that a circuit in which a transistor using an oxide semiconductor for the semiconductor film is used as a switch is capable of retaining the potential of a floating node for a longer time than a circuit in which a transistor using amorphous silicon for the semiconductor film is used as a switch.

In the case of using an oxide semiconductor in a semiconductor film, the apparatus 720 includes a light-emitting device including an oxide semiconductor in its semiconductor film and having a metal maskless (MML). With this structure, the leakage current that might flow through the transistor and the leakage current that might flow between adjacent light-emitting elements (also referred to as a lateral leakage current, a side leakage current, or the like) can become extremely low. With the structure, a viewer can observe any one or more of the image clearness, the image sharpness, a high chroma, and a high contrast ratio in an image displayed on the display apparatus. When the leakage current that might flow through the transistor and the lateral leakage current that might flow between light-emitting elements are extremely low, display with little leakage of light at the time of black display (i.e., with few phenomena in which the black image looks whitish) (such display is also referred to as deep black display) can be achieved.

In particular, in the case where a light-emitting device having an MML structure employs the above-described SBS structure, a layer provided between light-emitting elements (for example, also referred to as an organic layer or a common layer which is commonly used between the light-emitting elements) is disconnected; accordingly, display with no or extremely small lateral leakage can be achieved.

Figure 11A:
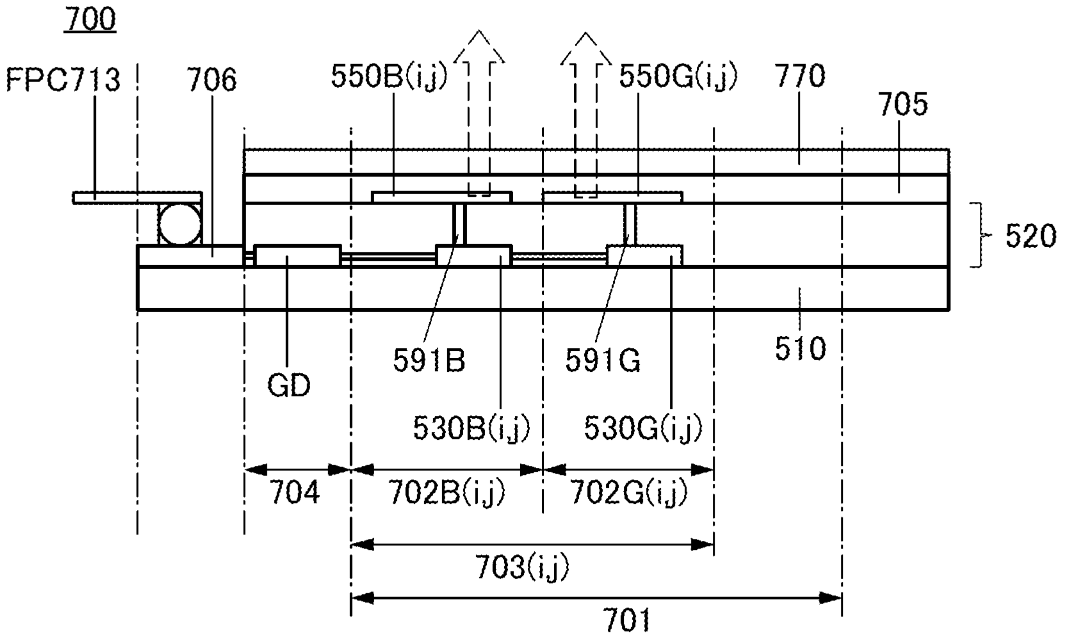
FIGS. 11A and 11B illustrate light-emitting apparatuses of embodiments.
Figure 11B:
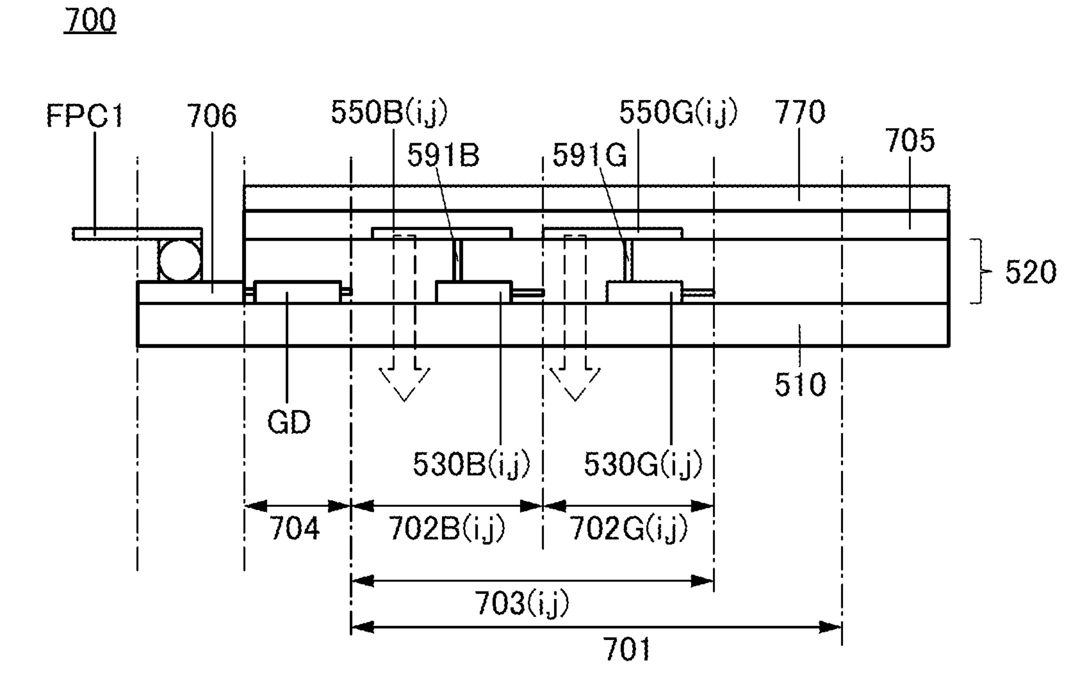

Next, FIG. 11A and FIG. 11B are each a cross-sectional view of the apparatus.

FIGS. 11A and 11B are cross-sectional views of the apparatus illustrated in FIG. 9A of the case where the apparatus is a light-emitting apparatus. Specifically, FIGS. 11A and 11B are cross-sectional views of part of a region including the FPC 713 and the wiring 706 and part of the display region 701 including the pixel 703(*i,j*). FIG. 11A illustrates the light-emitting apparatus having a structure in which light is extracted in the upward direction of the drawing (to the second substrate 770 side) (the structure is referred to as a top emission structure), and FIG. 11B illustrates the light-emitting apparatus having a structure in which light is extracted in the downward direction of the drawing (to the first substrate 510 side) (the structure is referred to as a bottom emission structure).

In FIG. 11A, the apparatus (light-emitting apparatus) 700 includes the functional layer 520 between the first substrate 510 and the second substrate 770. The functional layer 520 includes, as well as the above-described transistors (M15, M16, and M17), the capacitor (C3), and the like, wirings electrically connected to these components (VS, VG, V4, and V5), for example. Although the functional layer 520 includes a pixel circuit 530B(i,j), a pixel circuit 530G(i,j), and the circuit GD in FIG. 11A, one embodiment of the present invention is not limited thereto.

Furthermore, each pixel circuit (e.g., the pixel circuit 530B(i,j) and the pixel circuit 530G(i,j) in FIG. 11A) included in the functional layer 520 is electrically connected to a light-emitting device (e.g., a light-emitting device 550B(i,j) and a light-emitting device 550G(i,j) in FIG. 11A) formed over the functional layer 520. Specifically, the light-emitting device 550B(i,j) is electrically connected to the pixel circuit 530B(i,j) through a wiring 591B, and the light-emitting device 550G(i,j) is electrically connected to the pixel circuit 530G(i,j) through a wiring 591G. The insulating layer 705 is provided over the functional layer 520 and the light-emitting devices, and has a function of attaching the second substrate 770 and the functional layer 520.

As the second substrate 770, a substrate where touch sensors are arranged in a matrix can be used. For example, a substrate provided with capacitive touch sensors or optical touch sensors can be used as the second substrate 770. Thus, the light-emitting apparatus of one embodiment of the present invention can be used as a touch panel.

Although FIGS. 11A and 11B illustrate active-matrix light-emitting apparatuses, the structures of the light-emitting devices described in Embodiments 1 and 2 may be applied to a passive-matrix light-emitting apparatus illustrated in FIGS. 11A and 11B.

Figure 12A:
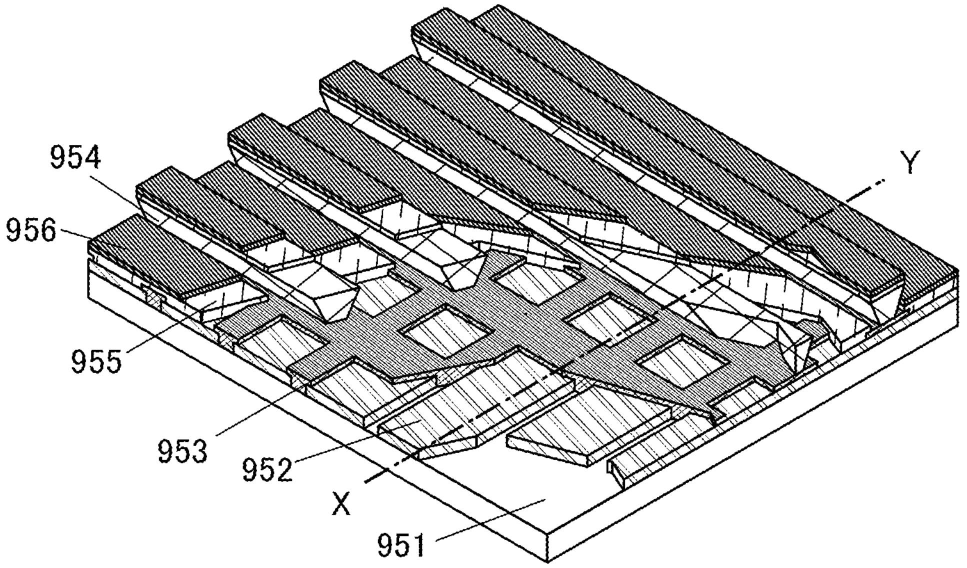
FIGS. 12A and 12B illustrate a light-emitting apparatus of an embodiment.
Figure 12B:
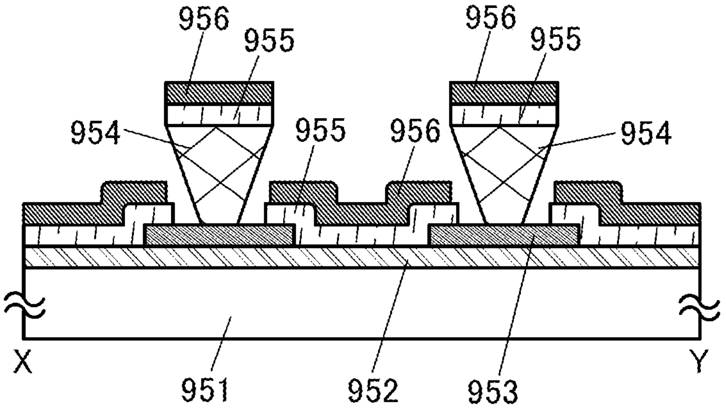

FIG. 12A is a perspective view of a passive-matrix light-emitting apparatus. FIG. 12B is a cross-sectional view taken along the line X-Y in FIG. 12A. In FIGS. 12A and 12B, an electrode 952 and an electrode 956 are provided over a substrate 951, and an EL layer 955 is provided between the electrode 952 and the electrode 956. An end portion of the electrode 952 is covered with an insulating layer 953. A partition 954 is provided over the insulating layer 953. The sidewalls of the partition 954 are aslope such that the distance between both sidewalls is gradually narrowed toward the surface of the substrate. In other words, a cross section taken along the direction along the short side of the partition 954 is trapezoidal, and the lower side (a side of the trapezoid which is parallel to the surface of the insulating layer 953 and is in contact with the insulating layer 953) is shorter than the upper side (a side of the trapezoid which is parallel to the surface of the insulating layer 953 and is not in contact with the insulating layer 953). The partition 954 thus provided can prevent defects in the light-emitting device due to static electricity or the like.

The structures described in this embodiment can be used in appropriate combination with any of the structures described in the other embodiments.

Embodiment 5

In this embodiment, structures of electronic devices of embodiments of the present invention will be described with reference to FIGS. 13A to 13E, FIGS. 14A to 14E, and FIGS. 15A and 15B.

Figure 13A:
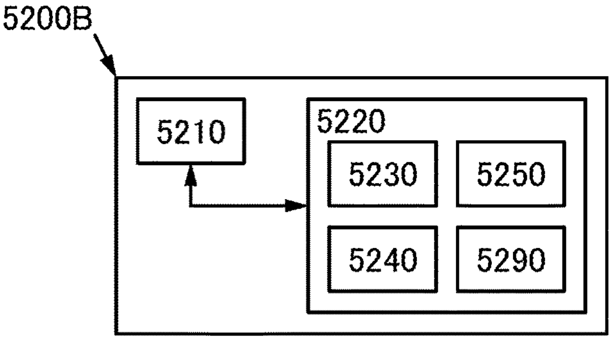
FIGS. 13A to 13E illustrate electronic appliances of embodiments.
Figure 13B:
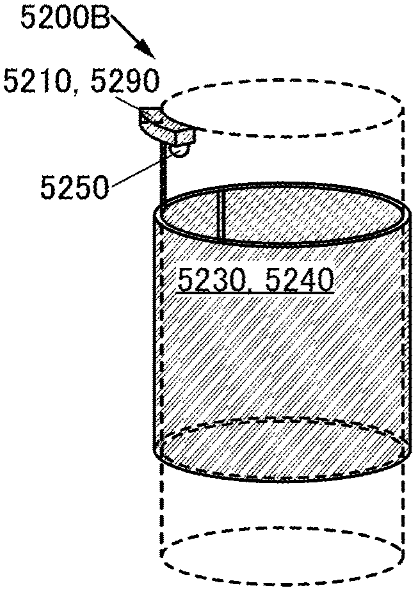
Figure 13C:
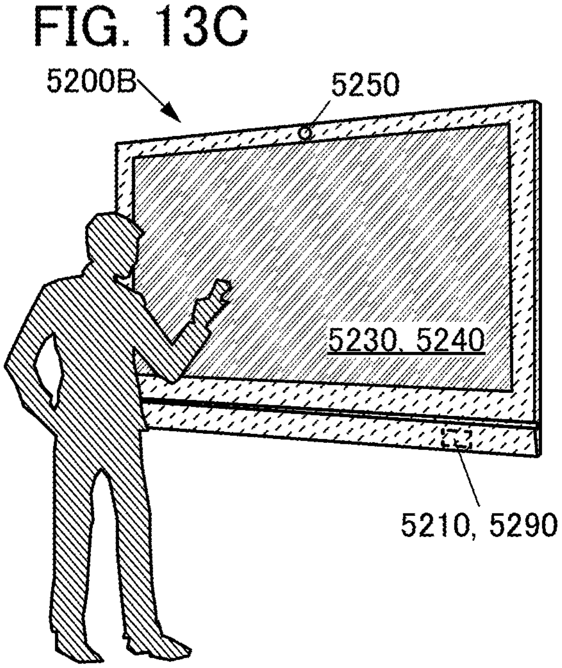
Figure 13D:
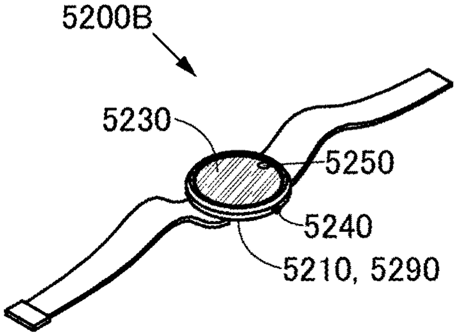
Figure 13E:
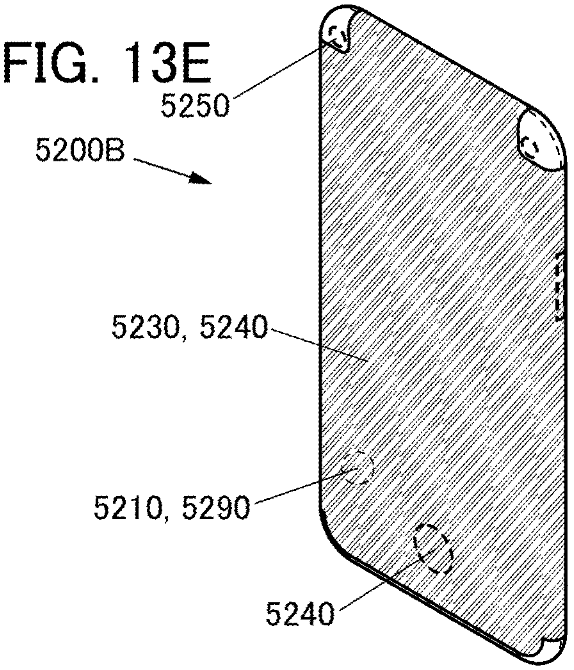
Figure 14A:
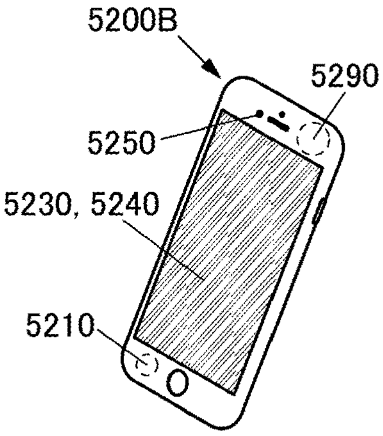
FIGS. 14A to 14E illustrate electronic appliances of embodiments.
Figure 14B:
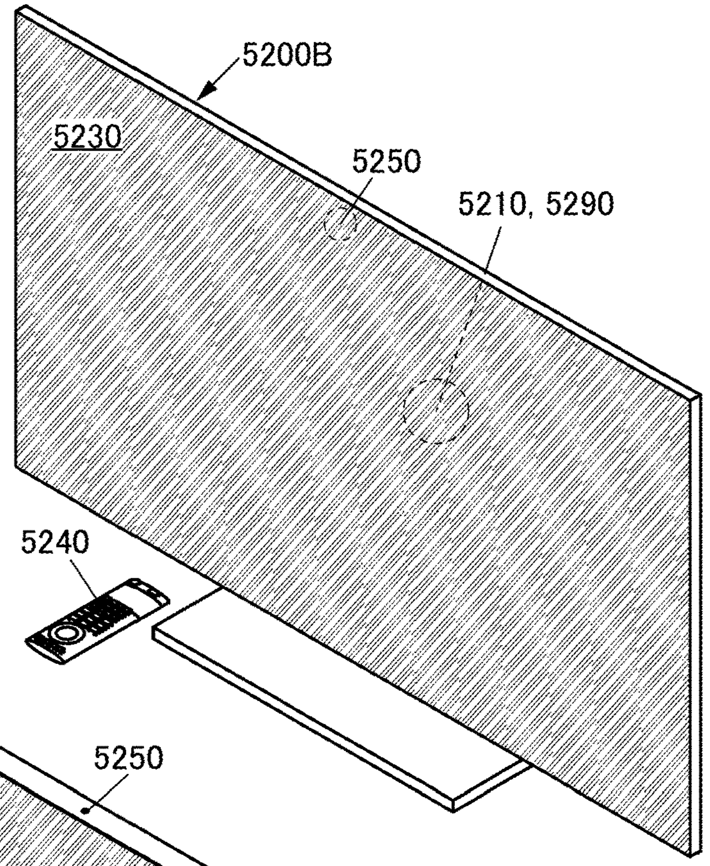
Figure 14C:
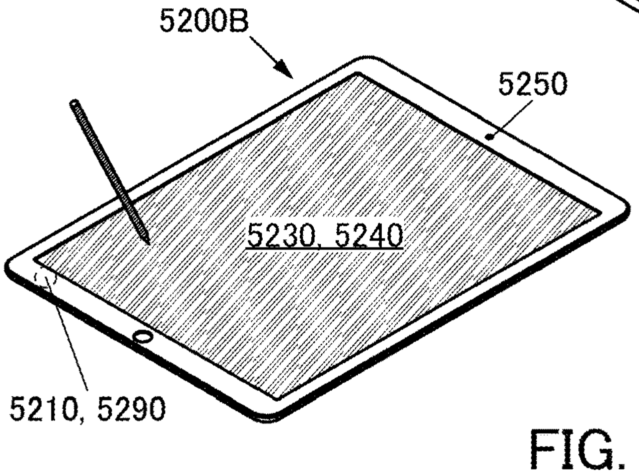
Figure 14D:
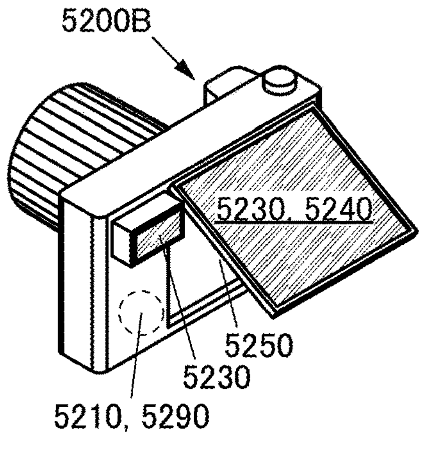
Figure 14E:
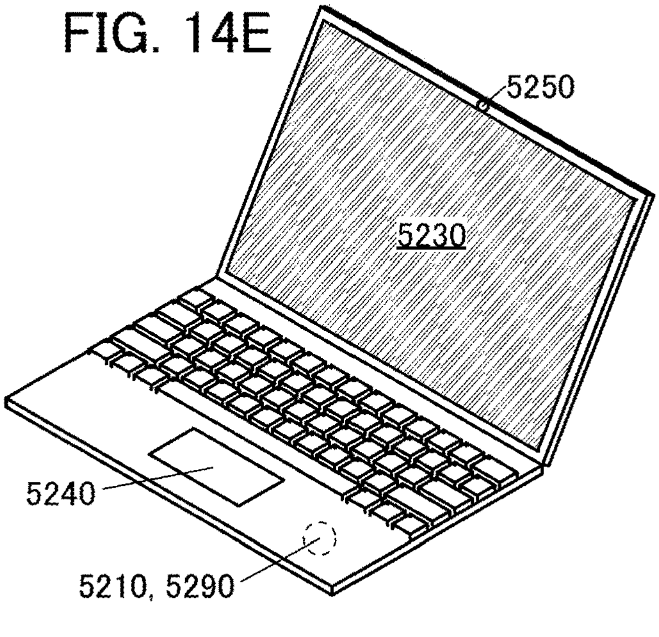
Figure 15A:
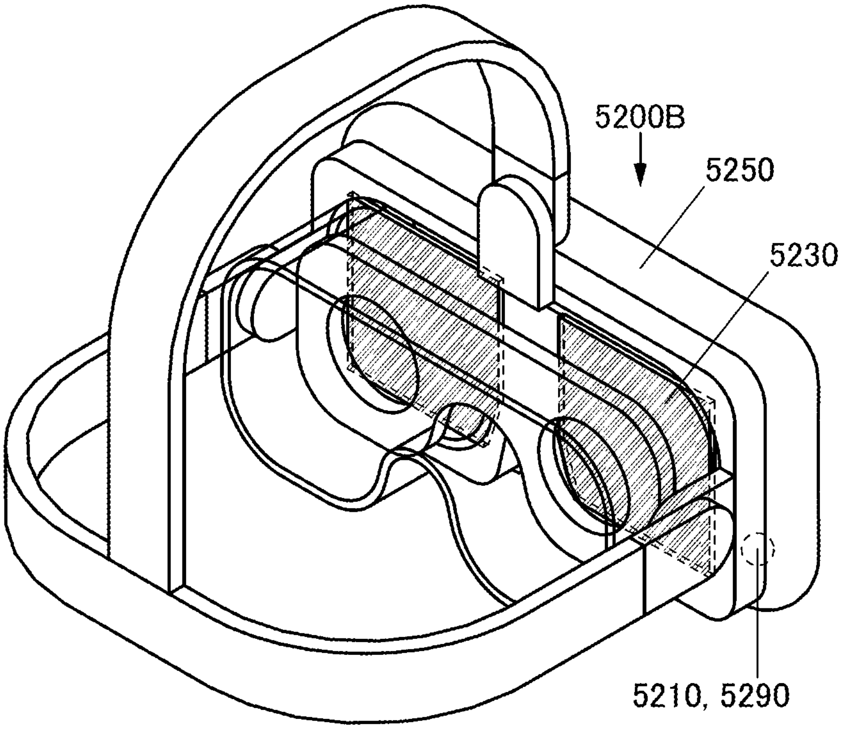
FIGS. 15A and 15B illustrate electronic appliances of embodiments.
Figure 15B:
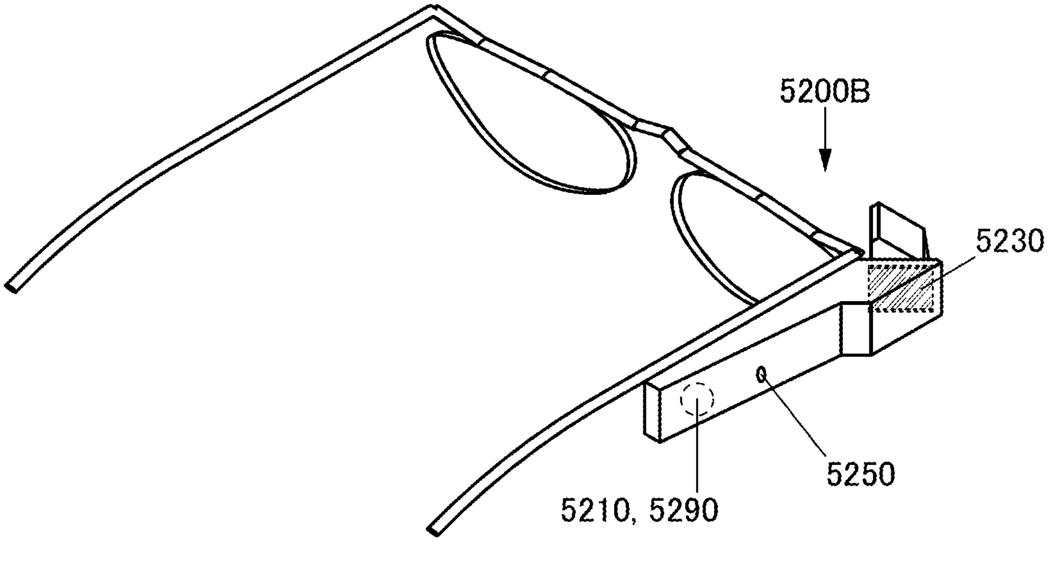

FIGS. 13A to 13E, FIGS. 14A to 14E, and FIGS. 15A and 15B each illustrate a structure of the electronic device of one embodiment of the present invention. FIG. 13A is a block diagram of the electronic device and FIGS. 13B to 13E are perspective views illustrating structures of the electronic device. FIGS. 14A to 14E are perspective views illustrating structures of the electronic device. FIGS. 15A and 15B are perspective views illustrating structures of the electronic device.

An electronic device 5200B described in this embodiment includes an arithmetic device 5210 and an input/output device 5220 (see FIG. 13A).

The arithmetic device 5210 has a function of receiving handling data and a function of supplying image data on the basis of the handling data.

The input/output device 5220 includes a display unit 5230, an input unit 5240, a sensor unit 5250, and a communication unit 5290, and has a function of supplying handling data and a function of receiving image data. The input/output device 5220 also has a function of supplying sensing data, a function of supplying communication data, and a function of receiving communication data.

The input unit 5240 has a function of supplying handling data. For example, the input unit 5240 supplies handling data on the basis of handling by a user of the electronic device 5200B.

Specifically, a keyboard, a hardware button, a pointing device, a touch sensor, an illuminance sensor, an imaging device, an audio input device, an eye-gaze input device, an attitude sensing device, or the like can be used as the input unit 5240.

The display unit 5230 includes a display panel and has a function of displaying image data. For example, the display panel described in Embodiment 3 can be used for the display unit 5230.

The sensor unit 5250 has a function of supplying sensing data. For example, the sensor unit 5250 has a function of sensing a surrounding environment where the electronic device is used and supplying the sensing data.

Specifically, an illuminance sensor, an imaging device, an attitude sensing device, a pressure sensor, a human motion sensor, or the like can be used as the sensor unit 5250.

The communication unit 5290 has a function of receiving and supplying communication data. For example, the communication unit 5290 has a function of being connected to another electronic device or a communication network by wireless communication or wired communication. Specifically, the communication unit 5290 has a function of wireless local area network communication, telephone communication, near field communication, or the like.

FIG. 13B illustrates an electronic device having an outer shape along a cylindrical column or the like. An example of such an electronic device is digital signage. The display panel of one embodiment of the present invention can be used for the display unit 5230. The electronic device may have a function of changing its display method in accordance with the illuminance of a usage environment. The electronic device has a function of changing the displayed content when sensing the existence of a person. Thus, for example, the electronic device can be provided on a column of a building. The electronic device can display advertising, guidance, or the like. The electronic device can be used for digital signage or the like.

FIG. 13C illustrates an electronic device having a function of generating image data on the basis of the path of a pointer used by the user. Examples of such an electronic device include an electronic blackboard, an electronic bulletin board, and digital signage. Specifically, a display panel with a diagonal size of 20 inches or longer, preferably 40 inches or longer, further preferably 55 inches or longer can be used. A plurality of display panels can be arranged and used as one display region. Alternatively, a plurality of display panels can be arranged and used as a multiscreen.

FIG. 13D illustrates an electronic device that is capable of receiving data from another device and displaying the data on the display unit 5230. An example of such an electronic device is a wearable electronic device. Specifically, the electronic device can display several options, and the user can choose some from the options and send a reply to the data transmitter. As another example, the electronic device has a function of changing its display method in accordance with the illuminance of a usage environment. Thus, for example, power consumption of the wearable electronic device can be reduced. As another example, the wearable electronic device can display an image so as to be suitably used even in an environment under strong external light, e.g., outdoors in fine weather.

FIG. 13E illustrates an electronic device including the display unit 5230 having a surface gently curved along a side surface of a housing. An example of such an electronic device is a mobile phone. The display unit 5230 includes a display panel that has a function of displaying images on the front surface, the side surfaces, the top surface, and the rear surface, for example. Thus, a mobile phone can display data on not only its front surface but also its side surfaces, top surface, and rear surface, for example.

FIG. 14A illustrates an electronic device that is capable of receiving data via the Internet and displaying the data on the display unit 5230. An example of such an electronic device is a smartphone. For example, the user can check a created message on the display unit 5230 and send the created message to another device. As another example, the electronic device has a function of changing its display method in accordance with the illuminance of a usage environment. Thus, power consumption of the smartphone can be reduced. As another example, it is possible to obtain a smartphone which can display an image such that the smartphone can be suitably used in an environment under strong external light, e.g., outdoors in fine weather.

FIG. 14B illustrates an electronic device that can use a remote controller as the input unit 5240. An example of such an electronic device is a television system. For example, data received from a broadcast station or via the Internet can be displayed on the display unit 5230. The electronic device can take an image of the user with the sensor unit 5250 and transmit the image of the user. The electronic device can acquire a viewing history of the user and provide it to a cloud service. The electronic device can acquire recommendation data from a cloud service and display the data on the display unit 5230. A program or a moving image can be displayed on the basis of the recommendation data. As another example, the electronic device has a function of changing its display method in accordance with the illuminance of a usage environment. Accordingly, it is possible to obtain a television system which can display an image such that the television system can be suitably used even when irradiated with strong external light that enters the room from the outside in fine weather.

FIG. 14C illustrates an electronic device that is capable of receiving educational materials via the Internet and displaying them on the display unit 5230. An example of such an electronic device is a tablet computer. The user can input an assignment with the input unit 5240 and send it via the Internet. The user can obtain a corrected assignment or the evaluation from a cloud service and have it displayed on the display unit 5230. The user can select suitable educational materials on the basis of the evaluation and have them displayed.

For example, an image signal can be received from another electronic device and displayed on the display unit 5230. When the electronic device is placed on a stand or the like, the display unit 5230 can be used as a sub-display. Thus, for example, it is possible to obtain a tablet computer which can display an image such that the tablet computer is suitably used even in an environment under strong external light, e.g., outdoors in fine weather.

FIG. 14D illustrates an electronic device including a plurality of display units 5230. An example of such an electronic device is a digital camera. For example, the display unit 5230 can display an image that the sensor unit 5250 is capturing. A captured image can be displayed on the sensor unit. A captured image can be decorated using the input unit 5240. A message can be attached to a captured image. A captured image can be transmitted via the Internet. The electronic device has a function of changing shooting conditions in accordance with the illuminance of a usage environment. Accordingly, for example, it is possible to obtain a digital camera that can display a subject such that an image is suitably viewed even in an environment under strong external light, e.g., outdoors in fine weather.

FIG. 14E illustrates an electronic device in which the electronic device of this embodiment is used as a master to control another electronic device used as a slave. An example of such an electronic device is a portable personal computer. For example, part of image data can be displayed on the display unit 5230 and another part of the image data can be displayed on a display unit of another electronic device. Image signals can be supplied. Data written from an input unit of another electronic device can be obtained with the communication unit 5290. Thus, a large display region can be utilized in the case of using a portable personal computer, for example.

FIG. 15A illustrates an electronic device including the sensor unit 5250 that senses an acceleration or a direction. An example of such an electronic device is a goggles-type electronic device. The sensor unit 5250 can supply data on the position of the user or the direction in which the user faces. The electronic device can generate image data for the right eye and image data for the left eye in accordance with the position of the user or the direction in which the user faces. The display unit 5230 includes a display region for the right eye and a display region for the left eye. Thus, a virtual reality image that gives the user a sense of immersion can be displayed on the goggles-type electronic device, for example.

FIG. 15B illustrates an electronic device including an imaging device and the sensor unit 5250 that senses an acceleration or a direction. An example of such an electronic device is a glasses-type electronic device. The sensor unit 5250 can supply data on the position of the user or the direction in which the user faces. The electronic device can generate image data in accordance with the position of the user or the direction in which the user faces. Accordingly, the data can be shown together with a real-world scene, for example. Alternatively, an augmented reality image can be displayed on the glasses-type electronic device.

Note that this embodiment can be combined with any of the other embodiments in this specification as appropriate.

Embodiment 6

Figure 16A:
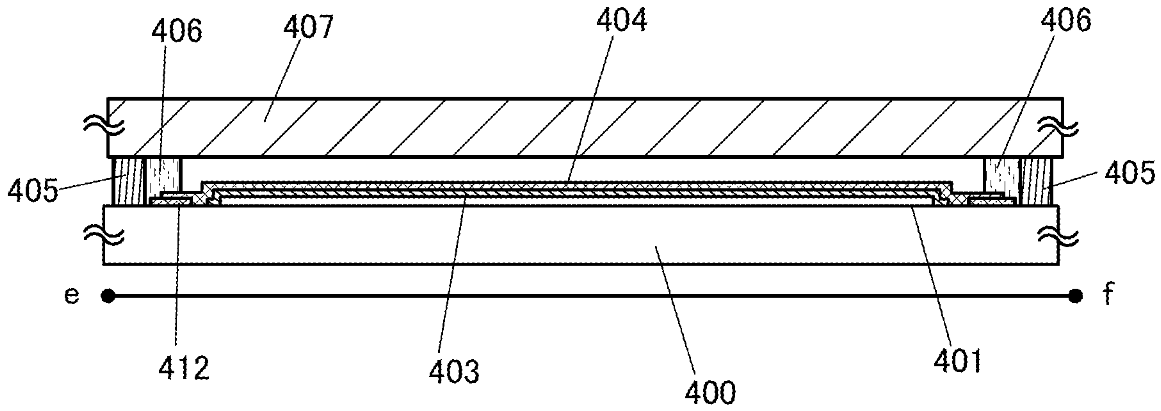
FIGS. 16A and 16B illustrate an electronic appliance of an embodiment.
Figure 16B:
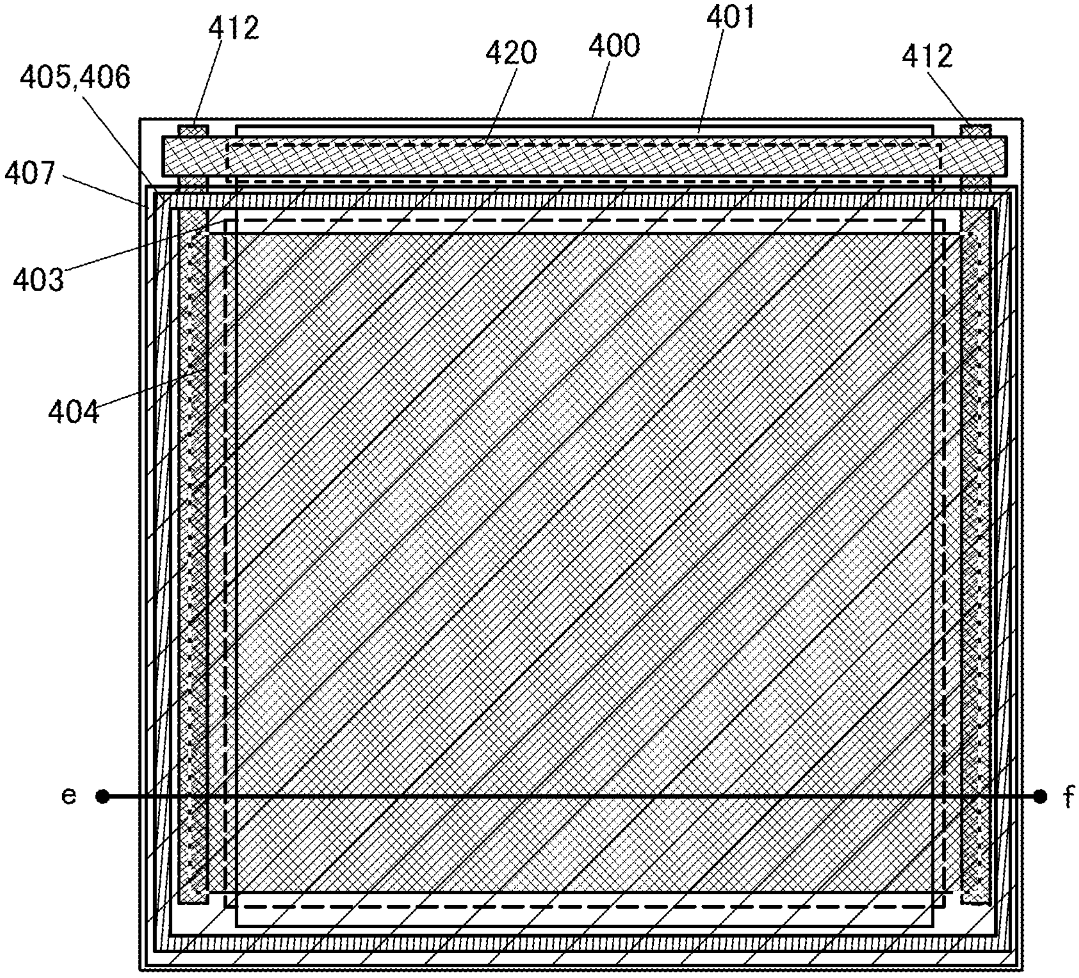

In this embodiment, a structure in which the light-emitting device described in Embodiment 2 is used in a lighting device will be described with reference to FIGS. 16A and 16B. FIG. 16A illustrates a cross section taken along the line e-f in a top view of the lighting device in FIG. 16B.

In the lighting device in this embodiment, the first electrode 401 is formed over a substrate 400 that is a support and has a light-transmitting property. The first electrode 401 corresponds to the first electrode 101 in Embodiments 1 and 2. When light is extracted from the first electrode 401 side, the first electrode 401 is formed using a material having a light-transmitting property.

A pad 412 for applying voltage to the second electrode 404 is provided over the substrate 400.

An EL layer 403 is formed over the first electrode 401. The structure of the EL layer 403 corresponds to the structure of the EL layer 103 in Embodiments 1 and 2. Refer to the corresponding description for these structures.

The second electrode 404 is formed to cover the EL layer 403. The second electrode 404 corresponds to the second electrode 102 in Embodiments 1 and 2. The second electrode 404 is formed using a material having high reflectance when light is extracted from the first electrode 401 side. The second electrode 404 is connected to the pad 412 so that voltage is applied to the second electrode 404.

As described above, the lighting device described in this embodiment includes a light-emitting device including the first electrode 401, the EL layer 403, and the second electrode 404. Since the light-emitting device has high emission efficiency, the lighting device in this embodiment can have low power consumption.

The substrate 400 provided with the light-emitting device having the above structure and a sealing substrate 407 are fixed and sealed with sealing materials 405 and 406, whereby the lighting device is completed. It is possible to use only either the sealing material 405 or the sealing material 406. In addition, the inner sealing material 406 (not illustrated in FIG. 16B) can be mixed with a desiccant that enables moisture to be adsorbed, increasing the reliability.

When parts of the pad 412 and the first electrode 401 are extended to the outside of the sealing materials 405 and 406, the extended parts can serve as external input terminals. An IC chip 420 mounted with a converter or the like may be provided over the external input terminals.

Embodiment 7

Figure 17:
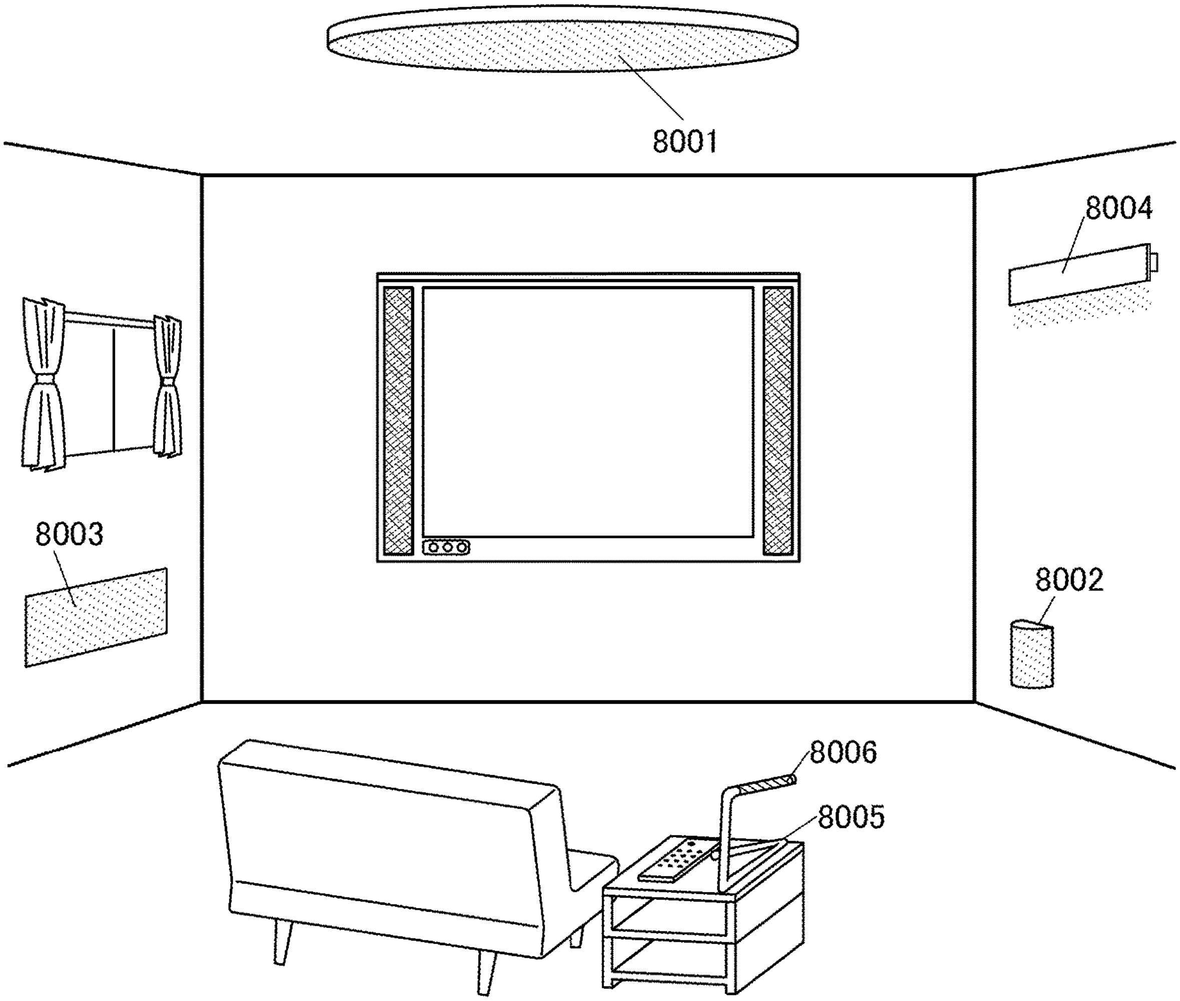
FIG. 17 illustrates electronic appliances of embodiments.

In this embodiment, application examples of lighting devices fabricated using the light-emitting apparatus of one embodiment of the present invention or the light-emitting device, which is part of the light-emitting apparatus, will be described with reference to FIG. 17.

A ceiling light 8001 can be used as an indoor lighting device. Examples of the ceiling light 8001 include a direct-mount light and an embedded light. Such lighting devices are fabricated using the light-emitting apparatus and a housing or a cover in combination. Application to a cord pendant light (light that is suspended from a ceiling by a cord) is also possible.

A foot light 8002 lights a floor so that safety on the floor can be improved. For example, it can be effectively used in a bedroom, on a staircase, or on a passage. In that case, the size and shape of the foot light can be changed in accordance with the dimensions and structure of a room. The foot light can be a stationary lighting device fabricated using the light-emitting apparatus and a support in combination.

A sheet-like lighting 8003 is a thin sheet-like lighting device. The sheet-like lighting, which is attached to a wall when used, is space-saving and thus can be used for a wide variety of uses. Furthermore, the area of the sheet-like lighting can be easily increased. The sheet-like lighting can also be used on a wall and a housing that have a curved surface.

A lighting device 8004 in which the direction of light from a light source is controlled to be only a desired direction can be used.

A desk lamp 8005 includes a light source 8006. As the light source 8006, the light-emitting apparatus of one embodiment of the present invention or the light-emitting device, which is part of the light-emitting apparatus, can be used.

Besides the above examples, when the light-emitting apparatus of one embodiment of the present invention or the light-emitting device, which is part of the light-emitting apparatus, is used as part of furniture in a room, a lighting device that functions as the furniture can be obtained.

As described above, a variety of lighting devices that include the light-emitting apparatus can be obtained. Note that these lighting devices are also embodiments of the present invention.

The structures described in this embodiment can be used in appropriate combination with any of the structures described in the other embodiments.

Embodiment 8

In this embodiment, a light-emitting device and a light-receiving device that can be used in a display device of one embodiment of the present invention will be described with reference to FIGS. 18A to 18C.

Figure 18A:
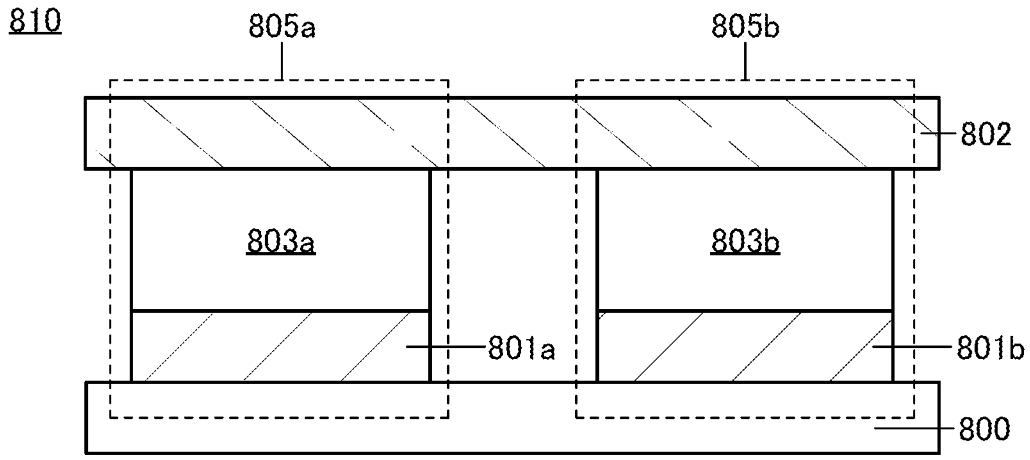
FIGS. 18A to 18C illustrate a light-emitting device and a light-receiving device of an embodiment.

FIG. 18A is a schematic cross-sectional view of a light-emitting device 805*a* and a light-receiving device 805*b* included in a display device 810 of one embodiment of the present invention.

The light-emitting device 805*a* has a function of emitting light (hereinafter, also referred to as a light-emitting function). The light-emitting device 805*a* includes an electrode 801*a*, an EL layer 803*a*, and an electrode 802. The light-emitting device 805*a* is preferably a light-emitting device utilizing organic EL (an organic EL device) described in Embodiment 1 or 2. Thus, the EL layer 803*a* interposed between the electrode 801*a* and the electrode 802 includes at least a light-emitting layer. The light-emitting layer contains a light-emitting substance. The EL layer 803*a* emits light when voltage is applied between the electrode 801*a* and the electrode 802. The EL layer 803*a* may include any of a variety of layers such as a hole-injection layer, a hole-transport layer, an electron-transport layer, an electron-injection layer, a carrier-blocking (hole-blocking or electron-blocking) layer, and a charge-generation layer, in addition to the light-emitting layer.

The light-receiving device 805*b* has a function of sensing light (hereinafter, also referred to as a light-receiving function). As the light-receiving device 805*b*, a PN photodiode or a PIN photodiode can be used, for example. The light-receiving device 805*b* includes an electrode 801*b*, a light-receiving layer 803*b*, and the electrode 802. The light-receiving layer 803*b* interposed between the electrode 801*b* and the electrode 802 includes at least an active layer. Note that for the light-receiving layer 803*b*, any of materials that are used for the variety of layers (e.g., the hole-injection layer, the hole-transport layer, the light-emitting layer, the electron-transport layer, the electron-injection layer, the carrier-blocking (hole-blocking or electron-blocking) layer, and the charge generation layer) included in the above-described EL layer 803*a* can be used. The light-receiving device 805*b* functions as a photoelectric conversion device, where electric charge is generated with light incident on the light-receiving layer 803*b* and can be extracted as current. At this time, voltage may be applied between the electrode 801*b* and the electrode 802. The amount of generated electric charge depends on the amount of light incident on the light-receiving layer 803*b*.

The light-receiving device 805*b* has a function of sensing visible light. The light-receiving device 805*b* has sensitivity to visible light. The light-receiving device 805*b* further preferably has a function of sensing visible light and infrared light. The light-receiving device 805*b* preferably has sensitivity to visible light and infrared light.

In this specification and the like, a blue (B) wavelength range is greater than or equal to 400 nm and less than 490 nm, and blue (B) light has at least one emission spectrum peak in the wavelength range. A green (G) wavelength range is greater than or equal to 490 nm and less than 580 nm, and green (G) light has at least one emission spectrum peak in the wavelength range. A red (R) wavelength range is greater than or equal to 580 nm and less than 700 nm, and red (R) light has at least one emission spectrum peak in the wavelength range. In this specification and the like, a visible light wavelength range is greater than or equal to 400 nm and less than 700 nm, and visible light has at least one emission spectrum peak in the wavelength range. An infrared (IR) wavelength range is greater than or equal to 700 nm and less than 900 nm, and infrared (IR) light has at least one emission spectrum peak in the wavelength range.

The active layer in the light-receiving device 805*b* includes a semiconductor. Examples of the semiconductor include inorganic semiconductors such as silicon and organic semiconductors including organic compounds. As the light-receiving device 805*b*, an organic semiconductor device (or an organic photodiode) including an organic semiconductor in an active layer is preferably used. An organic photodiode, which is easily made thin, lightweight, and large in area and has a high degree of freedom for shape and design, can be used in a variety of display devices. An organic semiconductor is preferably used, in which case the EL layer 803*a* included in the light-emitting device 805*a* and the light-receiving layer 803*b* included in the light-receiving device 805*b* can be formed by the same method (e.g., a vacuum evaporation method) with the same manufacturing apparatus. Note that any of the organic compounds of one embodiment of the present invention can be used for the light-receiving layer 803*b* in the light-receiving device 805*b*.

In the display device of one embodiment of the present invention, an organic EL device and an organic photodiode can be suitably used as the light-emitting device 805*a* and the light-receiving device 805*b*, respectively. The organic EL device and the organic photodiode can be formed over one substrate. Thus, the organic photodiode can be incorporated into the display device including the organic EL device. A display device of one embodiment of the present invention has one or both of an image capturing function and a sensing function in addition to a function of displaying an image.

The electrode 801*a* and the electrode 801*b* are provided on the same plane. In FIG. 18A, the electrodes 801*a* and 801*b* are provided over a substrate 800. The electrodes 801*a* and 801*b* can be formed by processing a conductive film formed over the substrate 800 into an island shape, for example. In other words, the electrodes 801*a* and 801*b* can be formed through the same process.

As the substrate 800, a substrate having heat resistance high enough to withstand the formation of the light-emitting device 805*a* and the light-receiving device 805*b* can be used. When an insulating substrate is used, a glass substrate, a quartz substrate, a sapphire substrate, a ceramic substrate, an organic resin substrate, or the like can be used as the substrate 800. Alternatively, a semiconductor substrate can be used. For example, a single crystal semiconductor substrate or a polycrystalline semiconductor substrate of silicon, silicon carbide, or the like; a compound semiconductor substrate of silicon germanium or the like; an SOI substrate; or the like can be used.

As the substrate 800, it is particularly preferable to use the insulating substrate or the semiconductor substrate over which a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

The electrode 802 is formed of a layer shared by the light-emitting device 805*a* and the light-receiving device 805*b*. As the electrode through which light enters or exits among the electrodes 801*a*, 801*b*, and 802, a conductive film that transmits visible light and infrared light is used. As the electrode through which light neither enters nor exits, a conductive film that reflects visible light and infrared light is preferably used.

The electrode 802 in the display device of one embodiment of the present invention functions as one of the electrodes in each of the light-emitting device 805*a* and the light-receiving device 805*b*.

Figure 18B:
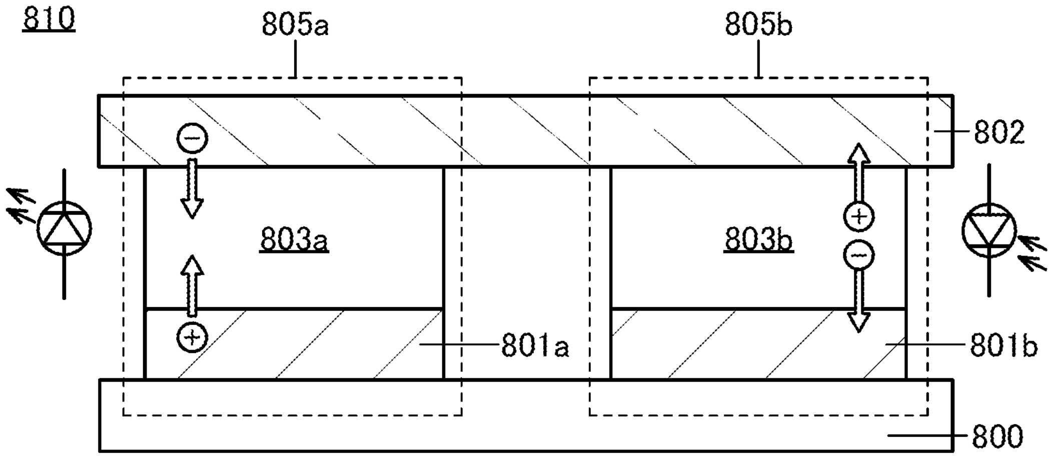

FIG. 18B illustrates the case where the electrode 801*a* of the light-emitting device 805*a* has a higher potential than the electrode 802. In this case, the electrode 801*a* functions as an anode and the electrode 802 functions as a cathode in the light-emitting device 805*a*. The electrode 801*b* of the light-receiving device 805*b* has a lower potential than the electrode 802. For easy understanding of the direction of current flow, FIG. 18B illustrates a circuit symbol of a light-emitting diode on the left of the light-emitting device 805*a* and a circuit symbol of a photodiode on the right of the light-receiving device 805*b*. The flow directions of carriers (electrons and holes) in each device are also schematically indicated by arrows.

In the structure illustrated in FIG. 18B, when a first potential is supplied to the electrode 801*a* through a first wiring, a second potential is supplied to the electrode 802 through a second wiring, and a third potential is supplied to the electrode 801*a* through a third wiring in the light-emitting device 805*a*, the following relationship is satisfied: the first potential>the second potential>the third potential.

Figure 18C:
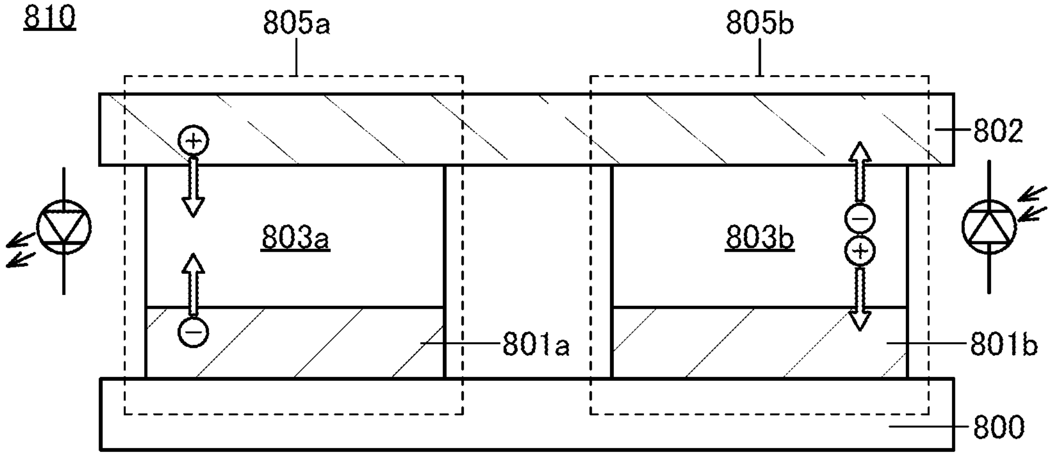

FIG. 18C illustrates the case where the electrode 801*a* of the light-emitting device 805*a* has a lower potential than the electrode 802. In this case, the electrode 801*a* functions as a cathode and the electrode 802 functions as an anode in the light-emitting device 805*a*. The electrode 801*b* of the light-receiving device 805*b* has a lower potential than the electrode 802 and a higher potential than the electrode 801*a*. For easy understanding of the direction of current flow, FIG. 18C illustrates a circuit symbol of a light-emitting diode on the left of the light-emitting device 805*a* and a circuit symbol of a photodiode on the right of the light-receiving device 805*b*. The flow directions of carriers (electrons and holes) in each device are also schematically indicated by arrows.

In the structure illustrated in FIG. 18C, when a first potential is supplied to the electrode 801*a* through a first wiring, a second potential is supplied to the electrode 802 through a second wiring, and a third potential is supplied to the electrode 801*a* through a third wiring in the light-emitting device 805*a*, the following relationship is satisfied: the second potential>the third potential>the first potential.

The resolution of the light-receiving device 805*b* described in this embodiment can be 100 ppi or more, preferably 200 ppi or more, further preferably 300 ppi or more, still further preferably 400 ppi or more, and yet still further preferably 500 ppi or more, and 2000 ppi or less, 1000 ppi or less, or 600 ppi or less, for example. In particular, when the resolution of the light-receiving device 805*b* is 200 ppi or more and 600 ppi or less, preferably 300 ppi or more and 600 ppi or less, the display device of one embodiment of the present invention can be suitably used for image capturing of fingerprints. In fingerprint authentication with the display device of one embodiment of the present invention, the increased resolution of the light-receiving device 805*b* enables, for example, high-accuracy extraction of the minutiae of fingerprints; thus, the accuracy of the fingerprint authentication can be increased. The resolution is preferably 500 ppi or more, in which case the authentication conforms to the standard by the National Institute of Standards and Technology (NIST) or the like. On the assumption that the resolution of the light-receiving device is 500 ppi, the size of each pixel is 50.8 μm, which is adequate for image capturing of a fingerprint ridge distance (typically, greater than or equal to 300 μm and less than or equal to 500 μm).

The structures described in this embodiment can be used in appropriate combination with any of the structures described in the other embodiments.

Example 1

In this example, the light-emitting device of one embodiment of the present invention described in the embodiment is described. Structural formulae of organic compounds used in the light-emitting device of one embodiment of the present invention are shown below. In this example, an example of using, as the electron-injection layer, the stacked-layer film formed of the first layer including the alkali metal compound and the second layer including the reducing agent is described.

[Chemical Formula 3]

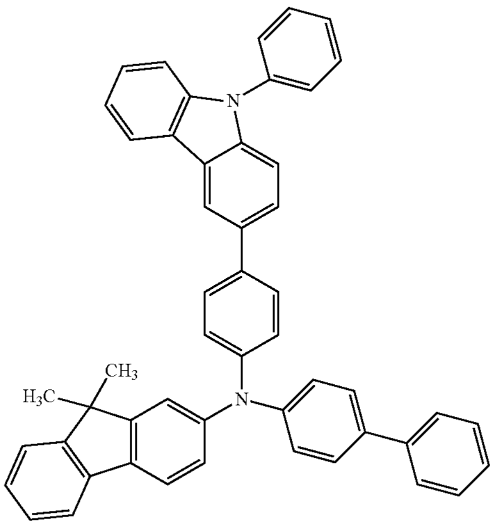

PCBBiF

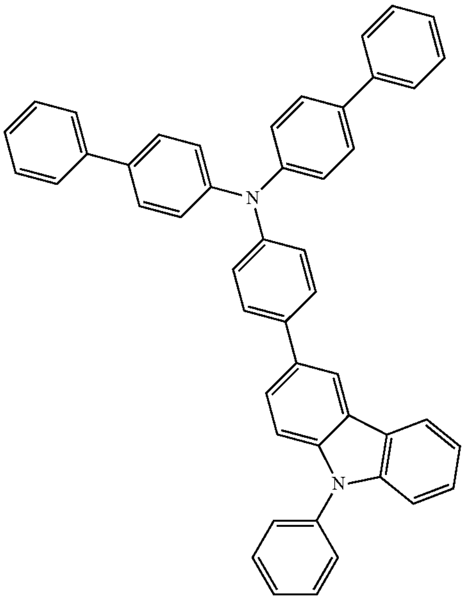

PCBBi1BP

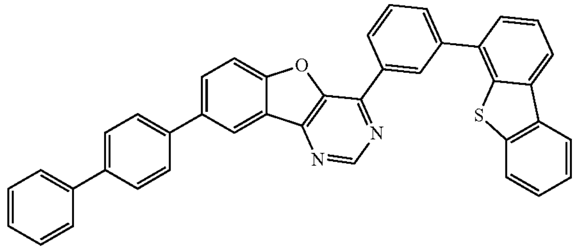

8BP-4mDBtPBfpm

-continued

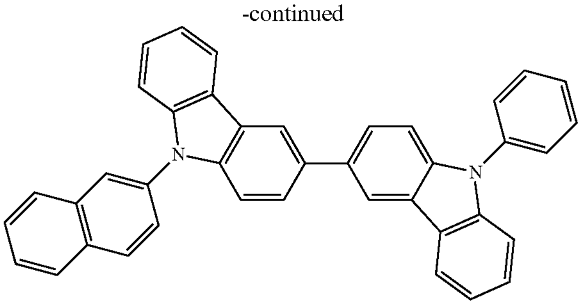

β NCCP

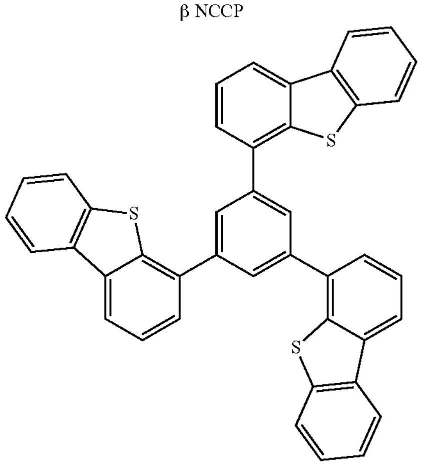

DBT3P-II

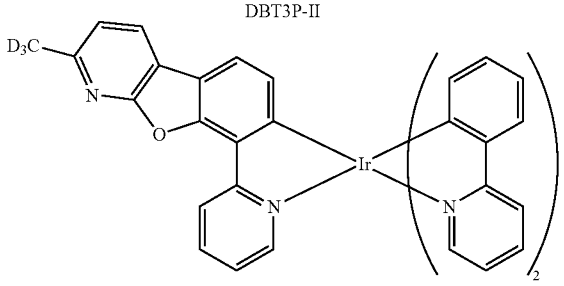

$Ir(ppy)_2(mbfpypy\text{-}d_3)$

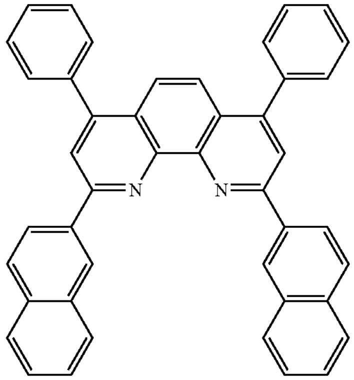

NBPhen (Method for Fabricating Light-Emitting Device 1)

Figure 19A:
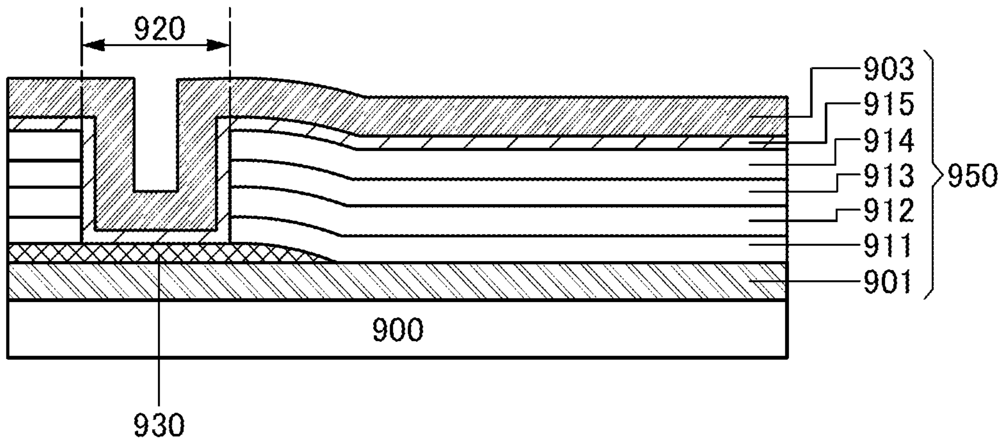
FIGS. 19A and 19B illustrate structures of light-emitting devices.

Like a light-emitting device 950 illustrated in FIG. 19A, a light-emitting device 1 described in this example has a structure in which a hole-injection layer 911, a hole-transport layer 912, a light-emitting layer 913, an electron-transport layer 914, and an electron-injection layer 915 are stacked in this order over a first electrode 901 formed over a glass substrate 900, and a second electrode 903 is stacked over the electron-injection layer 915. The light-emitting device 1 described in this example was fabricated using a method including the following steps. As illustrated in FIG. 19A, an insulating layer 930 is also formed in a part of a region over the first electrode 901. In addition, the electron-transport layer 914, the light-emitting layer 913, the hole-transport layer 912, and the hole-injection layer 911 have a slit 920 in a region overlapping with the insulating layer 930.

[First Step]

First, a reflective film REF was formed over the glass substrate 900. Specifically, the reflective film REF was formed to a thickness of 100 nm by a sputtering method using an alloy containing silver (Ag), palladium (Pd), and copper (Cu) (abbreviation: APC) as a target. Then, a film of indium oxide-tin oxide containing silicon or silicon oxide (abbreviation: ITSO) was formed by a sputtering method as the first electrode 901. The thickness of the first electrode 901 was set to 100 nm and the area of the electrode was set to 4 $mm^2$ (2 mm×2 mm).

After the first step, the insulating layer 930 was formed. As the insulating layer 930, a 1-μm thick polyimide film was formed. Furthermore, as an etching stopper film over the polyimide film, a film of a composite oxide containing indium, gallium, zinc, and oxygen (abbreviation: IGZO) was formed with a thickness of 10 nm by a sputtering method.

[Second Step]

Next, in pretreatment for forming the light-emitting device over the substrate, a surface of the substrate was washed with water and baked at 200° C. for 1 hour, and then UV ozone treatment was performed for 370 seconds. Then, the substrate was transferred into a vacuum evaporation apparatus where the pressure was reduced to approximately $10^{-4}$ Pa, and vacuum baking was performed at 170° C. for 30 minutes in a heating chamber of the vacuum evaporation apparatus. Then, the substrate was cooled down for approximately 30 minutes.

[Third Step]

Then, the substrate provided with the first electrode 901 was fixed to a substrate holder provided in the vacuum evaporation apparatus such that the surface on which the first electrode 901 was formed faced downward. Over the first electrode 901, by an evaporation method using resistance heating, N-(1,1'-biphenyl-4-yl)-N-[4-(9-phenyl-9H-carbazol-3-yl)phenyl]-9,9-dimethyl-9H-fluoren-2-amine (abbreviation: PCBBiF) and a fluorine-containing electron acceptor material with a molecular weight of 672 (OCHD-003) were deposited by co-evaporation to a thickness of 10 nm such that the weight ratio of PCBBiF to OCHD-003 was 1:0.03, and then PCBBiF was deposited by evaporation to a thickness of 35 nm, whereby the hole-injection layer 911 was formed.

[Fourth Step]

Next, 4,4'-diphenyl-4"-(9-phenyl-9H-carbazol-3-yl)triphenylamine (abbreviation: PCBBilBP) was deposited by evaporation to a thickness of 20 nm over the hole-injection layer 911, whereby the hole-transport layer 912 was formed.

[Fifth Step]

Next, over the hole-transport layer 912, 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm), 9-(2-naphthyl)-9'-phenyl-9H,9'H-3,3'-bicarbazole (abbreviation: βNCCP), and [2-$d_3$-methyl-(2-pyridinyl-κN)benzofuro[2,3-b]pyridine-κC]bis[2-(2-pyridinyl-κN)phenyl-κC]iridium (III) (abbreviation: $Ir(ppy)_2(mbfpypy-d_3)$) were deposited by co-evaporation to a thickness of 40 nm such that the weight ratio of 8BP-4mDBtPBfpm to βNCCP and $Ir(ppy)_2(mbfpypy-d_3)$ was 0.5:0.5:0.1, whereby the light-emitting layer 913 was formed.

[Sixth Step]

Next, over the light-emitting layer 913, 2,9-di(2-naphthyl)-4,7-diphenyl-1,10-phenanthroline (abbreviation: NBPhen) was deposited by evaporation to a thickness of 30 nm, whereby the electron-transport layer 914 was formed.

[Seventh Step]

Next, the first sacrifice layer was formed over the electron-transport layer 914. Specifically, using trimethylaluminum (abbreviation: TMA) as a precursor and water vapor as an oxidizing agent, an aluminum oxide film was formed with a thickness of 30 nm by an ALD method.

[Eighth Step]

Next, the second sacrifice layer was formed over the first sacrifice layer. Specifically, the second sacrifice layer was formed by a sputtering method using IGZO as a target. The thickness of the second sacrifice layer was set to 50 nm.

[Ninth Step]

Next, a resist was formed using a photoresist over the second sacrifice layer, and the second sacrifice layer and the first sacrifice layer were processed into desired shapes by a photolithography technique. Specifically, the second sacrifice layer and the first sacrifice layer were processed using an etching gas containing fluoroform (abbreviation: $CHF_3$) and helium (He). Then, the electron-transport layer 914, the light-emitting layer 913, the hole-transport layer 912, and the hole-injection layer 911 were processed into desired shapes. Specifically, the electron-transport layer 914, the light-emitting layer 913, the hole-transport layer 912, and the hole-injection layer 911 were processed using an etching gas containing tetrafluoromethane (abbreviation: $CF_4$) and helium. In this manner, end portions of the electron-transport layer 914, the light-emitting layer 913, the hole-transport layer 912, and the hole-injection layer 911 were exposed.

The desired shapes were formed by formation of the slit 920 in the stacked layers positioned in a region overlapping with the insulating layer 930. Specifically, the slit 920 having a width of 3 μm was formed in a position 3.5 μm away from an end portion of the insulating layer 930.

[Tenth Step]

Next, the second sacrifice layer and the first sacrifice layer were removed using a chemical solution, so that the electron-transport layer 914 was exposed.

[Eleventh Step]

Next, over the electron-transport layer 914, LiF was deposited by evaporation to a thickness of 1 nm as the first layer including the alkali metal compound, and then ytterbium (Yb) was deposited by evaporation to a thickness of 3 nm as the second layer including the reducing agent, whereby the electron-injection layer 915 having a stacked-layer structure was formed.

[Twelfth Step]

Next, over the electron-injection layer 915, silver (Ag) and magnesium (Mg) were deposited by co-evaporation to a thickness of 15 nm such that the volume ratio of Ag to Mg was 1:0.1, whereby the second electrode 903 was formed. Thus, the light-emitting device 1 of this example was fabricated. Note that the second electrode 903 is a transflective electrode having a function of reflecting light and a function of transmitting light; thus, the light-emitting device of this example is a top-emission device in which light is extracted through the second electrode 903. Over the second electrode 903, 4,4',4"-(benzene-1,3,5-triyl)tri(dibenzothiophene) (abbreviation: DBT3P-II) was deposited by evaporation to a thickness of 70 nm, whereby a cap layer was formed, which increases outcoupling efficiency.

Next, methods for fabricating a comparative light-emitting device 1 and a comparative light-emitting device 2 are described.

(Method for Fabricating Comparative Light-Emitting Device 1)

The comparative light-emitting device 1 was fabricated in a manner similar to that of the light-emitting device 1 except that a 1-nm thick LiF film was formed by evaporation as the electron-injection layer 915 over the electron-transport layer 914 in the eleventh step.

(Method for Fabricating Comparative Light-Emitting Device 2)

Figure 19B:
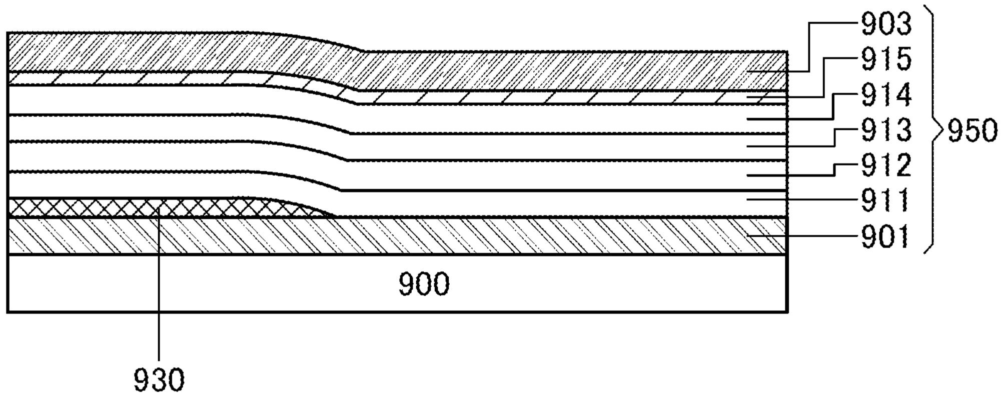

The comparative light-emitting device 2 was fabricated in a manner similar to that of the light-emitting device 1 except that the seventh to tenth steps for slit formation were omitted and that a 1-nm thick LiF film was formed by evaporation as the electron-injection layer 915 over the electron-transport layer 914 in the eleventh step. That is, the comparative light-emitting device 2 has a structure illustrated in FIG. 19B.

The structures of the above-described light-emitting device and the above-described comparative light-emitting devices are listed in the following table.

TABLE 1

| | Film thickness | Light-emitting device 1 | Comparative light-emitting device 1 | Comparative light-emitting device 2 |
|---|---|---|---|---|
| Cap layer | 70 nm | DBT3P-II | | |
| Second electrode | 15 nm | Ag:Mg (1:0.1) | | |
| Electron-injection layer | — | Yb (3 nm) | LiF (1 nm) | |
| | — | LiF (1 nm) | | |
| — | | *1 | | *2 |
| Electron-transport layer | 30 nm | NBPhen | | |
| Light-emitting layer | 40 nm | 8BP-4mDBtPBfpm:βNCCP:Ir(ppy)$_2$(mbfpypy-d$_3$) (0.5:0.5:0.1) | | |
| Hole-transport layer | 20 nm | PCBBi1BP | | |
| Hole-injection layer | 35 nm | PCBBiF | | |
| | 10 nm | PCBBiF:OCHD-003 (1:0.03) | | |
| Electrode | 100 nm | ITSO | | |
| Reflective film | 100 nm | APC | | |

*1: A slit was formed through the seventh to tenth steps.

*2: The seventh to tenth steps were omitted and slit formation was not performed.

The above light-emitting device and the above comparative light-emitting devices were sealed using a glass substrate in a glove box containing a nitrogen atmosphere so as not to be exposed to the atmosphere (a sealing material was applied to surround the devices and UV treatment and heat treatment at 80° C. for 1 hour were performed at the time of sealing). Then, the initial characteristics of the light-emitting devices were measured.

Figure 20:
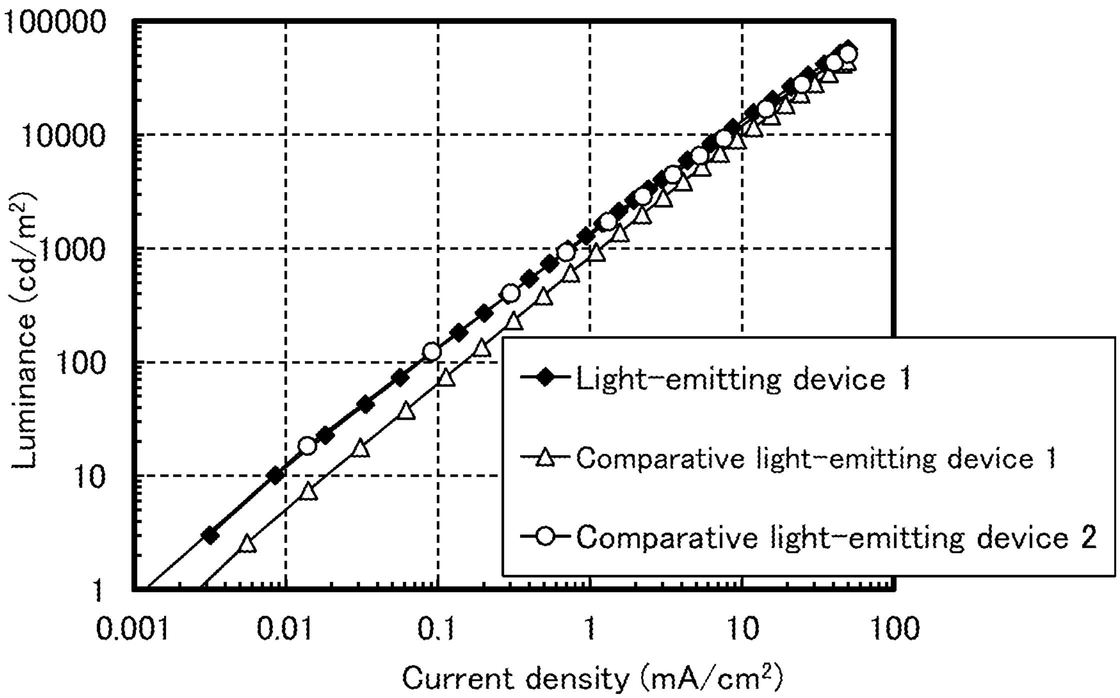
FIG. 20 is a graph showing luminance-current density characteristics of a light-emitting device 1, a comparative light-emitting device 1, and a comparative light-emitting device 2.
Figure 21:
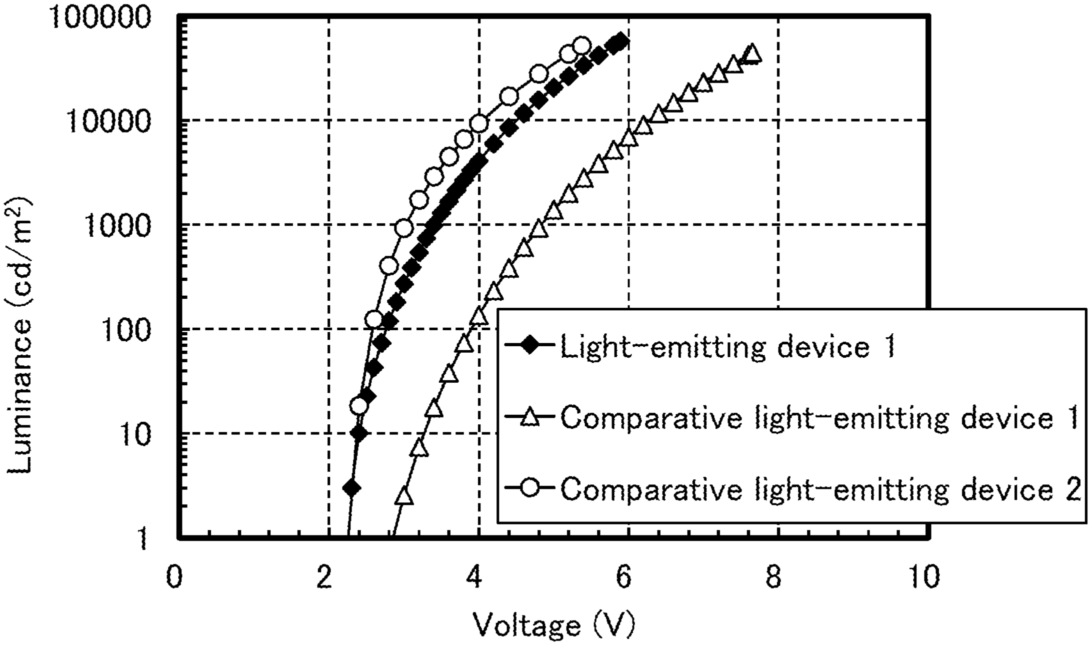
FIG. 21 is a graph showing luminance-voltage characteristics of the light-emitting device 1, the comparative light-emitting device 1, and the comparative light-emitting device 2.
Figure 22:
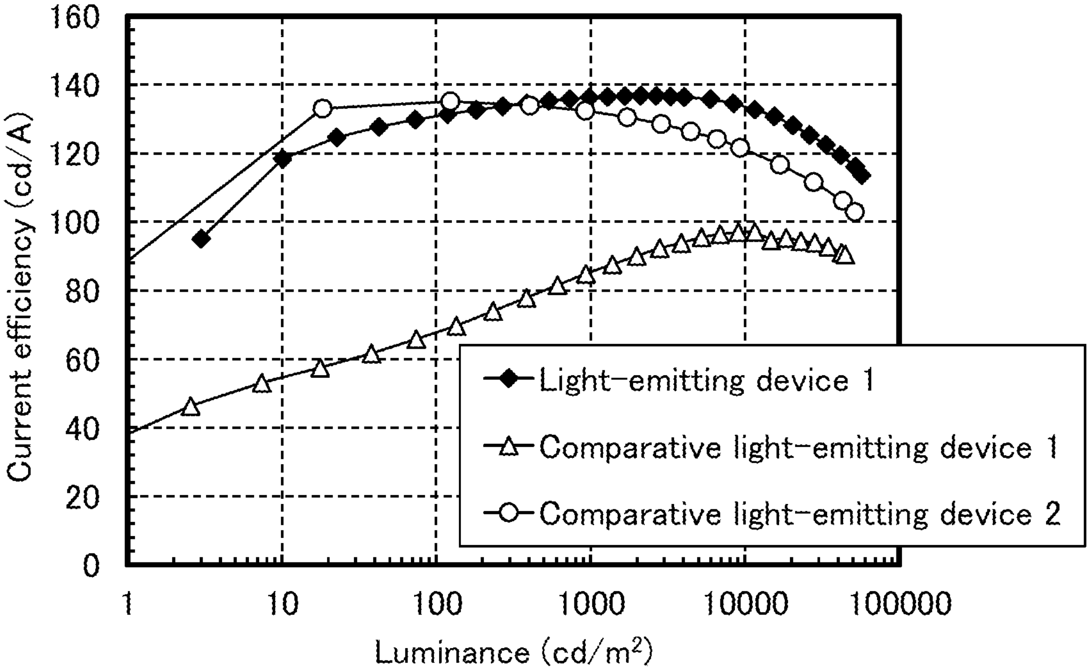
FIG. 22 is a graph showing current efficiency-luminance characteristics of the light-emitting device 1, the comparative light-emitting device 1, and the comparative light-emitting device 2.
Figure 23:
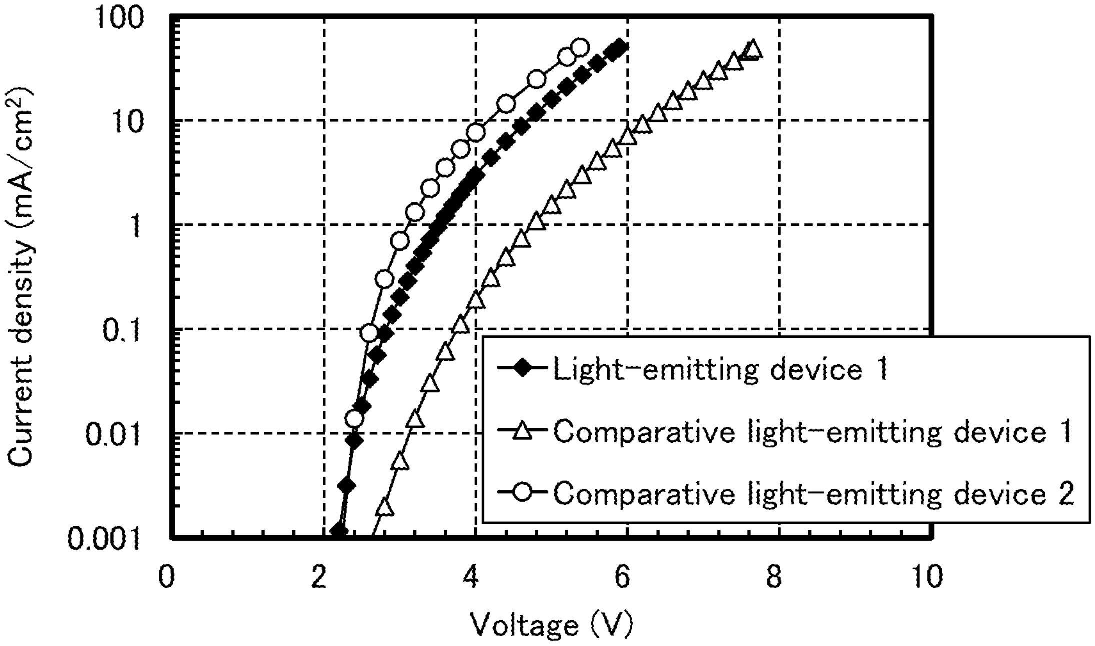
FIG. 23 is a graph showing current density-voltage characteristics of the light-emitting device 1, the comparative light-emitting device 1, and the comparative light-emitting device 2.
Figure 24:
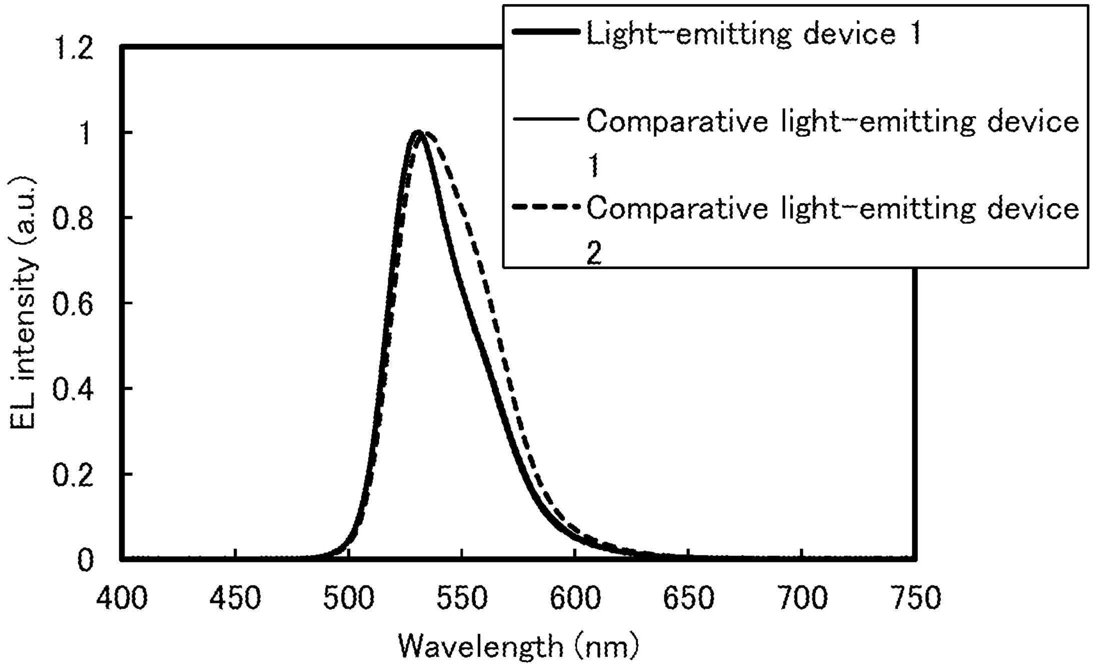
FIG. 24 is a graph showing emission spectra of the light-emitting device 1, the comparative light-emitting device 1, and the comparative light-emitting device 2 emitting light at a luminance of 1000 cd/$m^2$.

FIG. 20 shows luminance-current density characteristics of the light-emitting device 1, the comparative light-emitting device 1, and the comparative light-emitting device 2. FIG. 21 shows luminance-voltage characteristics thereof. FIG. 22 shows current efficiency-luminance characteristics thereof. FIG. 23 shows current density-voltage characteristics thereof. FIG. 24 shows emission spectra thereof. The main characteristics of the light-emitting devices at a luminance of approximately 1000 cd/m$^2$ are shown in the table below. Note that luminance, CIE chromaticity, and emission spectra were measured with a spectroradiometer (SR-UL1R manufactured by TOPCON TECHNOHOUSE CORPORATION).

TABLE 2

| | Voltage (V) | Current (mA) | Current density (mA/cm$^2$) | Chromaticity x | Chromaticity y | Current efficiency (cd/A) |
|---|---|---|---|---|---|---|
| Light-emitting device 1 | 3.4 | 0.03 | 0.7 | 0.28 | 0.69 | 136.3 |
| Comparative light-emitting device 1 | 4.8 | 0.04 | 1.1 | 0.28 | 0.69 | 84.9 |
| Comparative light-emitting device 2 | 3.0 | 0.03 | 0.7 | 0.30 | 0.67 | 132.4 |

According to FIG. 20 to FIG. 24, the voltage of the comparative light-emitting device 1 increased in the luminance-voltage characteristics and the current efficiency thereof was lowered, compared to those of the comparative light-emitting device 2. The seventh to tenth steps performed in fabricating the comparative light-emitting device 1 cause the voltage increase and the emission efficiency reduction.

Meanwhile, the light-emitting device 1 of one embodiment of the present invention has low voltage characteristics and high emission efficiency even though the seventh to tenth steps were performed thereon. These results indicate that the driving voltage of the light-emitting device 1 was prevented from increasing and high emission efficiency was achieved even though the interface between the electron-transport layer 914 and the electron-injection layer 915 was exposed to a chemical solution, an etching gas, an atmosphere, or the like through the seventh to tenth steps. This is owing to the usage of the stacked-layer structure of LiF and Yb in the electron-injection layer 915 of the light-emitting device 1, which lowers the carrier injection barrier at the interface between the electron-transport layer 914 and the electron-injection layer 915.

Example 2

In this example, the light-emitting device of one embodiment of the present invention described in the embodiment is described. Structural formulae of organic compounds used in the light-emitting device of one embodiment of the present invention are shown below. In this example, an example of using, as the electron-injection layer, the mixed film including the alkali metal compound and the reducing agent is described.

[Chemical Formula 4]

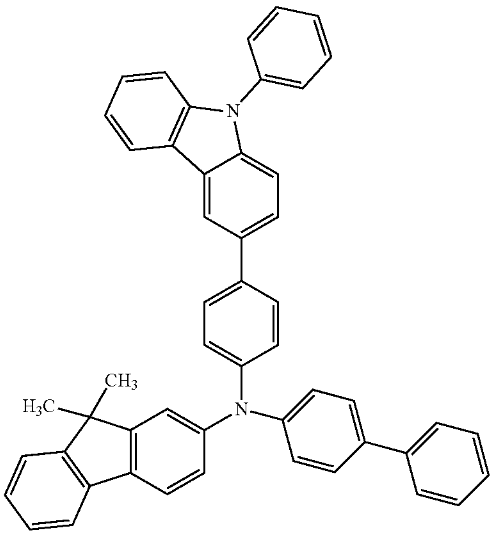

PCBBiF

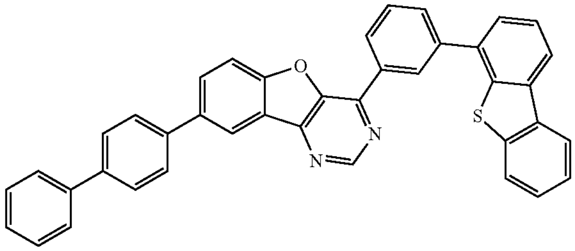

8BP-4mDBtPBfpm

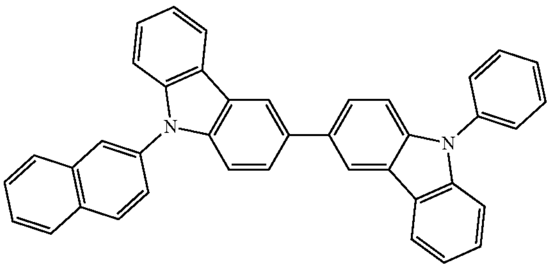

β NCCP

-continued

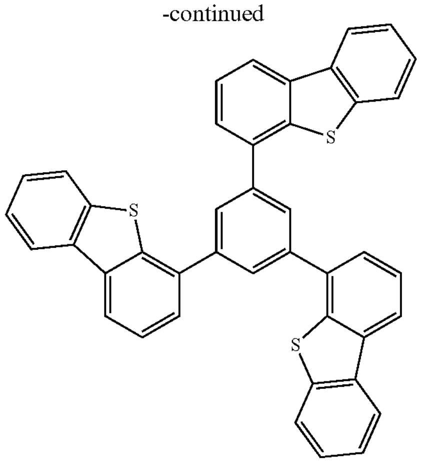

DBT3P-II

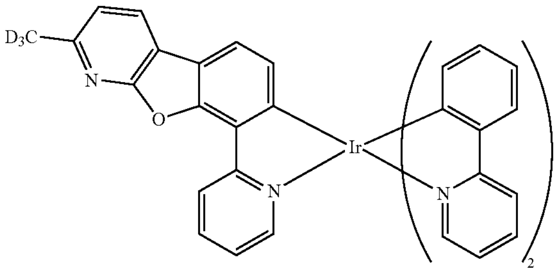

Ir(ppy)2(mbfpypy-d3)

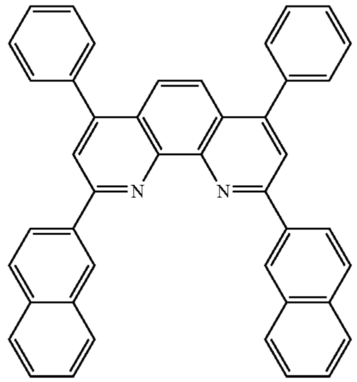

NBPhen

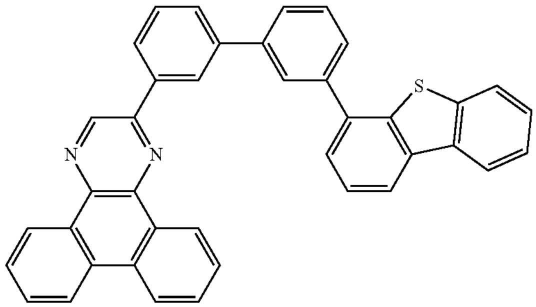

2mDBTBPDBq-II (Method for Fabricating Light-Emitting Device 2)

A light-emitting device 2 described in this example has the structure illustrated in FIG. 19A, like the light-emitting device 1. The light-emitting device 2 described in this example was fabricated using a method including the following steps.

[First Step]

First, a reflective film REF was formed over the glass substrate 900. Specifically, the reflective film REF was formed to a thickness of 100 nm by a sputtering method using an alloy containing silver (Ag), palladium (Pd), and copper (Cu) (abbreviation: APC) as a target. Then, a film of indium oxide-tin oxide containing silicon or silicon oxide (abbreviation: ITSO) was formed by a sputtering method as the first electrode 901. The thickness of the first electrode 901 was set to 100 nm and the area of the electrode was set to 4 $mm^2$ (2 mm×2 mm).

After the first step, the insulating layer 930 was formed. As the insulating layer 930, a 1-μm thick polyimide film was formed. Furthermore, as an etching stopper film over the polyimide film, a film of a composite oxide containing indium, gallium, zinc, and oxygen (abbreviation: IGZO) was formed with a thickness of 10 nm by a sputtering method.

[Second Step]

Next, in pretreatment for forming the light-emitting device over the substrate, a surface of the substrate was washed with water and baked at 200° C. for 1 hour, and then UV ozone treatment was performed for 370 seconds. Then, the substrate was transferred into a vacuum evaporation apparatus where the pressure was reduced to approximately $10^{-4}$ Pa, and vacuum baking was performed at 170° C. for 30 minutes in a heating chamber of the vacuum evaporation apparatus. Then, the substrate was cooled down for approximately 30 minutes.

[Third Step]

Then, the substrate provided with the first electrode 901 was fixed to a substrate holder provided in the vacuum evaporation apparatus such that the surface on which the first electrode 901 was formed faced downward. Over the first electrode 901, by an evaporation method using resistance heating, N-(1,1'-biphenyl-4-yl)-N-[4-(9-phenyl-9H-carbazol-3-yl)phenyl]-9,9-dimethyl-9H-fluoren-2-amine (abbreviation: PCBBiF) and a fluorine-containing electron acceptor material with a molecular weight of 672 (OCHD-003) were deposited by co-evaporation to a thickness of 10 nm such that the weight ratio of PCBBiF to OCHD-003 was 1:0.03, whereby the hole-injection layer 911 was formed.

[Fourth Step]

Next, PCBBiF was deposited by evaporation to a thickness of 50 nm over the hole-injection layer 911, whereby the hole-transport layer 912 was formed.

[Fifth Step]

Next, over the hole-transport layer 912, 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm), 9-(2-naphthyl)-9'-phenyl-9H,9'H-3,3'-bicarbazole (abbreviation: βNCCP), and [2-$d_3$-methyl-(2-pyridinyl-κN)benzofuro[2,3-b]pyridine-κC]bis[2-(2-pyridinyl-κN)phenyl-κC]iridium (III) (abbreviation: $Ir(ppy)_2(mbfpypy\text{-}d_3)$) were deposited by co-evaporation to a thickness of 40 nm such that the weight ratio of 8BP-4mDBtPBfpm to βNCCP and $Ir(ppy)_2(mbfpypy\text{-}d_3)$ was 0.6:0.4:0.1, whereby the light-emitting layer 913 was formed.

[Sixth Step]

Next, over the light-emitting layer 913, 2-[3-(3'-(dibenzothiophen-4-yl)biphenyl]dibenzo[f,h]quinoxaline (abbreviation: 2mDBTBPDBq-II) was deposited by evaporation to a thickness of 10 nm, and then 2,9-di(2-naphthyl)-4,7-diphenyl-1,10-phenanthroline (abbreviation: NBPhen) was deposited by evaporation to a thickness of 20 nm, whereby the electron-transport layer 914 was formed.

[Seventh Step]

Next, the first sacrifice layer was formed over the electron-transport layer 914. Specifically, using trimethylaluminum (abbreviation: TMA) as a precursor and water vapor as an oxidizing agent, an aluminum oxide film was formed with a thickness of 30 nm by an ALD method.

[Eighth Step]

Next, the second sacrifice layer was formed over the first sacrifice layer. Specifically, the second sacrifice layer was formed by a sputtering method using IGZO as a target. The thickness of the second sacrifice layer was set to 50 nm.

[Ninth Step]

Next, a resist was formed using a photoresist over the second sacrifice layer, and the second sacrifice layer and the first sacrifice layer were processed into desired shapes by a photolithography technique. Specifically, the second sacrifice layer and the first sacrifice layer were processed using an etching gas containing fluoroform (abbreviation: $CHF_3$) and helium (He). Then, the electron-transport layer 914, the light-emitting layer 913, the hole-transport layer 912, and the hole-injection layer 911 were processed into desired shapes. Specifically, the electron-transport layer 914, the light-emitting layer 913, the hole-transport layer 912, and the hole-injection layer 911 were processed using an etching gas containing tetrafluoromethane (abbreviation: $CF_4$) and helium. In this manner, end portions of the electron-transport layer 914, the light-emitting layer 913, the hole-transport layer 912, and the hole-injection layer 911 were exposed.

The desired shapes were formed by formation of the slit 920 in the stacked layers positioned in a region overlapping with the insulating layer 930. Specifically, the slit 920 having a width of 3 μm was formed in a position 3.5 μm away from an end portion of the insulating layer 930.

[Tenth Step]

Next, the second sacrifice layer and the first sacrifice layer were removed using a chemical solution, so that the electron-transport layer 914 was exposed.

[Eleventh Step]

Next, over the electron-transport layer 914, LiF (the alkali metal compound) and Yb (the reducing agent) were deposited by co-evaporation to a thickness of 1.8 nm such that the volume ratio of LiF to Yb was 1:1, whereby the electron-injection layer 915 was formed. At this time, the percentage of the reducing agent in the electron-injection layer 915 is 50 vol %.

[Twelfth Step]

Next, over the electron-injection layer 915, Ag and Mg were deposited by co-evaporation to a thickness of 15 nm such that the volume ratio of Ag to Mg was 1:0.1, whereby the second electrode 903 was formed. Thus, the light-emitting device 2 of this example was fabricated. Note that the second electrode 903 is a transflective electrode having a function of reflecting light and a function of transmitting light; thus, the light-emitting device of this example is a top-emission device in which light is extracted through the second electrode 903. Over the second electrode 903, 4,4',4''-(benzene-1,3,5-triyl)tri(dibenzothiophene) (abbreviation: DBT3P-II) was deposited by evaporation to a thickness of 70 nm, whereby a cap layer was formed, which increases outcoupling efficiency.

Next, methods for fabricating a comparative light-emitting device 3 and a comparative light-emitting device 4 are described.

(Method for Fabricating Comparative Light-Emitting Device 3)

The comparative light-emitting device 3 was fabricated in a manner similar to that of the light-emitting device 2 except that a 1-nm thick LiF film was formed by evaporation as the electron-injection layer 915 over the electron-transport layer 914 in the eleventh step.

(Method for Fabricating Comparative Light-Emitting Device 4)

The comparative light-emitting device 4 was fabricated in a manner similar to that of the light-emitting device 2 except that the seventh to tenth steps for slit formation were omitted and that a 1-nm thick LiF film was formed by evaporation as the electron-injection layer 915 over the electron-transport layer 914 in the eleventh step. That is, the comparative light-emitting device 2 has the structure illustrated in FIG. 19B.

The structures of the above-described light-emitting device and the above-described comparative light-emitting devices are listed in the following table.

TABLE 3

| | Film thickness | Light-emitting device 2 | Comparative light-emitting device 3 | Comparative light-emitting device 4 |
|---|---|---|---|---|
| Cap layer | 70 nm | DBT3P-II | | |
| Second electrode | 15 nm | Ag:Mg (1:0.1) | | |
| Electron-injection layer | — | LiF:Yb (1:1) (1.8 nm) | LiF (1 nm) | |
| — | | *1 | | *2 |
| Electron-transport layer | 20 nm | NBPhen | | |
| | 10 nm | 2mDBTBPDBq-II | | |
| Light-emitting layer | 40 nm | 8BP-4mDBtPBfpm:βNCCP:$Ir(ppy)_2(mbfpypy\text{-}d_3)$ (0.6:0.4:0.1) | | |
| Hole-transport layer | 50 nm | PCBBiF | | |
| Hole-injection layer | 10 nm | PCBBiF:OCHD-003 (1:0.03) | | |
| Electrode | 100 nm | ITSO | | |
| Reflective film | 100 nm | APC | | |

*1: A slit was formed through the seventh to tenth steps.

*2: The seventh to tenth steps were omitted and slit formation was not performed.

-

The above light-emitting device and the above comparative light-emitting devices were sealed using a glass substrate in a glove box containing a nitrogen atmosphere so as not to be exposed to the atmosphere (a sealing material was applied to surround the devices and UV treatment and heat treatment at 80° C. for 1 hour were performed at the time of sealing). Then, the initial characteristics of the light-emitting devices were measured.

Figure 25:
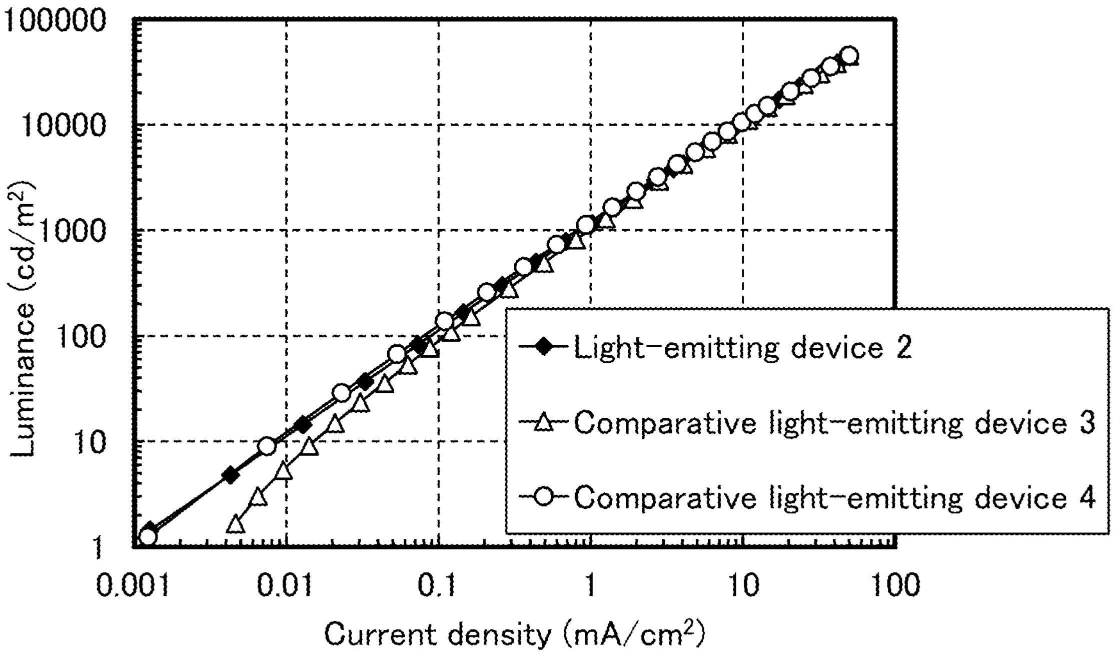
FIG. 25 is a graph showing luminance-current density characteristics of a light-emitting device 2, a comparative light-emitting device 3, and a comparative light-emitting device 4.
Figure 26:
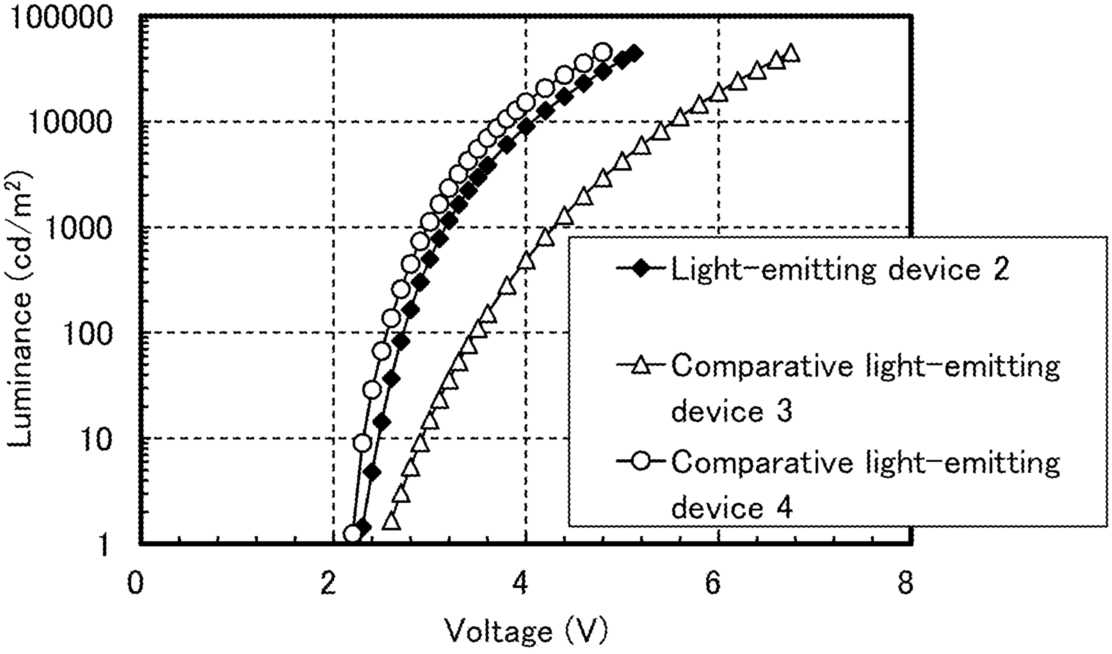
FIG. 26 is a graph showing luminance-voltage characteristics of the light-emitting device 2, the comparative light-emitting device 3, and the comparative light-emitting device 4.
Figure 27:
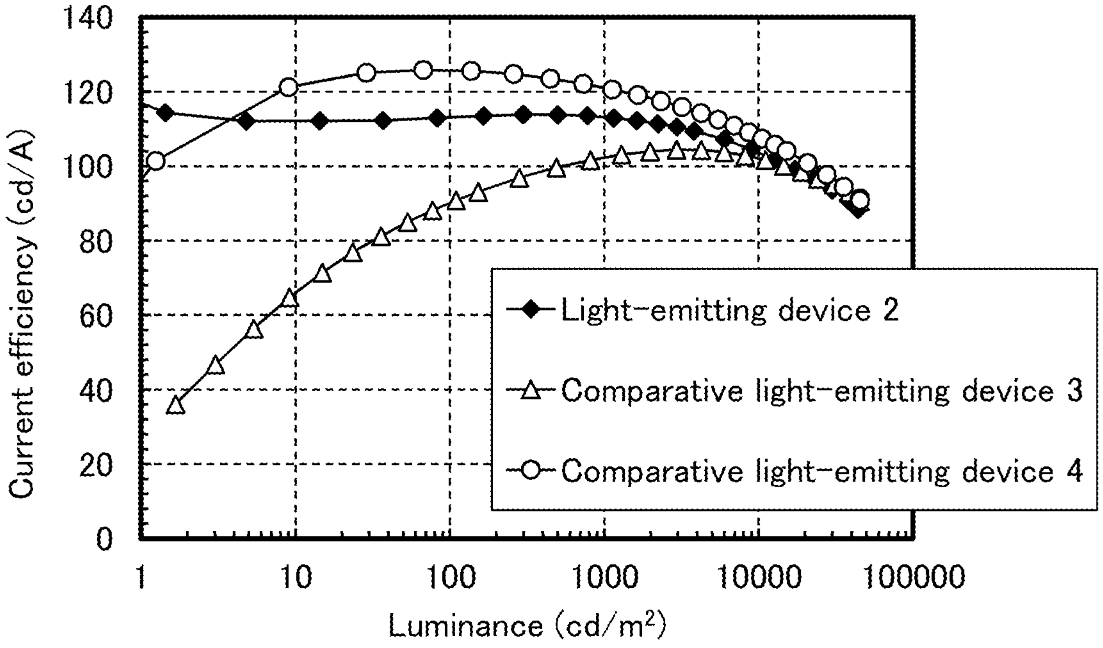
FIG. 27 is a graph showing current efficiency-luminance characteristics of the light-emitting device 2, the comparative light-emitting device 3, and the comparative light-emitting device 4.
Figure 28:
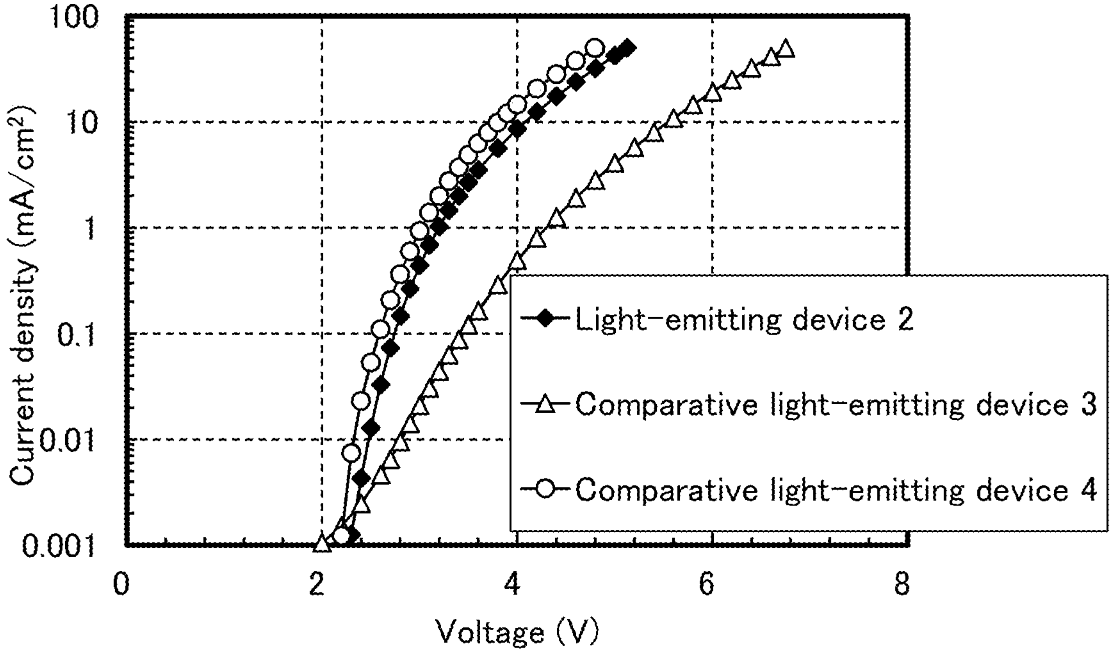
FIG. 28 is a graph showing current density-voltage characteristics of the light-emitting device 2, the comparative light-emitting device 3, and the comparative light-emitting device 4.
Figure 29:
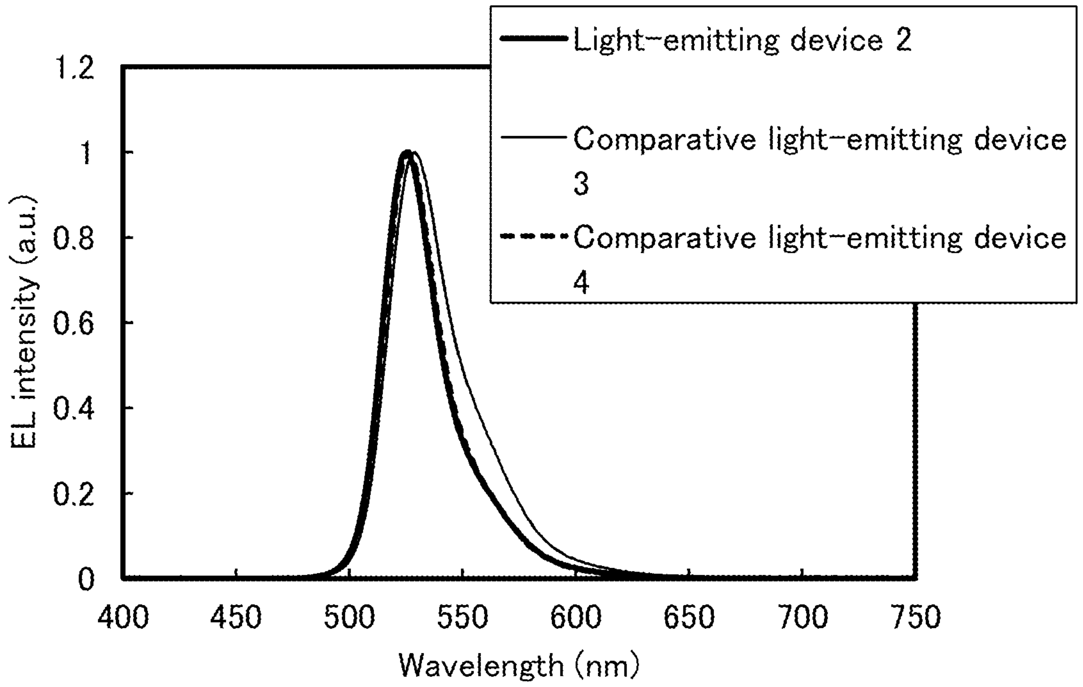
FIG. 29 is a graph showing emission spectra of the light-emitting device 2, the comparative light-emitting device 3, and the comparative light-emitting device 4 emitting light at a luminance of 1000 cd/$m^2$.

FIG. 25 shows luminance-current density characteristics of the light-emitting device 2, the comparative light-emitting device 3, and the comparative light-emitting device 4. FIG. 26 shows luminance-voltage characteristics thereof. FIG. 27 shows current efficiency-luminance characteristics thereof. FIG. 28 shows current density-voltage characteristics thereof. FIG. 29 shows emission spectra thereof. The main characteristics of the light-emitting devices at a luminance of approximately 1000 cd/$m^2$ are shown in the table below. Note that luminance, CIE chromaticity, and emission spectra were measured with a spectroradiometer (SR-UL1R manufactured by TOPCON TECHNOHOUSE CORPORATION).

TABLE 4

| | Voltage (V) | Current (mA) | Current density (mA/$cm^2$) | Chromaticity x | Chromaticity y | Current efficiency (cd/A) |
|---|---|---|---|---|---|---|
| Light-emitting device 2 | 3.2 | 0.04 | 1.0 | 0.23 | 0.72 | 112.9 |
| Comparative light-emitting device 3 | 4.2 | 0.03 | 0.8 | 0.26 | 0.70 | 101.6 |
| Comparative light-emitting device 4 | 3.0 | 0.04 | 0.9 | 0.23 | 0.72 | 120.6 |

According to FIG. 25 to FIG. 29, the voltage of the comparative light-emitting device 3 increased in the luminance-voltage characteristics and the current efficiency thereof was lowered, compared to those of the comparative light-emitting device 4. The seventh to tenth steps performed in fabricating the comparative light-emitting device 3 cause the voltage increase and the emission efficiency reduction.

Meanwhile, the light-emitting device 2 of one embodiment of the present invention has low voltage characteristics and high emission efficiency even though the seventh to tenth steps were performed thereon. In addition, according to FIG. 27, the current efficiency of the light-emitting device 2 is higher than 100 cd/A at luminances of 100 cd/$m^2$ or lower. These results indicate that the driving voltage of the light-emitting device 2 was prevented from increasing and high emission efficiency was achieved even though the interface between the electron-transport layer 914 and the electron-injection layer 915 was exposed to a chemical solution, an etching gas, an atmosphere, or the like through the seventh to tenth steps. This is owing to the usage of the mixed film including LiF as the alkali metal compound and Yb as the reducing agent in the electron-injection layer 915 of the light-emitting device 2, which lowers the carrier injection barrier at the interface between the electron-transport layer 914 and the electron-injection layer 915.

Example 3

In this example, samples imitating the light-emitting device of one embodiment of the present invention were evaluated by an electron spin resonance (ESR) method, and the results are described.

Methods for fabricating a sample 1, a sample 2, a sample 3, and a comparative sample 1 of this example are described.

(Method for Fabricating Sample 1)

First, a quartz substrate was fixed to a holder in a vacuum evaporation apparatus such that the surface on which the composite materials were to be deposited faced downward. Then, the pressure in the vacuum evaporation apparatus was reduced to $10^{-4}$ Pa, and then NBphen was deposited by evaporation to a thickness of 50 nm, whereby the electron-transport layer was formed. Then, over the electron-transport layer, LiF was deposited by evaporation to a thickness of 1 nm, and then Yb was deposited by evaporation to a thickness of 0.8 nm, whereby the electron-injection layer was formed. Furthermore, over the electron-injection layer, Ag and Mg were deposited by co-evaporation to a thickness of 15 nm such that the volume ratio of Ag to Mg was 1:0.1, whereby the second electrode was formed. Thus, the sample 1 was fabricated. Note that the size of the quartz substrate was set to 2.8 mm×20 mm.

(Method for Fabricating Sample 2)

The sample 2 was fabricated in a manner similar to that of the sample 1 except that the electron-injection layer was formed over the electron-transport layer by depositing LiF and Yb by co-evaporation to a thickness of 1.8 nm such that the volume ratio of LiF to Yb was 1:1.

(Method for Fabricating Sample 3)

The sample 3 was fabricated in a manner similar to that of the sample 1 except that the electron-injection layer was formed by depositing LiF by evaporation to a thickness of 1 nm over the electron-transport layer and then depositing Mg by evaporation to a thickness of 1 nm.

(Method for Fabricating Comparative Sample 1)

The comparative sample 1 was fabricated in a manner similar to that of the sample 1 except that the electron-injection layer was formed by depositing LiF by evaporation to a thickness of 1 nm over the electron-transport layer.

The structures of the sample 1, the sample 2, the sample 3, and the comparative sample 1 are listed in the following table.

TABLE 5

| | Film thickness | Sample 1 | Sample 2 | Sample 3 | Comparative sample 1 |
|---|---|---|---|---|---|
| Second electrode | 15 nm | Ag:Mg (1:0.1) | | | |
| Electron-injection layer | — | Yb (0.8 nm) LiF (1 nm) | LiF:Yb (1:1) (1.8 nm) | Mg (1 nm) LiF (1 nm) | LiF (1 nm) |
| Electron-transport layer | 50 nm | NBPhen | | | |

Figure 30:
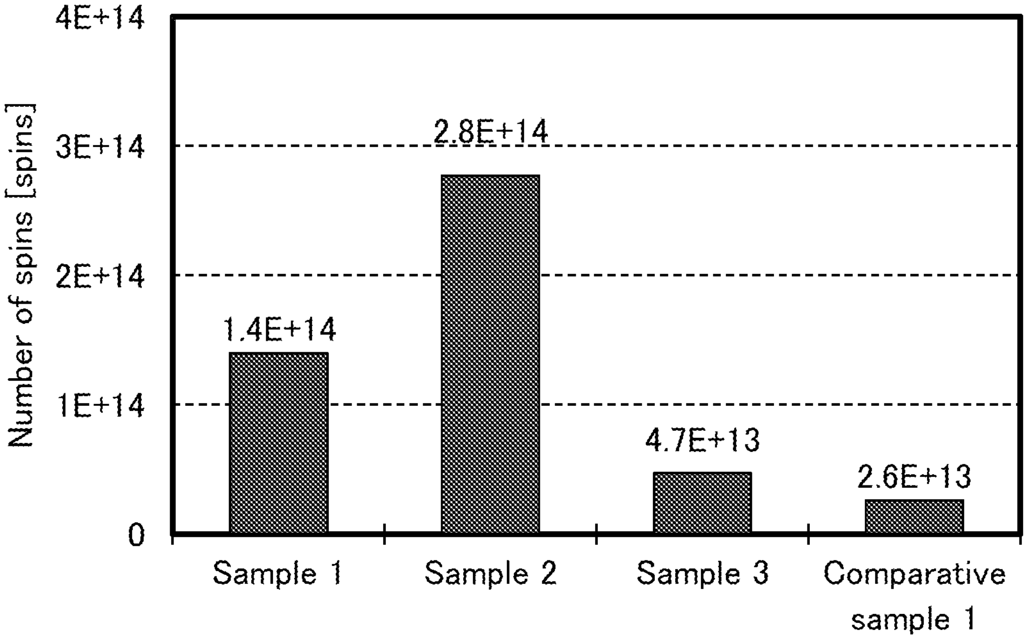
FIG. 30 shows the number of spins calculated from the integrated intensities of the ESR spectra of a sample 1, a sample 2, a sample 3, and a comparative sample 1.
Figure 31:
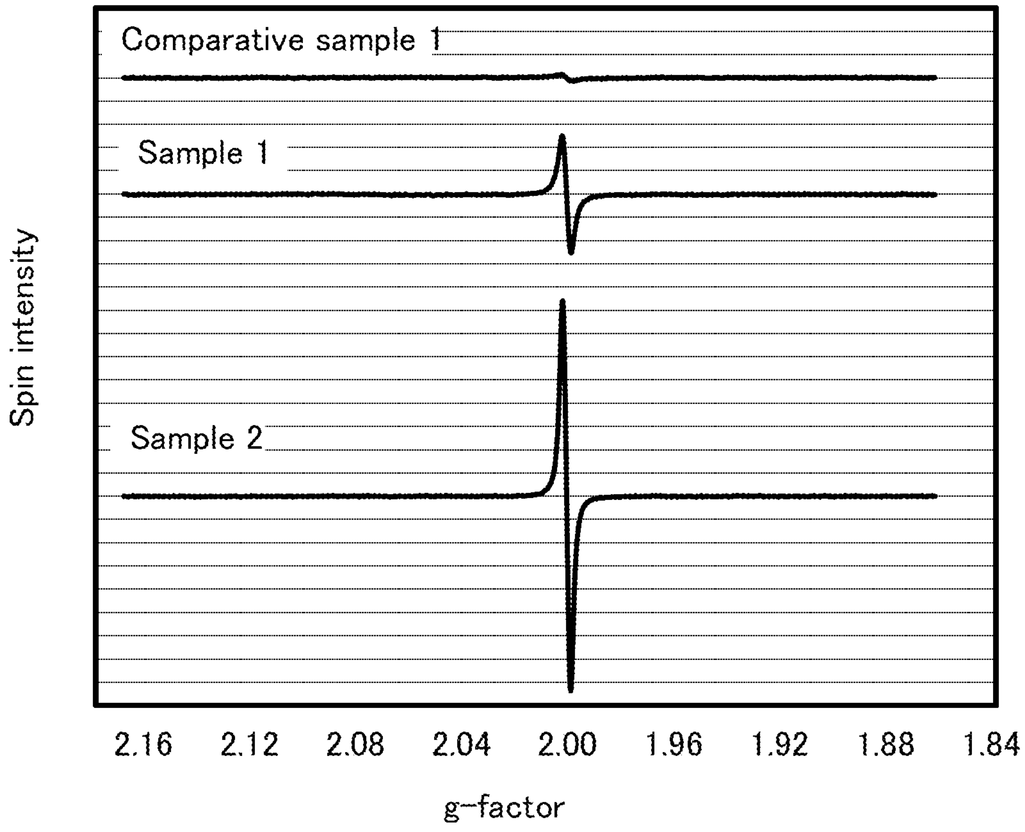
FIG. 31 shows the ESR spectra of the sample 1, the sample 2, and the comparative sample 1.

The results of ESR measurement on the fabricated sample 1, sample 2, sample 3, and comparative sample 1 are shown in FIG. 30 and FIG. 31. FIG. 30 shows the number of spins calculated from the integrated intensities of the ESR spectra of the sample 1, the sample 2, the sample 3, and the comparative sample 1. FIG. 31 shows ESR spectra of the sample 1, the sample 2, and the comparative sample 1.

Note that measurements of electron spin resonance spectra using an ESR method were performed with an electron spin resonance spectrometer JES FA300 (manufactured by JEOL Ltd.). The measurements were performed at room temperature under the conditions where the resonance frequency was approximately 9.2 GHz, the output power was 1 mW, the modulated magnetic field was 50 mT, the modulation width was 0.5 mT, the time constant was 0.03 sec, and the sweep time was 1 min. Magnetic field correction was performed with reference to the positions of $Mn^{2+}$ third and fourth signals, and the numbers of spins were calculated from the peak area of the electron spin resonance spectra obtained by the measurements. Note that the g-values calculated from the peaks of the electron spin resonance spectra were each approximately 2.00, which coincide well with the calculated g-value (g=2.0024) derived from a singly occupied molecular orbital formed by the interaction between NBphen and Li. For the calculation of the g-values, a quantum chemistry computational program, Gaussian 09, was used, and the g-values were calculated using the most stable structure in the ground state of the composite material of NBphen and Li which was calculated using the density functional theory (DFT). As a basis function, 6-311G(d,p) was used, and as a functional, B3LYP was used. In the DFT, the total energy is represented as the sum of potential energy, electrostatic energy between electrons, electronic kinetic energy, and exchange-correlation energy including all the complicated interactions between electrons. Also in the DFT, exchange-correlation interaction is approximated by a functional (a function of another function) of one electron potential represented in terms of electron density to enable highly accurate calculations.

In FIGS. 30 and 31, the samples 1 to 3 have large number of spins than the comparative sample 1. This shows that a larger amount of free Li exists in the samples 1 to 3 than in the comparative sample 1. Accordingly, it was found that a larger number of Li in LiF was liberated because Yb and Mg functioned as the reducing agent in the electron-injection layers in the samples 1 to 3.

Furthermore, the sample 2, which includes the electron-injection layer formed by co-evaporation of LiF and Yb, has the largest number of spins in FIGS. 30 and 31. This shows that Li in LiF is likely to be liberated in a layer formed by co-evaporation of LiF and Yb.

This application is based on Japanese Patent Application Serial No. 2021-073232 filed with Japan Patent Office on Apr. 23, 2021, the entire contents of which are hereby incorporated by reference.

What is claimed is:

1. A light-emitting device comprising:
a first electrode;
a second electrode;
an EL layer; and
an insulating layer,
wherein the EL layer is positioned between the first electrode and the second electrode,
wherein the EL layer comprises at least a hole-injection layer, a hole-transport layer, a light-emitting layer, an electron-transport layer, and an electron-injection layer,
wherein the electron-transport layer is positioned over the light-emitting layer,
wherein the electron-injection layer is positioned over the electron-transport layer and surrounds both side surfaces of the hole-injection layer, and
wherein the electron-injection layer comprises an alkali metal compound and a reducing agent.

2. The light-emitting device according to claim 1, wherein the electron-injection layer is a mixed film of the alkali metal compound and the reducing agent.

3. The light-emitting device according to claim 2, wherein a percentage of the reducing agent in the mixed film is more than or equal to 20 vol % and less than or equal to 80 vol %.

4. The light-emitting device according to claim 1, wherein the electron-injection layer is a stacked-layer film of a first layer comprising the alkali metal compound and a second layer comprising the reducing agent.

5. The light-emitting device according to claim 4, wherein the second layer is positioned between the first layer and the second electrode.

6. The light-emitting device according to claim 1, wherein the electron-injection layer has a thickness of more than or equal to 0.5 nm and less than or equal to 5 nm.

7. The light-emitting device according to claim 1, wherein the reducing agent is a material having a work function of higher than or equal to 2.5 eV and lower than 4.0 eV.

8. The light-emitting device according to claim 1,
wherein the electron-injection layer is in contact with the insulating layer, and
wherein the insulating layer is positioned between an end portion of the light-emitting layer and a part of the electron-injection layer.

9. A light-emitting device comprising:
a first electrode;
a second electrode; and
an EL layer,
wherein the EL layer is positioned between the first electrode and the second electrode,
wherein the EL layer comprises at least a hole-injection layer, a hole-transport layer, a light-emitting layer, an electron-transport layer, and an electron-injection layer,
wherein the electron-transport layer is positioned over the light-emitting layer,
wherein the electron-injection layer comprises a portion positioned over the electron-transport layer and a portion in contact with a side surface of the hole-injection layer, and
wherein the electron-injection layer comprises an alkali metal compound and a reducing agent.

10. The light-emitting device according to claim 9, wherein the electron-injection layer is a mixed film of the alkali metal compound and the reducing agent.

11. The light-emitting device according to claim 10, wherein a percentage of the reducing agent in the mixed film is more than or equal to 20 vol % and less than or equal to 80 vol %.

12. The light-emitting device according to claim 9, wherein the electron-injection layer is a stacked-layer film of a first layer comprising the alkali metal compound and a second layer comprising the reducing agent.

13. The light-emitting device according to claim 12, wherein the second layer is positioned between the first layer and the second electrode.

14. The light-emitting device according to claim 9, wherein the electron-injection layer has a thickness of more than or equal to 0.5 nm and less than or equal to 5 nm.

15. The light-emitting device according to claim 9, wherein the reducing agent is a material having a work function of higher than or equal to 2.5 eV and lower than 4.0 eV.

16. A light-emitting apparatus comprising:
the light-emitting device according to claim 9; and
a transistor or a substrate.

17. A light-emitting apparatus comprising:
a first light-emitting device; and
a second light-emitting device,
wherein the first light-emitting device comprises a first electrode, a second electrode, a first EL layer, and a first insulating layer,
wherein the first EL layer is positioned between the first electrode and the second electrode,
wherein the first EL layer comprises at least a first hole-injection layer, a first hole-transport layer, a first light-emitting layer, a first electron-transport layer, and an electron-injection layer,
wherein the first electron-transport layer is positioned over the first light-emitting layer,
wherein the electron-injection layer is positioned over the first electron-transport layer and surrounds both side surfaces of the first hole-injection layer,
wherein the second light-emitting device comprises a third electrode, the second electrode, a second EL layer, and a second insulating layer,
wherein the second EL layer is positioned between the third electrode and the second electrode,
wherein the second EL layer comprises at least a second hole-injection layer, a second hole-transport layer, a second light-emitting layer, a second electron-transport layer, and the electron-injection layer,
wherein the second electron-transport layer is positioned over the second light-emitting layer,
wherein the electron-injection layer is positioned over the second electron-transport layer and surrounds both side surfaces of the second hole-injection layer, and wherein the electron-injection layer comprises an alkali metal compound and a reducing agent.

18. An electronic appliance comprising:

the light-emitting apparatus according to claim 17; and a sensor unit, an input unit, or a communication unit.

19. A lighting device comprising:

the light-emitting apparatus according to claim 17; and a housing.

20. The light-emitting apparatus according to claim 17, wherein the electron-injection layer is in contact with the first insulating layer, wherein the first insulating layer is positioned between an end portion of the first light-emitting layer and a first part of the electron-injection layer, wherein the electron-injection layer is in contact with the second insulating layer, and wherein the second insulating layer is positioned between an end portion of the second light-emitting layer and a second part of the electron-injection layer.

21. A light-emitting apparatus comprising:

a first light-emitting device; and a second light-emitting device, wherein the first light-emitting device comprises a first electrode, a second electrode, and a first EL layer, wherein the first EL layer is positioned between the first electrode and the second electrode, wherein the first EL layer comprises at least a first hole-injection layer, a first hole-transport layer, a first light-emitting layer, a first electron-transport layer, and an electron-injection layer, wherein the first electron-transport layer is positioned over the first light-emitting layer, wherein the electron-injection layer comprises a portion positioned over the first electron-transport layer and a portion in contact with a side surface of the first hole-injection layer, wherein the second light-emitting device comprises a third electrode, the second electrode, and a second EL layer, wherein the second EL layer is positioned between the third electrode and the second electrode, wherein the second EL layer comprises at least a second hole-injection layer, a second hole-transport layer, a second light-emitting layer, a second electron-transport layer, and the electron-injection layer, wherein the second electron-transport layer is positioned over the second light-emitting layer, wherein the electron-injection layer comprises a portion positioned over the second electron-transport layer and a portion in contact with a side surface of the second hole-injection layer, and wherein the electron-injection layer comprises an alkali metal compound and a reducing agent.

22. An electronic appliance comprising:

the light-emitting apparatus according to claim 21; and a sensor unit, an input unit, or a communication unit.

* * * * *